United States Patent
Song et al.

(10) Patent No.: US 10,570,335 B2
(45) Date of Patent: *Feb. 25, 2020

(54) LIQUID CRYSTAL MEDIUM CONTAINING POLYMERISABLE COMPOUNDS

(71) Applicant: Merck Patent GmbH, Darmstadt (DE)

(72) Inventors: Dong-Mee Song, Hwaseong (KR); Ki-Sun Kwon, Asan (KR); Hoo-Yong Lee, Pyeongtaek (KR); Melanie Klasen-Memmer, Heuchelheim (DE); Christian Schoenfeld, Babenhausen (DE); Konstantin Schneider, Rossdorf-Gundernhausen (DE); Matthias Koch, Wiesbaden (DE); Joerg Peschke, Ober-Ramstadt (DE); Matthias Bremer, Darmstadt (DE); Nils Greinert, Seeheim-Jugenheim (DE)

(73) Assignee: Merck Patetn GmbH, Darmstadt (DE)

( * ) Notice: Subject to any disclaimer, the term of this patent is extended or adjusted under 35 U.S.C. 154(b) by 98 days.

This patent is subject to a terminal disclaimer.

(21) Appl. No.: 15/739,210

(22) PCT Filed: Jun. 2, 2016

(86) PCT No.: PCT/EP2016/000905
§ 371 (c)(1),
(2) Date: Dec. 22, 2017

(87) PCT Pub. No.: WO2016/206772
PCT Pub. Date: Dec. 29, 2016

(65) Prior Publication Data
US 2018/0187080 A1  Jul. 5, 2018

(30) Foreign Application Priority Data
Jun. 26, 2015 (EP) .................................... 15001904

(51) Int. Cl.
| | | |
|---|---|---|
| *G02F 1/1333* | (2006.01) | |
| *C09K 19/54* | (2006.01) | |
| *C09K 19/30* | (2006.01) | |
| *C08F 220/16* | (2006.01) | |
| *C08F 220/28* | (2006.01) | |
| *C09K 19/02* | (2006.01) | |
| *C09K 19/34* | (2006.01) | |
| *G03F 7/00* | (2006.01) | |
| *G03F 7/031* | (2006.01) | |
| *G03F 7/20* | (2006.01) | |

(52) U.S. Cl.
CPC .......... *C09K 19/542* (2013.01); *C08F 220/16* (2013.01); *C08F 220/28* (2013.01); *C09K 19/0208* (2013.01); *C09K 19/3066* (2013.01); *C09K 19/3068* (2013.01); *C09K 19/3402* (2013.01); *G03F 7/0007* (2013.01); *G03F 7/031* (2013.01); *G03F 7/2002* (2013.01); *G03F 7/2004* (2013.01); *C08F 2220/282* (2013.01); *C09K 2019/301* (2013.01); *C09K 2019/3004* (2013.01); *C09K 2019/3009* (2013.01); *C09K 2019/3021* (2013.01); *C09K 2019/3025* (2013.01); *C09K 2019/3071* (2013.01); *C09K 2019/3077* (2013.01); *C09K 2019/3422* (2013.01); *C09K 2019/548* (2013.01)

(58) Field of Classification Search
CPC ......................... C09K 19/542; C09K 19/0208; C09K 19/061; C09K 19/062; C09K 19/20; C09K 19/3066; C09K 19/3068; C09K 19/32; C09K 19/321; C09K 19/3402; C09K 2019/044; C09K 2019/0444; C09K 2019/0448; C09K 2019/0455; C09K 2019/0466; C09K 2019/122; C09K 2019/123; C09K 2019/124; C09K 2019/3004; C09K 2019/3009; C09K 2019/301; C09K 2019/3015; C09K 2019/3019; C09K 2019/3021; C09K 2019/3025; C09K 2019/3037; C09K 2019/3069; C09K 2019/3071; C09K 2019/3077; C09K 2019/3422; C09K 2019/548; C08F 220/16; C08F 220/28; C08F 2220/282; G02F 1/1333; G02F 7/0007; G02F 7/031; G02F 7/2002; G02F 7/2004
USPC ....................................................... 252/299.6
See application file for complete search history.

(56) References Cited

U.S. PATENT DOCUMENTS

| | | |
|---|---|---|
| 9,139,777 B2 | 9/2015 | Zhong |
| 9,719,017 B2 | 8/2017 | Kurisawa |
| 2007/0134444 A1 | 6/2007 | Adlem |

(Continued)

FOREIGN PATENT DOCUMENTS

| | | |
|---|---|---|
| EP | 1887069 A1 | 2/2008 |
| EP | 2508588 A2 | 10/2012 |

(Continued)

OTHER PUBLICATIONS

International Search Report PCT/EP2016/000905 dated Aug. 8, 2016.

*Primary Examiner* — Geraldina Visconti
(74) *Attorney, Agent, or Firm* — Millen White Zelano and Branigan, PC; John Sopp

(57) ABSTRACT

The present invention relates to a liquid crystal (LC) medium comprising polymerisable compounds, to a process for its preparation, to its use for optical, electro-optical and electronic purposes, in particular in LC displays, and to LC displays comprising it.

31 Claims, 1 Drawing Sheet

(56) References Cited

U.S. PATENT DOCUMENTS

| | | |
|---|---|---|
| 2013/0222755 A1 | 8/2013 | Furusato |
| 2015/0129801 A1 | 5/2015 | Fujita |
| 2016/0251575 A1 | 9/2016 | Fujita |
| 2018/0179446 A1* | 6/2018 | Klasen-Memmer ......................... C09K 19/061 |
| 2018/0312756 A1* | 11/2018 | Bremer ................ C09K 19/065 |
| 2018/0371319 A1* | 12/2018 | Klasen-Memmer ......................... C09K 19/061 |

FOREIGN PATENT DOCUMENTS

| | | |
|---|---|---|
| EP | 2818534 A1 | 12/2014 |
| WO | 2014065514 A1 | 5/2014 |
| WO | 2014123056 A1 | 8/2014 |
| WO | 2015027531 A1 | 3/2015 |
| WO | 2015060056 A1 | 4/2015 |

* cited by examiner

LIQUID CRYSTAL MEDIUM CONTAINING POLYMERISABLE COMPOUNDS

The present invention relates to a liquid crystal (LC) medium comprising polymerisable compounds, to a process for its preparation, to its use for optical, electro-optical and electronic purposes, in particular in flexible LC displays, and to LC displays comprising it.

BACKGROUND OF THE INVENTION

Recently liquid crystal (LC) mixtures have been developed for the realization of flexible substrate based LC displays. These LC mixtures contain reactive polymer precursors that allow the formation of polymer walls in the display, which help to maintain the gap distance of the LC layer. This technology thus enables manufacturing of free form and robust displays by using LC materials.

Free form LC displays can either have a permanent shape other than a rigid flat panel displays, or can even be flexible. The simplest form of the first type are curved TVs that have been developed in the recent past and offer the viewer an enhanced viewing experience. Thereby it is possible to provide displays that are not only shaped in one, but two dimensions, and could be used for example as car dashboards or advertising screens.

Flexible displays, another type of free form displays, have also been developed, and have been proposed for example for use in mobile phones or smart watches utilizing the advantages of flexibility. Further potential applications are foldable or rollable mobile phones, as well as extra-large screens for presentations or home entertainment, which require due to their size to be rollable or foldable for being transported or stowed. Advantageously such devices are based on plastic substrates, instead of rigid glass substrates as used in conventional, unflexible LC displays.

Another display concept, 'unbreakable' displays, are also based on plastic substrates and refers to a display design featuring particular robustness, durability, and resistance against mechanical impact. One problem that should be solved is that mobile devices have an elevated risk of being dropped accidentally or becoming otherwise damaged during their normal use. In view of the high value of these devices, a solution to this problem would be highly desirable.

There is thus a great demand for free form or unbreakable LC displays.

One of the main technical challenges of LC displays with flexible substrates is that the LC layer thickness is critical for proper device operation. A proper combination of defined LC layer thickness and LC material properties ensures that the pixels can be switched between a black state and light transmitting state. In case of a varying layer thickness, unwanted interference with the gap distance between the substrates can result in visible optical defects. It should therefore be ensured that the LC layer thickness is not influenced by the bending or the lack of rigidity of flexible plastic substrates.

In conventional LC displays with rigid glass substrates, usually spacer particles are added to the LC layer in order to define and maintain a constant layer thickness. A possible solution for free form displays is to adapt this concept by incorporating supporting structures, like for example polymer walls, that can both resist compression and bind the substrates together. A suitable manufacturing process is to prefabricate the polymer wall structures, spread the LC mixture on the substrate, and subsequently close the panel with the top substrate. Potential problems with this approach are for example that spreading of the LC mixture is obstructed by the support structures, and that bonding to the top substrate might not be sufficient.

An alternative solution is to create the polymer wall structures by means of a photolithographic process after the display has been assembled. This is schematically illustrated in FIG. 1 showing a polymer wall formation process. FIG. 1 (a) shows an LC mixture consisting of LC host molecules (rods), polymerisable monomer (dots), and photo-initiator (not shown). As shown in FIG. 1 (b) the LC mixture is filled into the display, or the LC mixture is spread on a first substrate and a second substrate applied on top, and UV radiation (indicated by the arrows) is applied through a photomask. Polymerization induced phase separation takes place, as a result of which polymer walls are formed in irradiated regions according to the mask pattern as shown in FIG. 1 (c), while the LC phase of the LC host molecules (rods) in the pixel area is restored.

The principle of creating polymer walls by this method for LC display applications is a known technique that has been described in the literature and has been suggested for use in a variety of display modes.

For example, U.S. Pat. No. 6,130,738 and EP2818534 A1 disclose an LC display that comprises polymer walls formed from one or two polymerisable monomers that are contained in the LC host mixture.

However, the currently used LC mixtures and monomers for use in flexible LC displays with polymer wall formation do still have several drawbacks and leave room for further improvement.

For example, it was observed that the polymerisable compounds and LC media used in prior art do often show insufficient phase separation between the polymer walls and the LC molecules of the LC host mixture. This leads on the one hand to the undesired inclusion of LC molecules in the polymer walls, and on the other hand to increased amounts of polymer molecules dissolved or dispersed in the LC host mixture, both of which can negatively influence the display performance.

Thus, LC molecules trapped in the polymer wall can lead to reduced transparency and contrast of the display, a deterioration of the electrooptical response due to formation of domains with different switching speed, and decreased adhesion of the polymer walls to the substrates. On the other hand, undesired amounts of polymer molecules in the LC host mixture can negatively affect the LC mixture properties.

Moreover, it was observed that the thickness of the polymer walls is often not constant but varying, which can lead to non-uniform pixel size. Besides the polymer walls do often still not show sufficient stability against mechanical pressure on the one hand and sufficient elasticity on the other hand. Also, the polymer walls are often too thick, which reduces transparency and contrast of the display.

It is therefore desirable to have available improved LC mixtures and monomers for use in flexible LC displays which can overcome the drawbacks of materials used in prior art as described above.

The present invention is based on the object of providing novel suitable materials, in particular LC host mixtures comprising polymerisable monomers, for use in flexible LC displays with polymer walls, which do not have the disadvantages indicated above or do so only to a reduced extent.

In particular, the invention is based on the object of providing LC media comprising polymerisable monomers, which enable the formation of polymer walls in a time- and cost-effective manner, and which are suitable for mass production. The formed polymer walls should show clear phase separation from the LC host mixture, without or with a reduced amount of defects or LC molecules trapped in the polymer wall, and without or with a reduced amount of polymer molecules dissolved in the LC host mixture. Also, the polymer walls should show constant thickness, high elasticity, high stability against mechanical pressure, and good adhesion to the substrates.

Another object of the invention is to provide improved LC host mixtures for flexible displays which should show high specific resistance values, high VHR values, high reliability, low threshold voltages, short response times, high birefringence, show good UV absorption especially at longer wavelengths, allow quick and complete polymerisation of the monomers contained therein, and reduce or prevent the occurrence of image sticking in the display.

Another object of the invention is to provide LC displays with polymer walls that show high transparency in the addressed state, good contrast, high switching speed and a large operating temperature range.

Another object of the present invention is to provide an improved technical solution for enabling LCD technology for free form and unbreakable plastic substrate based LC displays.

The above objects have been achieved in accordance with the present invention by materials and processes as described and claimed hereinafter.

Thus, it has surprisingly been found that at least some of the above-mentioned objects can be achieved by using an LC medium which comprises an LC host mixture and one or more polymerisable monomers as disclosed and claimed hereinafter.

It has also been surprisingly found that the polymerisable compounds contained in the LC medium can also be used for forming spacers to maintain a constant cell gap between the substrates of the LC display. This can support or even replace the spacer materials that are normally used in prior art.

SUMMARY OF THE INVENTION

The invention relates to a liquid crystal (LC) medium comprising a polymerisable component A) which comprises, and preferably consists of, one or more polymerisable compounds, and a liquid-crystalline component B), hereinafter also referred to as "LC host mixture", which comprises, and preferably consists of, one or more mesogenic or liquid-crystalline compounds, wherein
the polymerisable component A) comprises
one or more first polymerisable compounds comprising a, preferably exactly one, polymerisable group and a bi- or polycyclic hydrocarbon group, preferably a bridged bi- or polycyclic hydrocarbon group, and
one or more second polymerisable compounds comprising a, preferably exactly one, polymerisable group and a straight-chain, branched or monocyclic hydrocarbon group, and
the liquid-crystalline component B) comprises one or more compounds selected from formula A and B

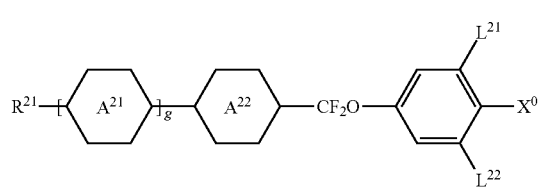

A

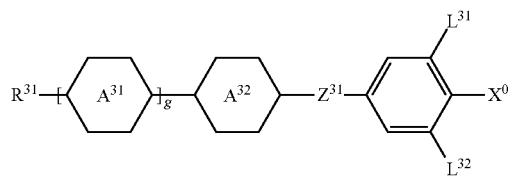

B in which the individual radicals have, independently of each other and on each occurrence identically or differently, the following meanings:

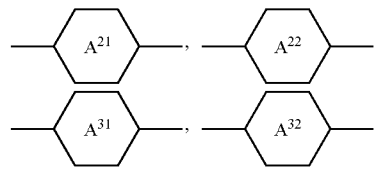

each, independently of one another, and on each occurrence, identically or differently

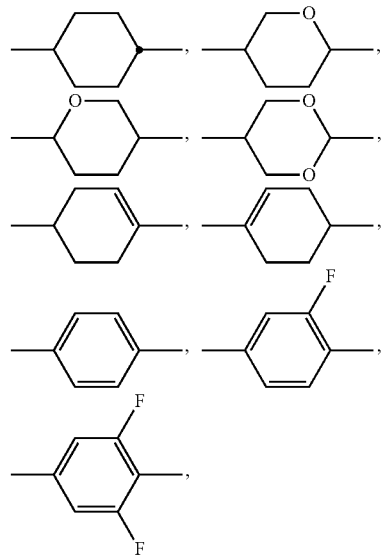

$R^{21}$, $R^{31}$ each, independently of one another, alkyl, alkoxy, oxaalkyl or alkoxyalkyl having 1 to 9 C atoms or alkenyl or alkenyloxy having 2 to 9 C atoms, all of which are optionally fluorinated, $X^0$ F, Cl, halogenated alkyl or alkoxy having 1 to 6 C atoms or halogenated alkenyl or alkenyloxy having 2 to 6 C atoms, $Z^{31}$ —$CH_2CH_2$—, —$CF_2CF_2$—, —COO—, trans-CH=CH—, trans-CF=CF—, —$CH_2O$— or a single bond, preferably —$CH_2CH_2$—, —COO—, trans-CH=CH— or a single bond, particularly preferably —COO—, trans-CH=CH— or a single bond, $L^{21}$, $L^{22}$, $L^{31}$, $L^{32}$ each, independently of one another, H or F, g 0, 1, 2 or 3.

The liquid-crystalline component B) of an LC medium according to the present invention is hereinafter also referred to as "LC host mixture", and preferably contains LC compounds that are selected only from low-molecular-weight compounds which are unpolymerisable, like those of formula A and/or B, and optionally contains further additives like photoinitiators, stabilisers or chiral dopants.

The invention furthermore relates to an LC medium or LC display as described above and below, wherein the polymerisable compounds, or the compounds of component A), are polymerised.

The invention furthermore relates to a process for preparing an LC medium as described above and below, comprising the steps of mixing one or more compounds of formula A and/or B, or an LC host mixture or LC component B) as described above and below, with one or more polymerisable compounds as described above and below, and optionally with further LC compounds and/or additives.

The invention further relates to the use of LC medium in LC displays, preferably in flexible LC displays.

The invention furthermore relates to an LC display comprising an LC medium as described above and below.

The invention furthermore relates to an LC display comprising polymer walls obtainable by polymerisation of one or more polymerisable compounds or a polymerisable component A) as described above and below, or comprising an LC medium as described above and below.

The invention furthermore relates to an LC display comprising spacers obtainable by polymerisation of one or more polymerisable compounds or a polymerisable component A) as described above and below, or comprising an LC medium as described above and below.

The LC display according to the present invention is preferably a flexible LC display, and preferably a TN, OCB, IPS or FFS display or related modes using LC-materials with $\Delta\varepsilon>0$.

The invention furthermore relates to an LC display comprising two substrates, at least one which is transparent to light, an electrode provided on each substrate or two electrodes provided on only one of the substrates, and located between the substrates a layer of an LC medium as described above and below, wherein the polymerisable compounds are polymerised between the substrates of the display.

The invention furthermore relates to a process for manufacturing an LC display as described above and below, comprising the steps of filling or otherwise providing an LC medium as described above and below between the substrates of the display, and polymerising the polymerisable compounds.

The displays according to the invention have two electrodes, preferably in the form of transparent layers, which are applied to one or both of the substrates. In some displays, for example in TN or OCB displays, one electrode is applied to each of the two substrates. In other displays, for example in IPS or FFS displays, both electrodes are applied to only one of the two substrates.

The polymerisable compounds of the polymerisable component are preferably polymerised by photopolymerisation, very preferably by UV photopolymerisation.

DETAILED DESCRIPTION OF THE INVENTION

Figure 1:
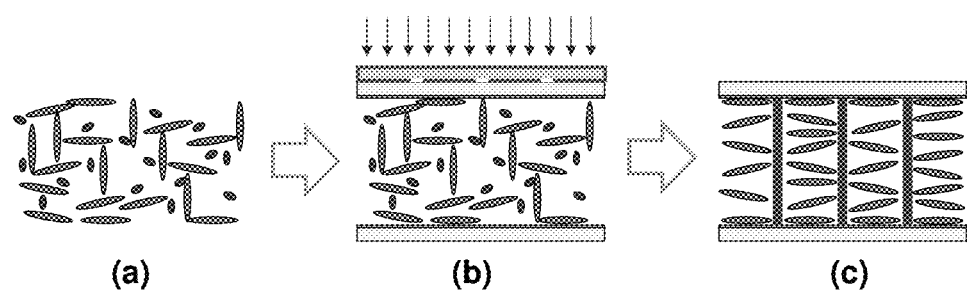
FIG. 1 schematically illustrates the polymer wall formation process in displays according to prior art and according to the present invention.

Above and below, the term "bi- or polycyclic group" will be understood to mean a group that consists of two or more fused rings, i.e. rings that share at last one common atom (in contrast to rings that are connected via covalent bonds between atoms belonging to different rings), wherein fusion of the rings occurs a) across a sequence of atoms (bridgehead), like for example in bicyclo[2.2.1]heptane (norbornane) or tricyclo[3.3.3.1]decane (adamantane), hereinafter also referred to as "bridged bi- or polycyclic groups", b) across a bond between two atoms, like for example in bicyclo[4.4.0]decane (decalin), hereinafter also referred to as "fused bi- or polycyclic groups" c) at a single atom (spiro atom), like for example in spiro[4.5]decane, hereinafter also referred to as "spirocyclic groups".

Unless indicated otherwise, the abbreviation "RM" is used above and below when referring to a reactive mesogen.

Above and below, polymerisable compounds or RMs with one polymerisable reactive group are also referred to as "monoreactive", polymerisable compounds or RMs with two polymerisable reactive groups are also referred to as "direactive", and polymerisable compounds or RMs with three polymerisable reactive groups are also referred to as "trireactive".

Unless indicated otherwise, the expression "LC mixture" is used when referring to the LC host mixture (i.e. without the RMs or polymerizable compounds), while the expression "LC medium" is used when referring to the LC host mixture plus the RM(s) or polymerizable compounds.

Unless stated otherwise, the polymerisable compounds and RMs are preferably selected from achiral compounds.

As used herein, the terms "active layer" and "switchable layer" mean a layer in an electrooptical display, for example an LC display, that comprises one or more molecules having structural and optical anisotropy, like for example LC molecules, which change their orientation upon an external stimulus like an electric or magnetic field, resulting in a change of the transmission of the layer for polarized or unpolarized light.

As used herein, the terms "reactive mesogen" and "RM" will be understood to mean a compound containing a mesogenic or liquid crystalline skeleton, and one or more functional groups attached thereto which are suitable for polymerisation and are also referred to as "polymerisable group" or "P".

Unless stated otherwise, the term "polymerisable compound" as used herein will be understood to mean a polymerisable monomeric compound.

As used herein, the term "low-molecular-weight compound" will be understood to mean to a compound that is monomeric and/or is not prepared by a polymerisation reaction, as opposed to a "polymeric compound" or a "polymer".

As used herein, the term "unpolymerisable compound" will be understood to mean a compound that does not contain a functional group that is suitable for polymerisation under the conditions usually applied for the polymerisation of the RMs or polymerizable compounds.

The term "mesogenic group" as used herein is known to the person skilled in the art and described in the literature, and means a group which, due to the anisotropy of its attracting and repelling interactions, essentially contributes to causing a liquid-crystal (LC) phase in low-molecular-weight or polymeric substances. Compounds containing mesogenic groups (mesogenic compounds) do not necessarily have to have an LC phase themselves. It is also possible for mesogenic compounds to exhibit LC phase behaviour only after mixing with other compounds and/or after polymerisation. Typical mesogenic groups are, for example, rigid rod- or disc-shaped units. An overview of the terms and definitions used in connection with mesogenic or LC compounds is given in *Pure Appl. Chem.* 2001, 73(5), 888 and C. Tschierske, G. Pelzl, S. Diele, *Angew. Chem.* 2004, 116, 6340-6368.

The term "spacer group", hereinafter also referred to as "Sp", as used herein is known to the person skilled in the art and is described in the literature, see, for example, *Pure Appl. Chem.* 2001, 73(5), 888 and C. Tschierske, G. Pelzl, S. Diele, *Angew. Chem.* 2004, 116, 6340-6368. As used herein, the terms "spacer group" or "spacer" mean a flexible group, for example an alkylene group, which connects the mesogenic group and the polymerisable group(s) in a polymerisable mesogenic compound.

Above and below,

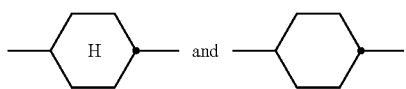

denote a trans-1,4-cyclohexylene ring, and

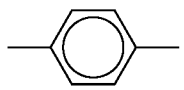

denote a 1,4-phenylene ring.

Above and below "organic group" denotes a carbon or hydrocarbon group.

"Carbon group" denotes a mono- or polyvalent organic group containing at least one carbon atom, where this either contains no further atoms (such as, for example, —C≡C—) or optionally contains one or more further atoms, such as, for example, N, O, S, B, P, Si, Se, As, Te or Ge (for example carbonyl, etc.). The term "hydrocarbon group" denotes a carbon group which additionally contains one or more H atoms and optionally one or more heteroatoms, such as, for example, N, O, S, B, P, Si, Se, As, Te or Ge.

"Halogen" denotes F, Cl, Br or I.

—CO—, —C(=O)— and —C(O)— denote a carbonyl group, i.e.

A carbon or hydrocarbon group can be a saturated or unsaturated group. Unsaturated groups are, for example, aryl, alkenyl or alkynyl groups. A carbon or hydrocarbon radical having more than 3 C atoms can be straight-chain, branched and/or cyclic and may also contain spiro links or condensed rings.

The terms "alkyl", "aryl", "heteroaryl", etc., also encompass polyvalent groups, for example alkylene, arylene, heteroarylene, etc.

The term "aryl" denotes an aromatic carbon group or a group derived therefrom. The term "heteroaryl" denotes "aryl" as defined above, containing one or more heteroatoms, preferably selected from N, O, S, Se, Te, Si and Ge.

Preferred carbon and hydrocarbon groups are optionally substituted, straight-chain, branched or cyclic, alkyl, alkenyl, alkynyl, alkoxy, alkylcarbonyl, alkoxycarbonyl, alkylcarbonyloxy and alkoxycarbonyloxy having 1 to 40, preferably 1 to 20, very preferably 1 to 12, C atoms, optionally substituted aryl or aryloxy having 5 to 30, preferably 6 to 25, C atoms, or optionally substituted alkylaryl, arylalkyl, alkylaryloxy, arylalkyloxy, arylcarbonyl, aryloxycarbonyl, arylcarbonyloxy and aryloxycarbonyloxy having 5 to 30, preferably 6 to 25, C atoms, wherein one or more C atoms may also be replaced by hetero atoms, preferably selected from N, O, S, Se, Te, Si and Ge.

Further preferred carbon and hydrocarbon groups are $C_1$-$C_{20}$ alkyl, $C_2$-$C_{20}$ alkenyl, $C_2$-$C_{20}$ alkynyl, $C_3$-$C_{20}$ allyl, $C_4$-$C_{20}$ alkyldienyl, $C_4$-$C_{20}$ polyenyl, $C_6$-$C_{20}$ cycloalkyl, $C_4$-$C_{15}$ cycloalkenyl, $C_6$-$C_{30}$ aryl, $C_6$-$C_{30}$ alkylaryl, $C_6$-$C_{30}$ arylalkyl, $C_6$-$C_{30}$ alkylaryloxy, $C_6$-$C_{30}$ arylalkyloxy, $C_2$-$C_{30}$ heteroaryl, $C_2$-$C_{30}$ heteroaryloxy.

Particular preference is given to $C_1$-$C_{12}$ alkyl, $C_2$-$C_{12}$ alkenyl, $C_2$-$C_{12}$ alkynyl, $C_6$-$C_{25}$ aryl and $C_2$-$C_{25}$ heteroaryl.

Further preferred carbon and hydrocarbon groups are straight-chain, branched or cyclic alkyl having 1 to 20, preferably 1 to 12, C atoms, which are unsubstituted or mono- or polysubstituted by F, Cl, Br, I or CN and in which one or more non-adjacent $CH_2$ groups may each be replaced, independently of one another, by —C($R^x$)=C($R^x$)—, —C≡C—, —N($R^x$)—, —O—, —S—, —CO—, —CO—O—, —O—CO—, —O—CO—O— in such a way that O and/or S atoms are not linked directly to one another, and $R^x$ denotes H, F, Cl, CN, a straight-chain, branched or cyclic alkyl chain having 1 to 25 C atoms, in which, in addition, one or more non-adjacent C atoms may be replaced by —O—, —S—, —CO—, —CO—O—, —O—CO—, —O—CO—O— and in which one or more H atoms may be replaced by F or Cl, or denotes an optionally substituted aryl or aryloxy group with 6 to 30 C atoms, or an optionally substituted heteroaryl or heteroaryloxy group with 2 to 30 C atoms.

Preferred alkyl groups are, for example, methyl, ethyl, n-propyl, isopropyl, n-butyl, isobutyl, s-butyl, t-butyl, 2-methylbutyl, n-pentyl, s-pentyl, cyclopentyl, n-hexyl, cyclohexyl, 2-ethylhexyl, n-heptyl, cycloheptyl, n-octyl, cyclooctyl, n-nonyl, n-decyl, n-undecyl, n-dodecyl, dodecanyl, trifluoromethyl, perfluoro-n-butyl, 2,2,2-trifluoroethyl, perfluorooctyl, perfluorohexyl, etc.

Preferred alkenyl groups are, for example, ethenyl, propenyl, butenyl, pentenyl, cyclopentenyl, hexenyl, cyclohexenyl, heptenyl, cycloheptenyl, octenyl, cyclooctenyl, etc.

Preferred alkynyl groups are, for example, ethynyl, propynyl, butynyl, pentynyl, hexynyl, octynyl, etc.

Preferred alkoxy groups are, for example, methoxy, ethoxy, 2-methoxy-ethoxy, n-propoxy, i-propoxy, n-butoxy, i-butoxy, s-butoxy, t-butoxy, 2-methylbutoxy, n-pentoxy, n-hexoxy, n-heptoxy, n-octoxy, n-nonoxy, n-decoxy, n-undecoxy, n-dodecoxy, etc.

Preferred amino groups are, for example, dimethylamino, methylamino, methylphenylamino, phenylamino, etc.

Aryl and heteroaryl groups can be monocyclic or polycyclic, i.e. they can contain one ring (such as, for example, phenyl) or two or more rings, which may also be fused (such as, for example, naphthyl) or covalently bonded (such as, for example, biphenyl), or contain a combination of fused and linked rings. Heteroaryl groups contain one or more heteroatoms, preferably selected from O, N, S and Se.

Particular preference is given to mono-, bi- or tricyclic aryl groups having 6 to 25 C atoms and mono-, bi- or tricyclic heteroaryl groups having 5 to 25 ring atoms, which optionally contain fused rings and are optionally substituted. Preference is furthermore given to 5-, 6- or 7-membered aryl and heteroaryl groups, in which, in addition, one or more CH groups may be replaced by N, S or O in such a way that O atoms and/or S atoms are not linked directly to one another.

Preferred aryl groups are, for example, phenyl, biphenyl, terphenyl, [1,1':3',1"]terphenyl-2'-yl, naphthyl, anthracene, binaphthyl, phenanthrene, 9,10-dihydro-phenanthrene, pyrene, dihydropyrene, chrysene, perylene, tetracene, pentacene, benzopyrene, fluorene, indene, indenofluorene, spirobifluorene, etc.

Preferred heteroaryl groups are, for example, 5-membered rings, such as pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings, such as pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, or condensed groups, such as indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquin-oline, acridine, phenothiazine, phenoxazine, benzopyridazine, benzopyrimi-dine, quinoxaline, phenazine, naphthyridine, azacarbazole, benzocarboline, phenanthridine, phenanthroline, thieno[2,3b]thiophene, thieno[3,2b]thiophene, dithienothiophene, isobenzothiophene, dibenzothiophene, benzothiadiazo-thiophene, or combinations of these groups.

The aryl and heteroaryl groups mentioned above and below may also be substituted by alkyl, alkoxy, thioalkyl, fluorine, fluoroalkyl or further aryl or heteroaryl groups.

The (non-aromatic) alicyclic and heterocyclic groups encompass both saturated rings, i.e. those containing exclusively single bonds, and also partially unsaturated rings, i.e. those which may also contain multiple bonds. Heterocyclic rings contain one or more heteroatoms, preferably selected from Si, O, N, S and Se.

The (non-aromatic) alicyclic and heterocyclic groups can be monocyclic, i.e. contain only one ring (such as, for example, cyclohexane), or polycyclic, i.e. contain a plurality of rings (such as, for example, decahydronaphthalene or bicyclooctane). Particular preference is given to saturated groups. Preference is furthermore given to mono-, bi- or tricyclic groups having 5 to 25 ring atoms, which optionally contain fused rings and are optionally substituted. Preference is furthermore given to 5-, 6-, 7- or 8-membered carbocyclic groups, in which, in addition, one or more C atoms may be replaced by Si and/or one or more CH groups may be replaced by N and/or one or more non-adjacent CH$_2$ groups may be replaced by —O— and/or —S—.

Preferred alicyclic and heterocyclic groups are, for example, 5-membered groups, such as cyclopentane, tetrahydrofuran, tetrahydrothiofuran, pyrrolidine, 6-membered groups, such as cyclohexane, silinane, cyclohexene, tetrahydropyran, tetrahydrothiopyran, 1,3-dioxane, 1,3-dithiane, piperidine, 7-membered groups, such as cycloheptane, and fused groups, such as tetrahydronaphthalene, decahydronaphthalene, indane, bicyclo[1.1.1]-pentane-1,3-diyl, bicyclo[2.2.2]octane-1,4-diyl, spiro[3.3]heptane-2,6-diyl, octahydro-4,7-methanoindane-2,5-diyl.

Preferred substituents are, for example, solubility-promoting groups, such as alkyl or alkoxy, electron-withdrawing groups, such as fluorine, nitro or nitrile, or substituents for increasing the glass transition temperature (Tg) in the polymer, in particular bulky groups, such as, for example, t-butyl or optionally substituted aryl groups.

Preferred substituents, hereinafter also referred to as $L^S$, are, for example, F, Cl, Br, I, —CN, —NO$_2$, —NCO, —NCS, —OCN, —SCN, —C(=O)N(R$^x$)$_2$, —C(=O)Y$^1$, —C(=O)R$^x$, —N(R$^x$)$_2$, straight-chain or branched alkyl, alkoxy, alkylcarbonyl, alkoxycarbonyl, alkylcarbonyloxy or alkoxycarbonyloxy each having 1 to 25 C atoms, in which one or more H atoms may optionally be replaced by F or Cl, optionally substituted silyl having 1 to 20 Si atoms, or optionally substituted aryl having 6 to 25, preferably 6 to 15, C atoms, wherein R$^x$ denotes H, F, Cl, CN, or straight chain, branched or cyclic alkyl having 1 to 25 C atoms, wherein one or more non-adjacent CH$_2$-groups are optionally replaced by —O—, —S—, —CO—, —CO—O—, —O—CO—, —O—CO—O— in such a manner that O- and/or S-atoms are not directly connected with each other, and wherein one or more H atoms are each optionally replaced by F, Cl, P— or P-Sp-, and Y$^1$ denotes halogen.

"Substituted silyl or aryl" preferably means substituted by halogen, —CN, R$^0$, —OR$^0$, —CO—R$^0$, —CO—O—R$^0$, —O—CO—R$^0$ or —O—CO—O—R$^0$, wherein R$^0$ denotes H or alkyl with 1 to 20 C atoms.

Particularly preferred substituents L are, for example, F, Cl, CN, NO$_2$, CH$_3$, C$_2$H$_5$, OCH$_3$, OC$_2$H$_5$, COCH$_3$, COC$_2$H$_5$, COOCH$_3$, COOC$_2$H$_5$, CF$_3$, OCF$_3$, OCHF$_2$, OC$_2$F$_5$, furthermore phenyl.

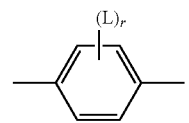

is preferably

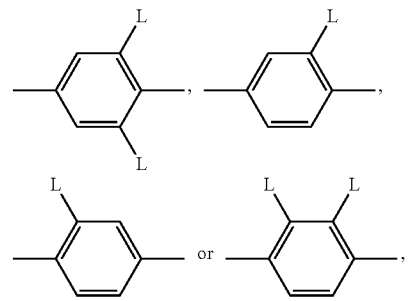

in which L has one of the meanings indicated above.

The polymerisable group P is a group which is suitable for a polymerisation reaction, such as, for example, free-radical or ionic chain polymerisation, polyaddition or polycondensation, or for a polymer-analogous reaction, for example addition or condensation onto a main polymer chain. Particular preference is given to groups for chain polymerisation, in particular those containing a C=C double bond or —C≡C— triple bond, and groups which are suitable for polymerisation with ring opening, such as, for example, oxetane or epoxide groups.

Preferred groups P are selected from the group consisting of $CH_2=CW^1$—CO—O—, $CH_2=CW^1$—CO—,

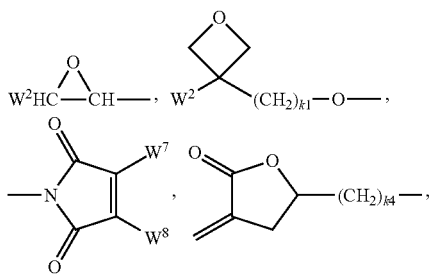

$CH_2=CW^2$—$(O)_{k3}$—, $CW^1=CH$—CO—$(O)_{k3}$—, $CW^1=CH$—CO—NH—, $CH_2=CW^1$—CO—NH—, $CH_3$—CH=CH—O—, $(CH_2=CH)_2CH$—OCO—, $(CH_2=CH$—$CH_2)_2CH$—OCO—, $(CH_2=CH)_2CH$—O—, $(CH_2=CH$—$CH_2)_2N$—, $(CH_2=CH$—$CH_2)_2N$—CO—, HO—$CW^2W^3$—, HS—$CW^2W^3$—, $HW^2N$—, HO—$CW^2W^3$—NH—, $CH_2=CW^1$—CO—NH—, $CH_2=CH$—$(COO)_{k1}$-Phe-$(O)_{k2}$—, $CH_2=CH$—$(CO)_{k1}$-Phe-$(O)_{k2}$—, Phe-CH=CH—, HOOC—, OCN— and $W^4W^5W^6Si$—, in which $W^1$ denotes H, F, Cl, CN, $CF_3$, phenyl or alkyl having 1 to 5 C atoms, in particular H, F, Cl, $CH_3$ or $C_2H_5$, $W^2$ and $W^3$ each, independently of one another, denote H or alkyl having 1 to 5 C atoms, in particular H, methyl, ethyl or n-propyl, $W^4$, $W^5$ and $W^6$ each, independently of one another, denote Cl, oxaalkyl or oxacarbonylalkyl having 1 to 5 C atoms, $W^7$ and $W^8$ each, independently of one another, denote H, Cl or alkyl having 1 to 5 C atoms, Phe denotes 1,4-phenylene, which is optionally substituted by one or more radicals L as defined above which are other than P-Sp-, $k_1$, $k_2$ and $k_3$ each, independently of one another, denote 0 or 1, $k_3$ preferably denotes 1, and $k_4$ denotes an integer from 1 to 10.

Very preferred groups P are selected from the group consisting of $CH_2=CW^1$—CO—O—, $CH_2=CW^1$—CO—,

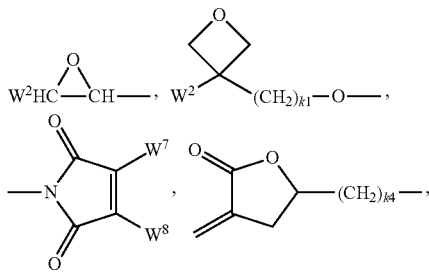

$CH_2=CW^2$—O—, $CH_2=CW^2$—, $CW^1=CH$—CO—$(O)_{k3}$—, $CW^1=CH$—CO—NH—, $CH_2=CW^1$—CO—NH—, $(CH_2=CH)_2CH$—OCO—, $(CH_2=CH$—$CH_2)_2$CH—OCO—, $(CH_2=CH)_2CH$—O—, $(CH_2=CH$—$CH_2)_2$N—, $(CH_2=CH$—$CH_2)_2$N—CO—, $CH_2=CW^1$—CO—NH—, $CH_2=CH$—$(COO)_{k1}$-Phe-$(O)_{k2}$—, $CH_2=CH$—$(CO)_{k1}$-Phe-$(O)_{k2}$—, Phe-CH=CH— and $W^4W^5W^6Si$—, in which $W^1$ denotes H, F, Cl, CN, $CF_3$, phenyl or alkyl having 1 to 5 C atoms, in particular H, F, Cl, $CH_3$ or $C_2H_5$, $W^2$ and $W^3$ each, independently of one another, denote H or alkyl having 1 to 5 C atoms, in particular H, methyl, ethyl or n-propyl, $W^4$, $W^5$ and $W^6$ each, independently of one another, denote Cl, oxaalkyl or oxacarbonylalkyl having 1 to 5 C atoms, $W^7$ and $W^8$ each, independently of one another, denote H, Cl or alkyl having 1 to 5 C atoms, Phe denotes 1,4-phenylene, $k_1$, $k_2$ and $k_3$ each, independently of one another, denote 0 or 1, $k_3$ preferably denotes 1, and $k_4$ denotes an integer from 1 to 10.

Very particularly preferred groups P are selected from the group consisting of $CH_2=CW^1$—CO—O—, in particular $CH_2=CH$—CO—O—, $CH_2=C(CH_3)$—CO—O— and $CH_2=CF$—CO—O—, furthermore $CH_2=CH$—O—, $(CH_2=CH)_2CH$—O—CO—, $(CH_2=CH)_2CH$—O—,

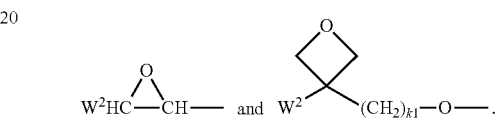

Further preferred polymerisable groups P are selected from the group consisting of vinyloxy, acrylate, methacrylate, ethacrylate, fluoroacrylate, chloroacrylate, oxetane and epoxide, most preferably from acrylate and methacrylate.

If Sp is different from a single bond, it is preferably of the formula Sp"-X", so that the respective radical P-Sp- conforms to the formula P-Sp"-X"—, wherein Sp" denotes alkylene having 1 to 20, preferably 1 to 12, C atoms, which is optionally mono- or polysubstituted by F, Cl, Br, I or CN and in which, in addition, one or more non-adjacent $CH_2$ groups may each be replaced, independently of one another, by —O—, —S—, —NH—, —N($R^0$)—, —Si($R^0R^{00}$)—, —CO—, —CO—O—, —O—CO—, —O—CO—O—, —S—CO—, —CO—S—, —N($R^{00}$)—CO—O—, —O—CO—N($R^0$)—, —N($R^0$)—CO—N($R^{00}$)—, —CH=CH— or —C≡C— in such a way that O and/or S atoms are not linked directly to one another, X" denotes —O—, —S—, —CO—, —CO—O—, —O—CO—, —O—CO—O—, —CO—N($R^0$)—, —N($R^0$)—CO—, —N($R^0$)—CO—N($R^{00}$)—, —OCH$_2$—, —CH$_2$O—, —SCH$_2$—, —CH$_2$S—, —CF$_2$O—, —OCF$_2$—, —CF$_2$S—, —SCF$_2$—, —CF$_2$CH$_2$—, —CH$_2$CF$_2$—, —CF$_2$CF$_2$—, —CH=N—, —N=CH—, —N=N—, —CH=CR$^0$—, —CY$^2$=CY$^3$—, —C≡C—, —CH=CH—CO—O—, —O—CO—CH=CH— or a single bond, $R^0$ and $R^{00}$ each, independently of one another, denote H or alkyl having 1 to 20 C atoms, and $Y^2$ and $Y^3$ each, independently of one another, denote H, F, Cl or CN.

X" is preferably —O—, —S—, —CO—, —COO—, —OCO—, —O—COO—, —CO—NR$^0$—, —NR$^0$—CO—, —NR$^0$—CO—NR$^0$— or a single bond.

Typical spacer groups Sp and -Sp"-X"— are, for example, —$(CH_2)_{p1}$—, —$(CH_2CH_2O)_{q1}$—$CH_2CH_2$—, —$CH_2CH_2$—S—$CH_2CH_2$—, —$CH_2CH_2$—NH—$CH_2CH_2$— or —$(SiR^0R^{00}$—$O)_{p1}$—, in which p1 is an integer from 1 to 12, q1 is an integer from 1 to 3, and $R^0$ and $R^{00}$ have the meanings indicated above.

Particularly preferred groups Sp and -Sp"-X"— are —$(CH_2)_{p1}$—, —$(CH_2)_{p1}$—O—, —$(CH_2)_{p1}$—O—CO—, —(CH$_2$)$_{p1}$—CO—O—, —(CH$_2$)$_{p1}$—O—CO—O—, in which p1 and q1 have the meanings indicated above.

Particularly preferred groups Sp" are, in each case straight-chain, ethylene, propylene, butylene, pentylene, hexylene, heptylene, octylene, nonylene, decylene, undecylene, dodecylene, octadecylene, ethyleneoxyethylene, methyleneoxybutylene, ethylenethioethylene, ethylene-N-methylimino-ethylene, 1-methylalkylene, ethenylene, propenylene and butenylene.

The LC medium according to the present invention contains a polymerisable component A) comprising one or more first polymerisable compounds with a polymerisable group and a bi- or polycylic hydrocarbon group, and one or more second polymerisable compounds with a polymerisable group and a straight-chain, branched or monocyclic hydrocarbon group.

The hydrocarbon group contained in the first and second polymerisable compounds is preferably a non-aromatic group.

In a first preferred embodiment the present invention the bi- or polycyclic hydrocarbon group in the first polymerisable compound is a bridged bi- or polycyclic hydrocarbon group, i.e. which consists of fused hydrocarbon rings, preferably fused cycloalkyl rings, where fusion occurs across a sequence of atoms (bridgehead), preferably a bipodal bridge, like in bicyclo[2.2.1]heptane (norbornane), bicyclo[2.2.2]octane or tricyclo[3.3.3.1]decane (adamantane).

In a second preferred embodiment the present invention the bi- or polycyclic hydrocarbon group in the first polymerisable compounds is a fused bi- or polycyclic hydrocarbon group, i.e. which consists of fused hydrocarbon rings, preferably fused cycloalkyl rings, where fusion occurs across a bond between two atoms, like in bicyclo[3.2.0]heptane or bicyclo[4.4.4.0]decane (decalin).

In a third preferred embodiment the present invention the bi- or polycyclic hydrocarbon group in the first polymerisable compounds is a spirocyclic group, i.e. which consists of fused hydrocarbon rings, preferably fused cycloalkyl rings, where fusion occurs at a single atom (spiro atom), like in spiro[3.3]heptane or spiro[4.5]decane.

The bi- or polycyclic group os optionally substituted by one or more substituents. Preferred substituents are the groups L and L$^S$ as defined above and below.

Preferably the bi- or polycyclic group is selected from the group consisting of bicyclo[1.1.1]pentyl, bicyclo[2.1.1]hexyl, bicyclo[2.2.1]heptyl (norbornyl), bicyclo[3.2.1]octyl, bicyclo[2.2.2]octyl, bicyclo[3.2.2]nonyl, bicyclo[3.3.1]nonyl, bicyclo[3.3.2]decyl, bicyclo[3.3.3]undecyl, tricyclo[3.3.3.1]decyl (adamantyl), tricyclo[5.2.1.0]decyl (tetrahydrodicyclopentadiyl), bicyclo[2.1.0]pentyl, bicyclo[2.2.0]hexyl, bicyclo[3.2.0]heptyl, bicyclo[4.2.0]octyl, bicyclo[3.3.0]octyl, bicyclo[4.3.0]nonyl, bicyclo[4.4.0]decyl (decalin), spiro[2.2]pentyl, spiro[3.2]hexyl, spiro[3.3]heptyl, spiro[4.3]octyl, spiro[4.4]nonyl, spiro[4.5]decyl, all of which are optionally substituted by one or more groups L or L$^S$ as defined above and below.

Very preferably the bi- or polycyclic group is selected from the group consisting of bicyclo[1.1.1]pentyl, bicyclo[2.1.1]hexyl, bicyclo[2.2.1]heptyl (norbornyl), bicyclo[3.2.1]octyl, bicyclo[2.2.2]octyl, bicyclo[3.2.2]nonyl, bicyclo[3.3.1]nonyl, bicyclo[3.3.2]decyl, bicyclo[3.3.3]undecyl, tricyclo[3.3.3.1]decyl (adamantyl), all of which are optionally substituted by one or more groups L or L$^S$ as defined above and below.

Most preferably the bi- or polycyclic group is selected from the group consisting of bicyclo[2.2.1]heptyl (norbornyl), bicyclo[2.2.2]octyl, tricyclo[3.3.3.1]decyl (adamantyl), all of which are optionally substituted by one or more groups L or L$^S$ as defined above and below.

Preferably component A) of the LC medium comprises one or more first polymerisable compounds selected from formula I $$P\text{-}Sp\text{-}G^1 \qquad\qquad I$$

wherein

P is a polymerisable group,

Sp is a spacer group or a single bond,

G$^1$ is a bi-, tri- or tetracyclic hydrocarbon group, preferably a bridged or fused bi-, tri- or or tetracyclic alkyl group, having 6 to 20 ring atoms which is optionally substituted by one or more groups L, L is F, Cl, —CN, —NO$_2$, —NCO, —NCS, —OCN, —SCN, —C(=O)N(R$^x$)$_2$, —C(=O)Y$^1$, —C(=O)R$^x$, —N(R$^x$)$_2$, optionally substituted silyl, optionally substituted aryl or heteroaryl having 5 to 20 ring atoms, or straight-chain or branched alkyl having 1 to 25, particularly preferably 1 to 10, C atoms, in which, in addition, one or more non-adjacent CH$_2$ groups may each be replaced, independently of one another, by —C(R$^0$)=C(R$^{00}$)—, —C≡C—, —N(R$^0$)—, —O—, —S—, —CO—, —CO—O—, —O—CO—, —O—CO—O— in such a way that O and/or S atoms are not linked directly to one another, and in which, in addition, one or more H atoms may be replaced by F, Cl, —CN, R$^x$ is H, F, Cl, CN, or straight chain, branched or cyclic alkyl having 1 to 25 C atoms, wherein one or more non-adjacent CH$_2$-groups are optionally replaced by —O—, —S—, —CO—, —CO—O—, —O—CO—, —O—CO—O— in such a manner that O- and/or S-atoms are not directly connected with each other, and wherein one or more H atoms are each optionally replaced by F or Cl, R$^0$, R$^{00}$ are H or alkyl having 1 to 20 C atoms, Y$^1$ is halogen, preferably F or Cl.

P is preferably acrylate, methacrylate or oxetane, very preferably acrylate or methacrylate.

Sp is preferably of the formula Sp"-X", so that the respective radical P-Sp-conforms to the formula P-Sp"-X"—, wherein Sp" and X" are as defined above.

Sp is very preferably"—are —(CH$_2$)$_{p1}$—, —(CH$_2$)$_{p1}$—O—, —(CH$_2$)$_{p1}$—O—CO—, —(CH$_2$)$_{p1}$—CO—O—, —(CH$_2$)$_{p1}$—O—CO—O—, in which p1 is an integer from 1 to 12.

L is preferably is selected from F, Cl, —CN and straight-chain or branched alkyl having 1 to 25, particularly preferably 1 to 10, C atoms, in which, in addition, one or more non-adjacent CH$_2$ groups may each be replaced, independently of one another, by —C(R$^0$)=C(R$^{00}$)—, —C≡C—, —N(R$^0$)—, —O—, —S—, —CO—, —CO—O—, —O—CO—, —O—CO—O— in such a way that O and/or S atoms are not linked directly to one another, and in which, in addition, one or more H atoms may be replaced by F, Cl, Br, I or CN.

L is very preferably selected from F, —CN, and alkyl or alkoxy with 1 to 6 C atoms that is optionally fluorinated, preferably F, Cl, CN, CH$_3$, OCH$_3$, OCF$_3$, OCF$_2$H or OCFH$_2$, very preferably F.

G$^1$ is preferably selected the group consisting of bicyclo[1.1.1]pentyl, bicyclo[2.1.1]hexyl, bicyclo[2.2.1]heptyl (norbornyl), bicyclo[3.2.1]octyl, bicyclo[2.2.2]octyl, bicyclo[3.2.2]nonyl, bicyclo[3.3.1]nonyl,bicyclo[3.3.2]decyl, bicyclo[3.3.3]undecyl, tricyclo[3.3.3.1]decyl (adamantyl), tricyclo[5.2.1.0]decyl (tetrahydrodicyclopentadiyl), bicyclo[2.1.0]pentyl, bicyclo[2.2.0]hexyl, bicyclo[3.2.0]heptyl, bicyclo[4.2.0]octyl, bicyclo[3.3.0]octyl, bicyclo[4.3.0]nonyl, bicyclo[4.4.0]decyl (decalin), spiro[2.2]pentyl, spiro[3.2]hexyl, spiro[3.3]heptyl, spiro[4.3]octyl, spiro[4.4]nonyl, spiro[4.5]decyl, all of which are optionally substituted by one or more groups L.

$G^1$ is very preferably selected from the group consisting of bicyclo[1.1.1]pentyl, bicyclo[2.1.1]hexyl, bicyclo[2.2.1]heptyl (norbornyl), bicyclo[3.2.1]octyl, bicyclo[2.2.2]octyl, bicyclo[3.2.2]nonyl, bicyclo[3.3.1]nonyl, bicyclo[3.3.2]decyl, bicyclo[3.3.3]undecyl, tricyclo[3.3.3.1]decyl (adamantyl), all of which are optionally substituted by one or more groups L.

$G^1$ is most preferably selected from the group consisting of, bicyclo[2.2.1]heptyl (norbornyl), bicyclo[2.2.2]octyl, tricyclo[3.3.3.1]decyl (adamantyl) all of which are optionally substituted by one or more groups L.

Preferred compounds of formula I are selected from the following formulae

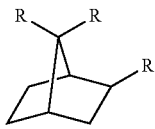

IA

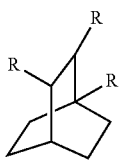

IB

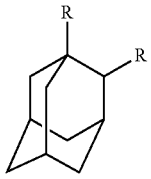

IC wherein R on each occurrence identically or differently denotes P-Sp- or has one of the meanings given for $R^x$ above, and at least one of the groups R in each of formulae IA-IC denotes P-Sp-.

Further preferred compounds of formula I are selected from the following formulae

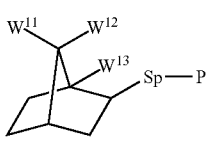

I1

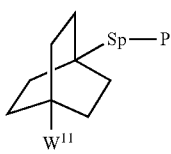

I2

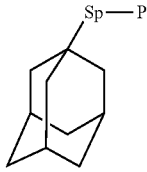

I3

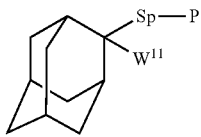

I4 wherein P and Sp have the meanings given in formula I or one of the preferred meanings given above, $W^{11}$, $W^{12}$ and $W^{13}$ are independently of each other H, F or $C_1$-$C_{12}$-alkyl, preferably methyl, and the cycloalkyl groups are optionally substituted with one or more groups L as defined above.

Very preferred compounds of formula I are selected from the following formulae

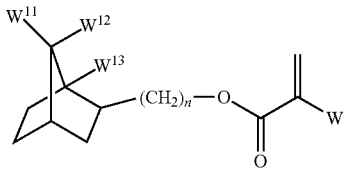

I1a

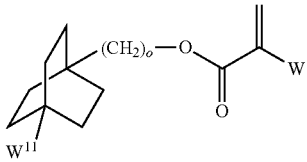

I2a

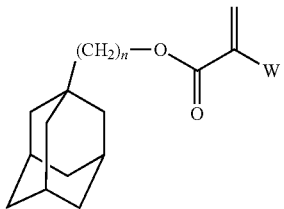

I3a

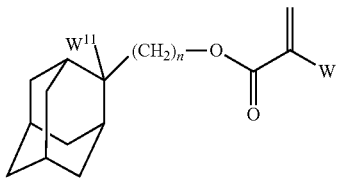

I4a wherein n is 0 or an integer from 1 to 8, W is H, $CH_3$ or $C_2H_5$ and $W^{11}$, $W^{12}$ and $W^{13}$ are H, F or $C_1$-$C_{12}$-alkyl, preferably methyl.

Further preferred compounds of formula I are selected from the following formulae

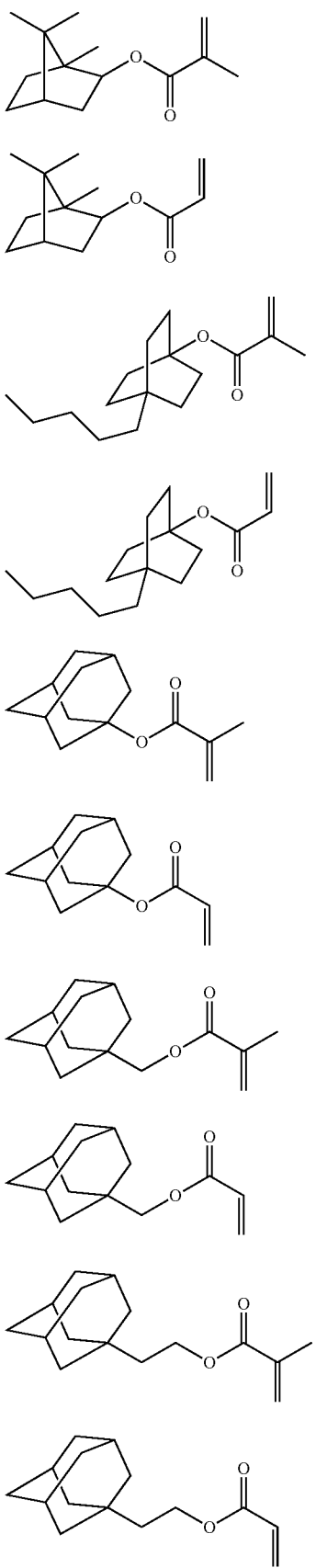

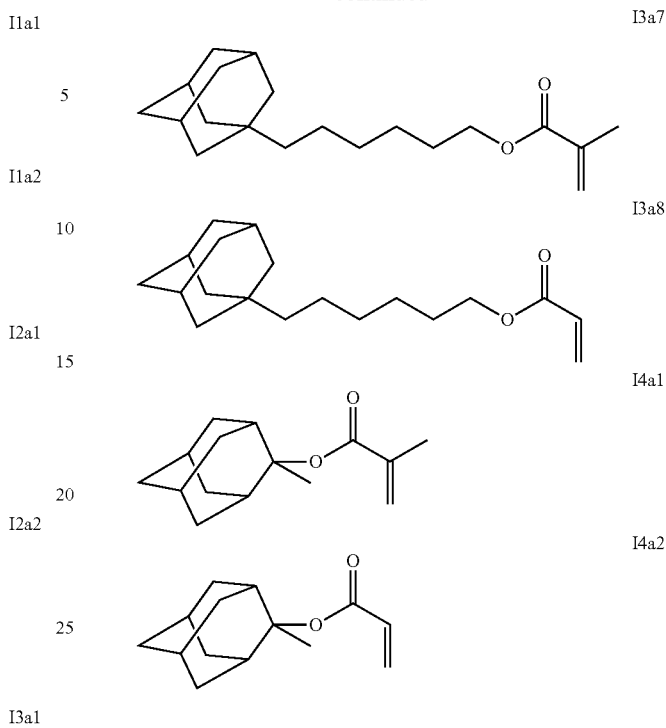

Preferably component A) of the LC medium comprises one or more second polymerisable compounds selected of formula II $$P\text{-}Sp\text{-}G^2 \qquad \qquad II$$

wherein

P and Sp have the meanings given in formula I or one of the preferred meanings given above and below, and $G^2$ is a straight-chain, branched or monocyclic alkyl group with 1 to 20 C atoms that is optionally mono-, poly- or perfluorinated and is optionally substituted by one or more groups L as defined in formula I, and wherein one or more $CH_2$-groups are optionally replaced by —O—, —CO—, —O—CO— or —CO—O— such that O-atoms are not directly adjacent to one another.

Preferred compounds of formula II are selected from the following formulae

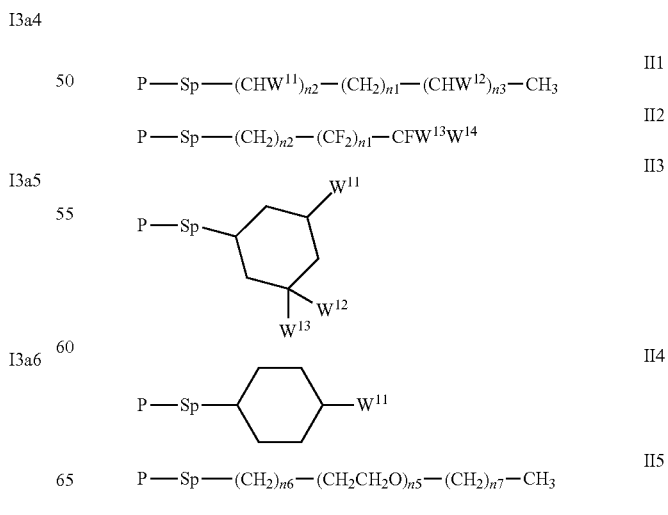

wherein the individual radicals, independently of each other and on each occurrence identically or differently, have the following meanings P, Sp have the meanings given in formula I or one of the preferred meanings given above and below, $W^{11}$, $W^{12}$ are H, F or $C_1$-$C_{12}$-alkyl, $W^{13}$, $W^{14}$ are H or F, n1 is an integer from 2 to 15, n2, n3 are 0 or an integer from 1 to 3, n5 an integer from 1 to 5, n6, n7 0 or an integer from 1 to 15.

Very preferred compounds of formula II are selected from the following formulae

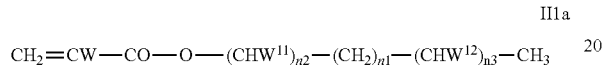
II1a

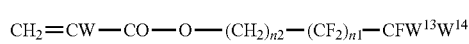
II2a

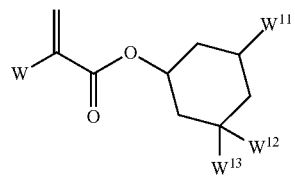
II3a

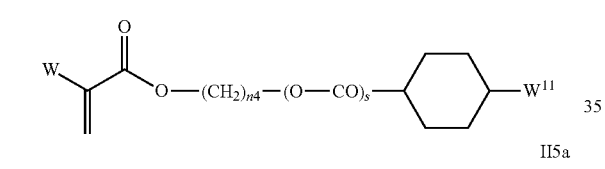
II4a

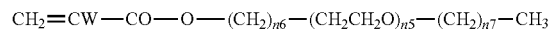
II5a wherein W is H, $CH_3$ or $C_2H_5$, and $W^{11}$, $W^{12}$, $W^{13}$, $W^{14}$, n1, n2; n3, n5, n6 and n7 are as defined in formula II1-II5, n4 is 0 or an integer from 1 to 15, s is 0 or 1, and if s is 1 then n4 is not 0.

Further preferred compounds of formula II are selected from the following formulae

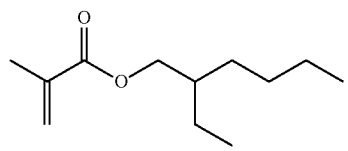
II1a1

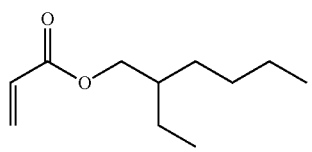
II1a2

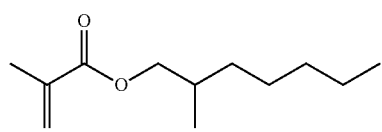
II1a3

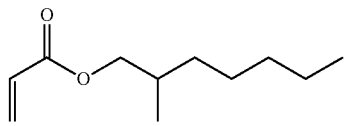
II1a4

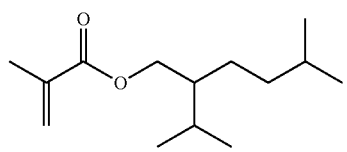
II1a5

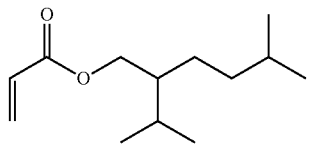
II1a6

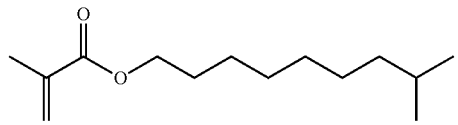
II1a7

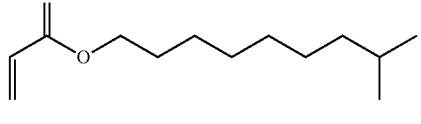
II1a8

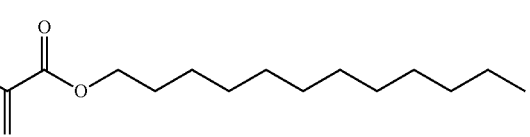
II1a9

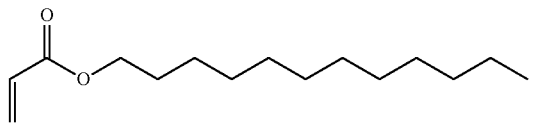
II1a10

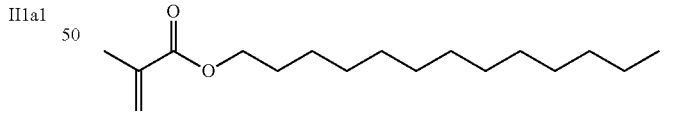
II1a11

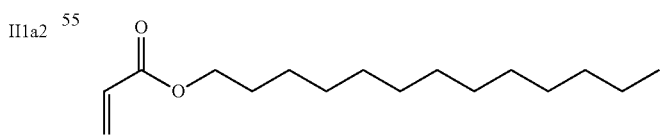
II1a12

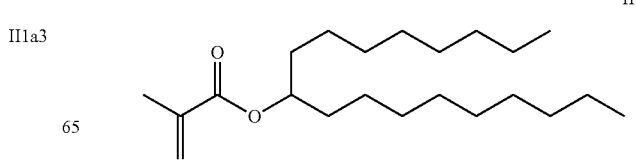
II1a13

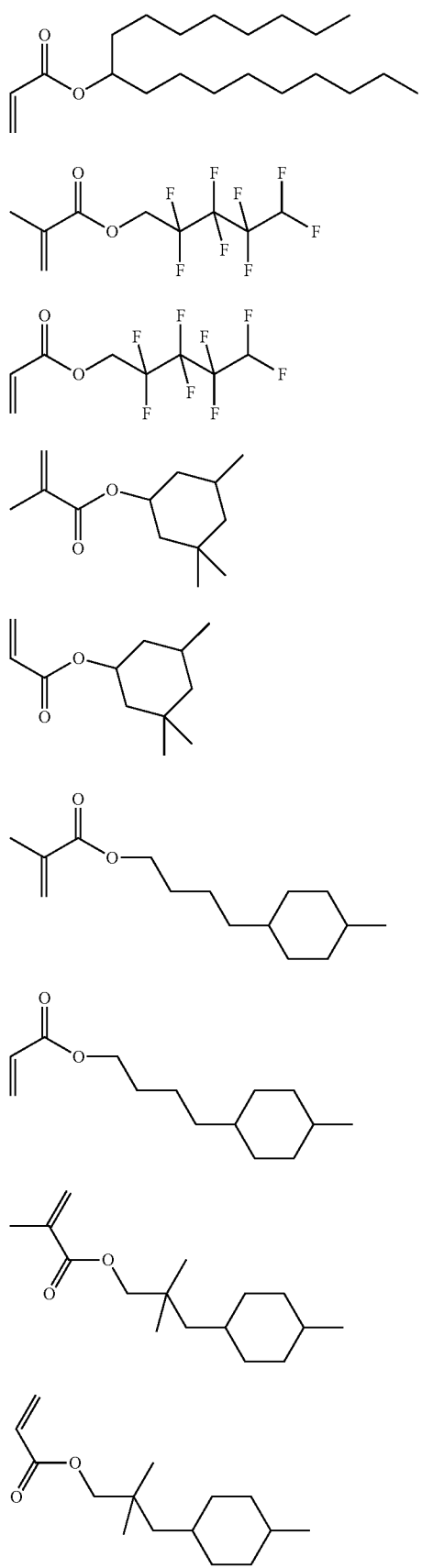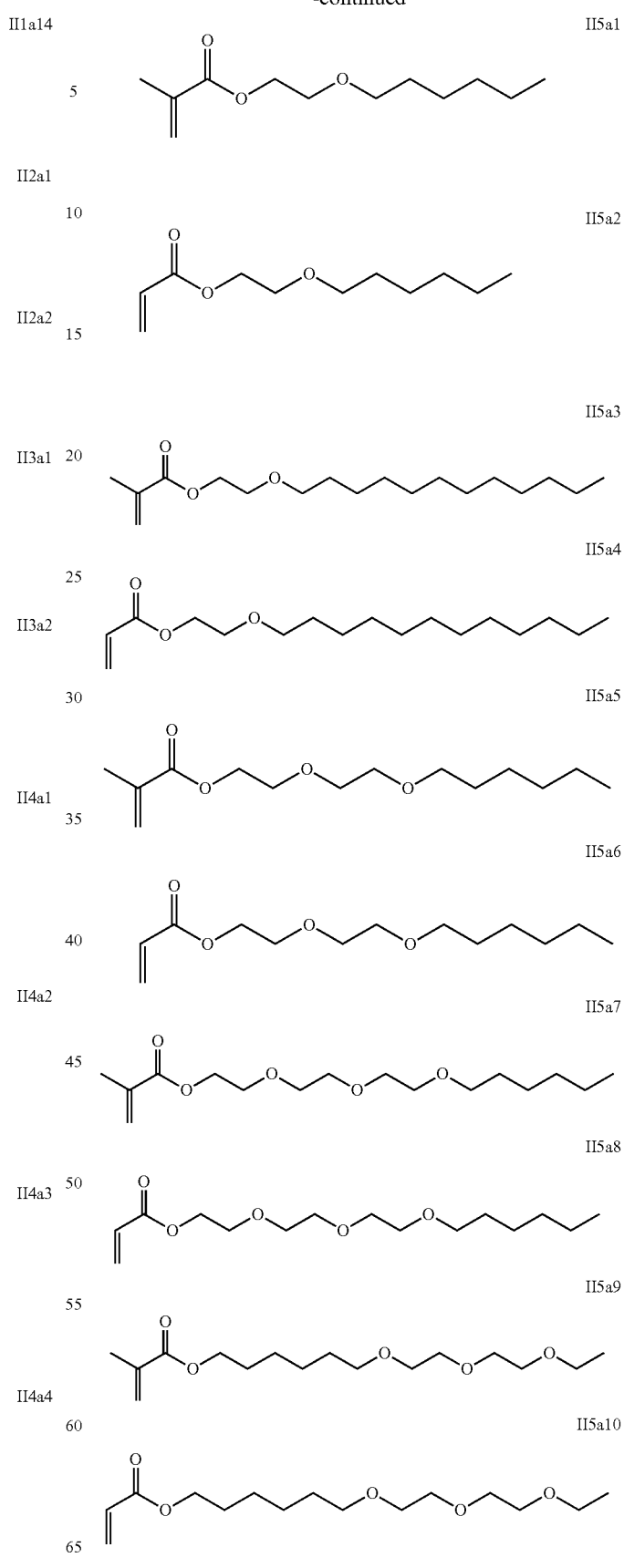

In another preferred embodiment of the present invention component A) of the LC medium comprises, alternatively or in addition to the first polymerisable compound of formula I, one or more first polymerisable compounds comprising two or more polymerisable groups and a bi- or polycylic hydrocarbon group.

These compounds are preferably selected from formula III

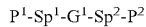   III wherein
$P^1$, $P^2$ have one of the meanings of P given in formula I or its preferred meanings given above,
$Sp^1$, $Sp^2$ have one of the meanings of Sp given in formula I or its preferred meanings given above,
$G^1$ has one of the meanings given in formula I or its preferred meanings given above, which is optionally substituted by one or more groups L and/or P-Sp-.
wherein P and Sp have the meanings given in formula I or one of the preferred meanings given above, and the cycloalkyl groups are optionally substituted with one or more groups L.

In another preferred embodiment of the present invention component A) of the LC medium comprises, alternatively or in addition to the second polymerisable compound of formula II, one or more second polymerisable compounds comprising two or more polymerisable groups and a straight-chain, branched or monocyclic hydrocarbon group.

These compounds are preferably selected from formula IV

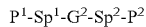   IV wherein
$P^1$, $P^2$ have one of the meanings of P given in formula II or its preferred meanings given above,
$Sp^1$, $Sp^2$ have one of the meanings of Sp given in formula II or its preferred meanings given above,
$G^2$ has one of the meanings given in formula II or its preferred meanings given above, which is optionally substituted by one or more groups L and/or P-Sp-.

Preferred compounds of formula IV are selected from the following formulae

   IV1

   IV2

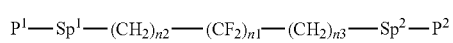   IV3 wherein $P^1$, $P^2$, $Sp^1$, $Sp^2$ are as defined in formula IV, and $W^{11}$, $W^{12}$, n1, n2 and n3 are as defined in formula Ill and 112, and the cyclohexylene ring in formula IV2 is optionally substituted by one or more identical or different groups $W^{11}$.

Very preferred compounds of formula IV are selected from the following formulae

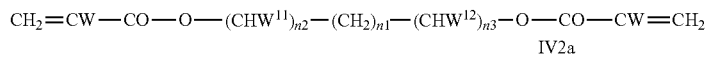   IV1a

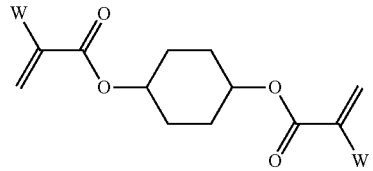   IV2a

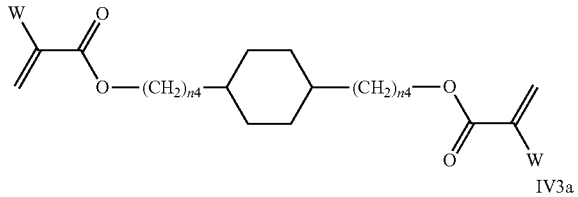   IV2b

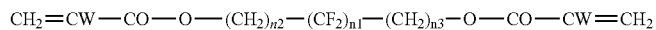   IV3a wherein W, $W^{11}$, $W^{12}$, n1, n2 and n3 are as defined in formula Ill and 112, n4 is an integer form 1 to 6, and the cyclohexylene ring in formula IV2a is optionally substituted by one or more identical or different groups $W^{11}$.

Further preferred compounds of formula IV are selected from the following formulae

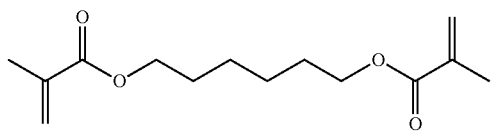   IV1a1

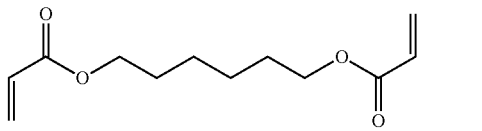   IV1a2

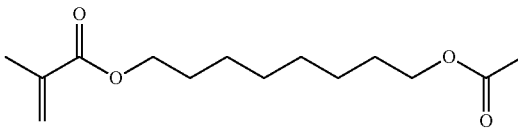   IV1a3

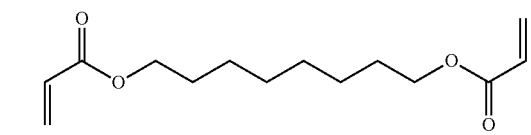   IV1a4

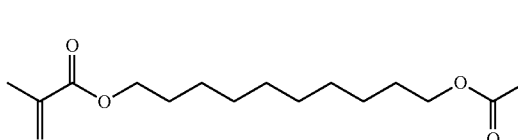   IV1a5

IV1a6
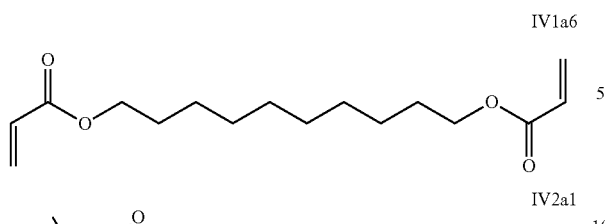
IV2a1
IV2a2
IV2b1
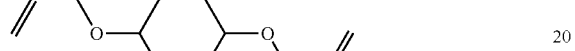
IV2b2
IV3a1
IV3a2
IV4a
IV4b
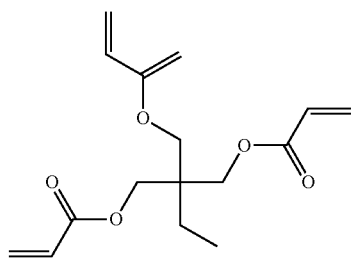
IV4c
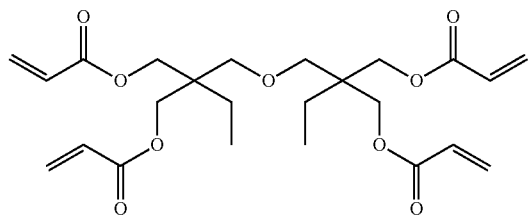
Iv4d
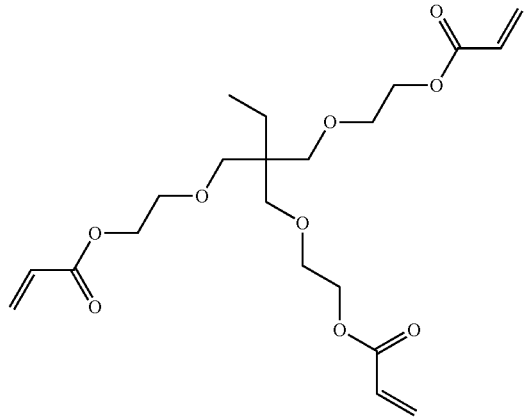
IV4e
Further preferred compounds of formula IV are selected from the following formulae
IV4a
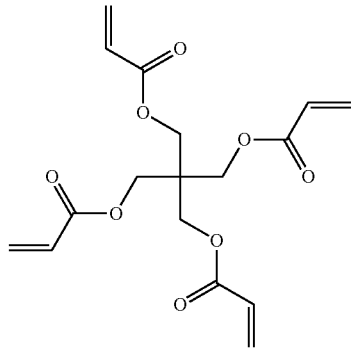

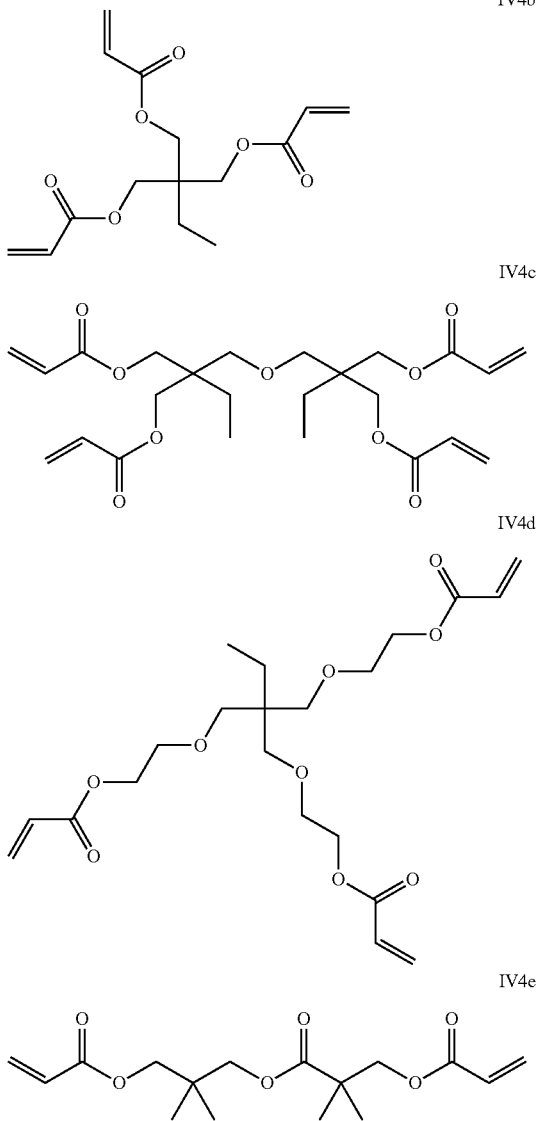

The concentration of the first and second polymerisable compounds, or compounds of formula I, II, III and IV, in the LC medium is preferably from 1 to 30% by weight, very preferably from 1 to 25% by weight.

In a first preferred embodiment of the present invention, the concentration of the first and second polymerisable compounds, or compounds of formula I, II, III and IV in the LC medium is from 10 to 20% by weight.

In a second preferred embodiment of the present invention, the concentration of the first and second polymerisable compounds, or compounds of formula I, II, III and IV in the LC medium is from 5 to 10% by weight.

In a third preferred embodiment of the present invention, the concentration of the first and second polymerisable compounds, or compounds of formula I, II, III and IV in the LC medium is from 1 to 5% by weight.

In a fourth preferred embodiment of the present invention, the concentration of the first and second polymerisable compounds, or compounds of formula I, II, III and IV in the LC medium is from 15 to 25% by weight.

The ratio of first polymerisable compounds or compounds of formula I and III, and second polymerisable compounds or compounds of formula II and IV, in the LC medium is preferably from 50:1 to 1:50, very preferably from 10:1 to 1:10, most preferably from 4:1 to 1:4.

The concentration of first and second polymerisable compounds with (exactly) one polymerisable group, or compounds of formula I and II, in the LC medium is preferably from 5 to 30% by weight.

The concentration of first and second polymerisable compounds with (exactly) two polymerisable groups, or compounds of formula II and IV, in the LC medium is preferably from 0.1 to 10%, very preferably from 0.1 to 5%, most preferably from 0.1 to 2% by weight.

Particular preference is given to LC media wherein the polymerisable component A) comprises one, two or three first polymerisable compounds or compounds of formula I and/or III, and one, two or three second polymerisable compounds or compounds of formula II and/or IV.

In another preferred embodiment of the present invention, the polymerisable component A) of the LC medium comprises, in addition to the first and second polymerisable compounds as described above, one or more polymerisable compounds comprising an aromatic or heteroaromatic ring, preferably selected from reactive mesogens.

Preferred reactive mesogens are selected of formula M

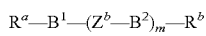

in which the individual radicals, on each occurrence identically or differently, and each, independently of one another, have the following meaning:

$R^a$ and $R^b$ P, P-Sp-, H, F, Cl, Br, I, —CN, —$NO_2$, —NCO, —NCS, —OCN, —SCN, $SF_5$ or straight-chain or branched alkyl having 1 to 25 C atoms, in which, in addition, one or more non-adjacent $CH_2$ groups may each be replaced, independently of one another, by —C($R^0$)=C($R^{00}$)—, —C≡C—, —N($R^{00}$)—, —O—, —S—, —CO—, —CO—O—, —O—CO—, —O—CO—O— in such a way that O and/or S atoms are not linked directly to one another, and in which, in addition, one or more H atoms may be replaced by F, Cl, Br, I, CN, P or P-Sp-, where, if $B^1$ and/or $B^2$ contain a saturated C atom, $R^a$ and/or $R^b$ may also denote a radical which is spiro-linked to this saturated C atom, wherein at least one of the radicals $R^a$ and $R^b$ denotes or contains a group P or P-Sp-, P a polymerisable group, Sp a spacer group or a single bond, $B^1$ and $B^2$ an aromatic, heteroaromatic, alicyclic or heterocyclic group, preferably having 4 to 25 ring atoms, which may also contain fused rings, and which is unsubstituted, or mono- or polysubstituted by L, wherein at least one of $B^1$ and $B^2$ denotes an aromatic or heteroaromatic group, $Z^b$ —O—, —S—, —CO—, —CO—O—, —OCO—, —O—CO—O—, —$OCH_2$—, —$CH_2O$—, —$SCH_2$—, —$CH_2S$—, —$CF_2O$—, —$OCF_2$—, —$CF_2S$—, —$SCF_2$—, —$(CH_2)_{n11}$—, —$CF_2CH_2$—, —$CH_2CF_2$—, —$(CF_2)_{n11}$—, —CH=CH—, —CF=CF—, —C≡C—, —CH=CH—COO—, —OCO—CH=CH—, $CR^0R^{00}$ or a single bond, $R^0$ and $R^{00}$ each, independently of one another, denote H or alkyl having 1 to 12 C atoms, m denotes 0, 1, 2, 3 or 4, n11 denotes 1, 2, 3 or 4, L P, P-Sp-, OH, $CH_2OH$, F, Cl, Br, I, —CN, —$NO_2$, —NCO, —NCS, —OCN, —SCN, —C(=O)N($R^x$)$_2$, —C(=O)$Y^1$, —C(=O)$R^x$, —N($R^x$)$_2$, optionally substituted silyl, optionally substituted aryl having 6 to 20 C atoms, or straight-chain or branched alkyl, alkoxy, alkylcarbonyl, alkoxycarbonyl, alkylcarbonyloxy or alkoxycarbonyloxy having 1 to 25 C atoms, in which, in addition, one or more H atoms may be replaced by F, Cl, P or P-Sp-, P and Sp have the meanings indicated above, $Y^1$ denotes halogen, $R^x$ denotes P, P-Sp-, H, halogen, straight-chain, branched or cyclic alkyl having 1 to 25 C atoms, in which, in addition, one or more non-adjacent $CH_2$ groups may be replaced by —O—, —S—, —CO—, —CO—O—, —O—CO—, —O—CO—O— in such a way that O and/or S atoms are not linked directly to one another, and in which, in addition, one or more H atoms may be replaced by F, Cl, P or P-Sp-, an optionally substituted aryl or aryloxy group having 6 to 40 C atoms, or an optionally substituted heteroaryl or heteroaryloxy group having 2 to 40 C atoms.

Particularly preferred compounds of formula M are those in which $B^1$ and $B^2$ each, independently of one another, denote 1,4-phenylene, 1,3-phenylene, naphthalene-1,4-diyl, naphthalene-2,6-diyl, phenanthrene-2,7-diyl, 9,10-dihydrophenanthrene-2,7-diyl, anthracene-2,7-diyl, fluorene-2,7-diyl, coumarine, flavone, where, in addition, one or more CH groups in these groups may be replaced by N, cyclohexane-1,4-diyl, in which, in addition, one or more non-adjacent $CH_2$ groups may be replaced by O and/or S, 1,4-cyclohexenylene, bicyclo[1.1.1]pentane-1,3-diyl, bicyclo[2.2.2]octane-1,4-diyl, spiro[3.3]heptane-2,6-diyl, piperidine-1,4-diyl, decahydronaphthalene-2,6-diyl, 1,2,3,4-tetrahydronaphthalene-2,6-diyl, indane-2,5-diyl or octahydro-4,7-methanoindane-2,5-diyl, where all these groups may be unsubstituted or mono- or polysubstituted by L as defined above.

Very particularly preferred compounds of formula M are those in which $B^1$ and $B^2$ each, independently of one another, denote 1,4-phenylene, 1,3-phenylene, naphthalene-1,4-diyl or naphthalene-2,6-diyl.

Further preferred compounds of formula M are selected from the group consisting of the following formulae:

M1
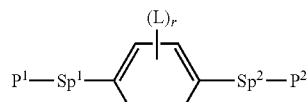

M2
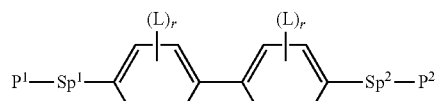

M3
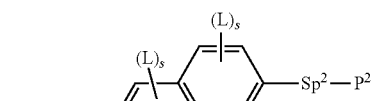

M4
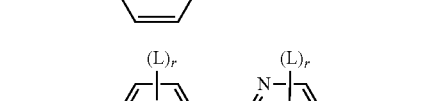

M5
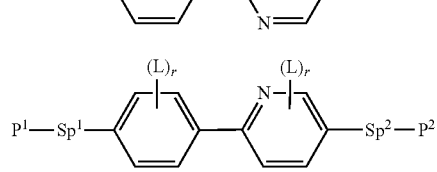

-continued

M6
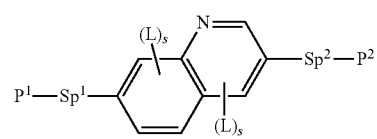

M7
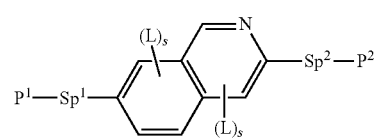

M8
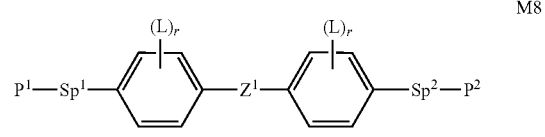

M9
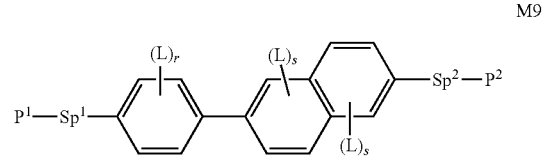

M10
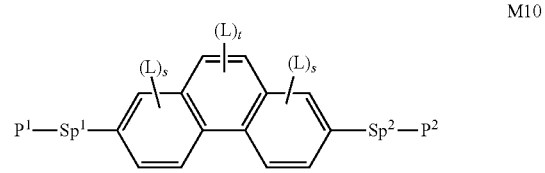

M11
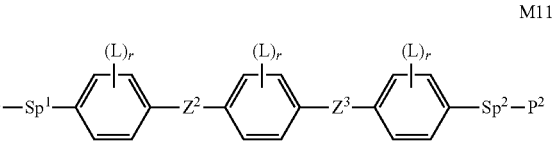

M12
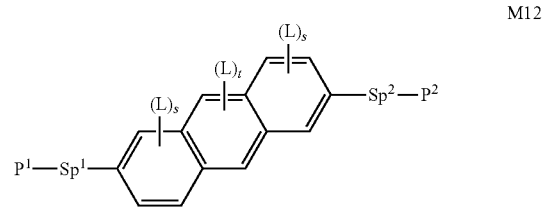

M13
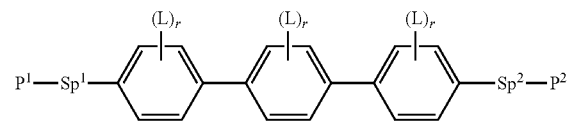

M14
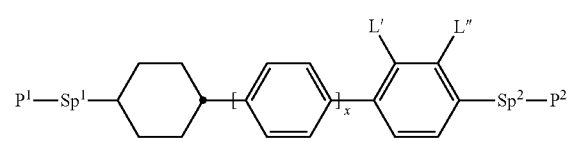

M15
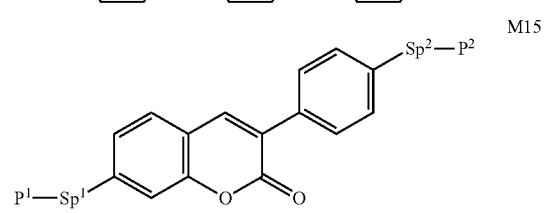

M16
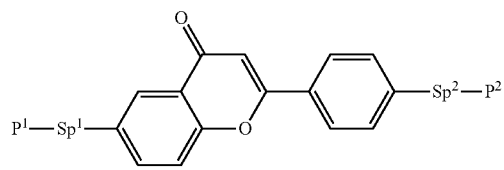
M17
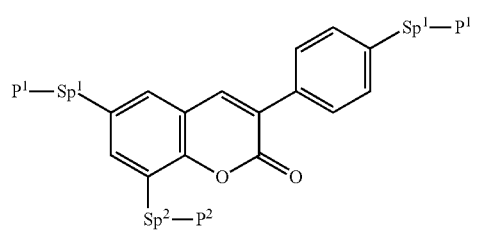
M18
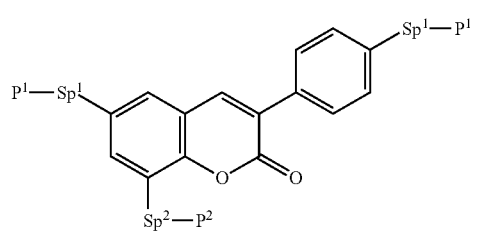
M19
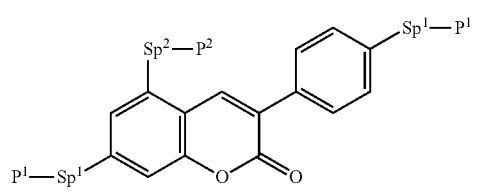
M20
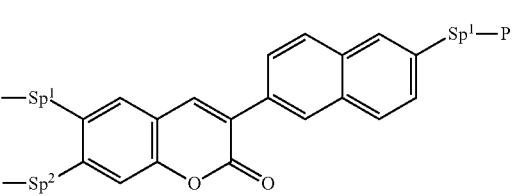
M21
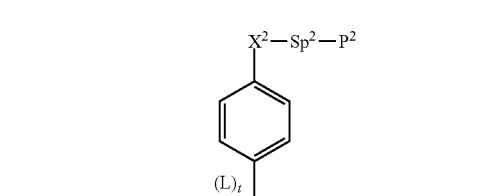
M22
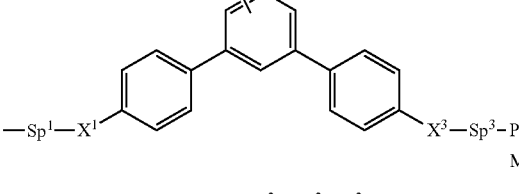
M23
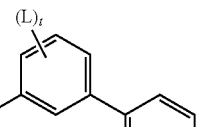
M24
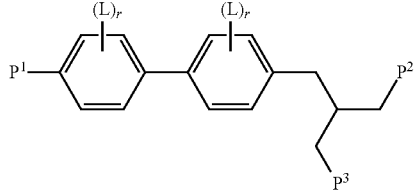
M25
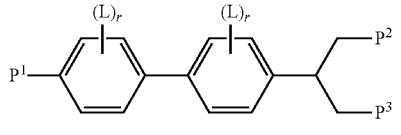
M26
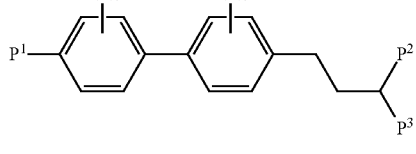
M27
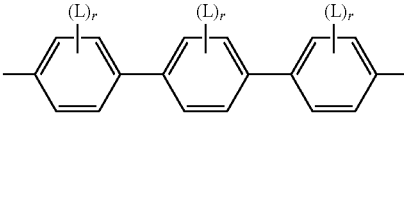
M28
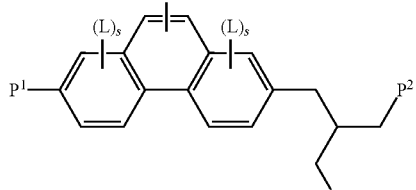
M29
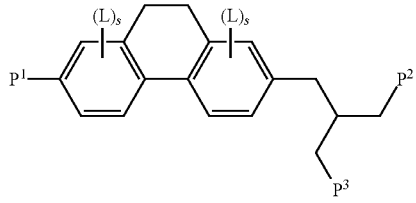
M30
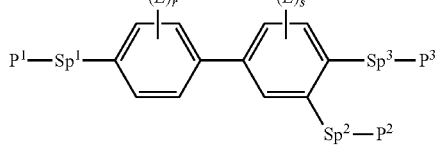

M31 in which the individual radicals, on each occurrence identically or differently, and each, independently of one another, have the following meaning:

$P^1$, $P^2$, $P^3$ a vinyloxy, acrylate, methacrylate, fluoroacrylate, chloroacrylate, oxetane or epoxy group, $Sp^1$, $Sp^2$, $Sp^3$ a single bond or a spacer group where, in addition, one or more of the radicals $P^1$-$Sp^1$-, $P^1$-$Sp^2$- and $P^3$-$Sp^3$- may denote $R^{aa}$, with the proviso that at least one of the radicals $P^1$-$Sp^1$-, $P^2$-$Sp^2$ and $P^3$-$Sp^3$- present is different from $R^{aa}$, $R^{aa}$ H, F, Cl, CN or straight-chain or branched alkyl having 1 to 25 C atoms, in which, in addition, one or more non-adjacent $CH_2$ groups may each be replaced, independently of one another, by —($R^0$)═C($R^{00}$)—, —C≡C—, —N($R^0$)—, —O—, —S—, —CO—, —CO—O—, —O—CO—, —O—CO—O— in such a way that O and/or S atoms are not linked directly to one another, and in which, in addition, one or more H atoms may be replaced by F, Cl, CN or $P^1$-$Sp^1$-, particularly preferably straight-chain or branched, optionally mono- or polyfluorinated alkyl, alkoxy, alkenyl, alkynyl, alkylcarbonyl, alkoxycarbonyl, alkylcarbonyloxy or alkoxycarbonyloxy having 1 to 12 C atoms (where the alkenyl and alkynyl radicals have at least two C atoms and the branched radicals have at least three C atoms), $R^0$, $R^{00}$ H or alkyl having 1 to 12 C atoms, $R^y$ and $R^z$ H, F, $CH_3$ or $CF_3$, $X^1$, $X^2$, $X^3$ —CO—O—, —O—CO— or a single bond, $Z^1$ —O—, —CO—, —C($R^y R^z$)— or —$CF_2CF_2$—, $Z^2$, $Z^3$ —CO—O—, —O—CO—, —$CH_2$O—, —O$CH_2$—, —$CF_2$O—, —O$CF_2$— or —$(CH_2)_{n11}$—, where n11 is 2, 3 or 4, L F, Cl, CN or straight-chain or branched, optionally mono- or polyfluorinated alkyl, alkoxy, alkenyl, alkynyl, alkylcarbonyl, alkoxycarbonyl, alkylcarbonyloxy or alkoxycarbonyloxy having 1 to 12 C atoms, L', L" H, F or Cl, r 0, 1, 2, 3 or 4, s 0, 1, 2 or 3, t 0, 1 or 2, x 0 or 1.

Especially preferred are direactive compounds of formulae M1 to M14, in particular those of formula M2 and M13.

Further preferred are trireactive compounds M15 to M30, in particular those of formula M17, M18, M19, M22, M23, M24, M25, M26, M30 and M31.

In the compounds of formulae M1 to M31 the group is preferably wherein L on each occurrence, identically or differently, has one of the meanings given above or below, and is preferably F, Cl, CN, $NO_2$, $CH_3$, $C_2H_5$, $C(CH_3)_3$, $CH(CH_3)_2$, $CH_2CH(CH_3)C_2H_5$, $OCH_3$, $OC_2H_5$, $COCH_3$, $COC_2H_5$, $COOCH_3$, $COOC_2H_5$, $CF_3$, $OCF_3$, $OCHF_2$, $OC_2F_5$ or P-Sp-, very preferably F, Cl, CN, $CH_3$, $C_2H_5$, $OCH_3$, $COCH_3$, $OCF_3$ or P-Sp-, more preferably F, Cl, $CH_3$, $OCH_3$, $COCH_3$ oder $OCF_3$, especially F or $CH_3$.

Preferred compounds of formulae M1 to M31 are those wherein $P^1$, $P^2$ and $P^3$ denote an acrylate, methacrylate, oxetane or epoxy group, very preferably an acrylate or methacrylate group.

Further preferred compounds of formulae M1 to M31 are those wherein $Sp^1$, $Sp^2$ and $Sp^3$ are a single bond.

Further preferred compounds of formulae M1 to M31 are those wherein one of $Sp^1$, $Sp^2$ and $Sp^3$ is a single bond and another one of $Sp^1$, $Sp^2$ and $Sp^3$ is different from a single bond.

Further preferred compounds of formulae M1 to M31 are those wherein those groups $Sp^1$, $Sp^2$ and $Sp^3$ that are different from a single bond denote —$(CH_2)_{s1}$—X"—, wherein s1 is an integer from 1 to 6, preferably 2, 3, 4 or 5, and X" is X" is the linkage to the benzene ring and is —O—, —O—CO—, —CO—O, —O—CO—O— or a single bond.

Particular preference is given to LC media comprising one, two or three polymerisable compounds of formula M.

Preferably the proportion of polymerisable compounds of formula M in the LC medium is from 0.01 to 5%, very preferably from 0.05 to 1%, most preferably from 0.1 to 0.5%.

Besides the polymerisable component A) as described above, the LC medium according to the present invention comprises an LC component B), or LC host mixture, comprising one or more, preferably two or more LC compounds which are selected from low-molecular-weight compounds that are unpolymerisable, and at least one of which is selected of formula A and B. These LC compounds are selected such that they stable and/or unreactive to a polymerisation reaction under the conditions applied to the polymerisation of the polymerisable compounds.

Examples of such compounds are the compounds of formula A and B above and below and the compounds of formulae C-G below.

Preference is given to LC media in which the LC component B), or the LC host mixture, has a nematic LC phase, and preferably has no chiral liquid crystal phase. The LC component B), or LC host mixture, is preferably a nematic LC mixture. Further preferably the LC component B) or LC host mixture, and the LC medium have a positive dielectric anisotropy Δε.

Preference is furthermore given to achiral polymerisable compounds, and to LC media in which the compounds of component A) and/or B) are selected exclusively from the group consisting of achiral compounds.

Preferably the proportion of the LC component B) in the LC medium is from 70 to 95% by weight.

The LC media and LC host mixtures of the present invention preferably have a nematic phase range ≥80 K, very preferably ≥100 K, and preferably a rotational viscosity ≤250 mPa·s, very preferably ≤200 mPa·s, at 20° C.

The birefringence Δn of LC media and LC host mixtures according to the invention is preferably preferably from 0.07 to 0.15, particularly preferably from 0.08 to 0.21.

The LC media and LC host mixtures according to the invention preferably have a positive dielectric anisotropy Δε from +2 to +30, particularly preferably from +3 to +20, at 20° C. and 1 kHz.

In the compounds of formula A and B, $X^0$ is preferably F, Cl, $CF_3$, $CHF_2$, $OCF_3$, $OCHF_2$, $OCFHCF_3$, $OCFHCHF_2$, $OCFHCHF_2$, $OCF_2CH_3$, $OCF_2CHF_2$, $OCF_2CHF_2$, $OCF_2CF_2CHF_2$, $OCF_2CF_2CHF_2$, $OCFHCF_2CF_3$, $OCFHCF_2CHF_2$, $OCF_2CF_2CF_3$, $OCF_2CF_2CClF_2$, $OCClFCF_2CF_3$ or $CH=CF_2$, very preferably F or $OCF_3$, most preferably F.

In the compounds of formula A and B, $R^{21}$ and $R^{31}$ are preferably selected from straight-chain alkyl or alkoxy with 1, 2, 3, 4, 5 or 6 C atoms, and straight-chain alkenyl with 2, 3, 4, 5, 6 or 7 C atoms.

In the compounds of formula A and B, g is preferably 1 or 2.

In the compounds of formula B, $Z^{31}$ is preferably COO, trans-CH=CH or a single bond, very preferably COO or a single bond.

Preferably component B) of the LC medium comprises one or more compounds of formula A selected from the group consisting of the following formulae:

in which $A^{21}$, $R^{21}$, $X^0$, $L^{21}$ and $L^{22}$ have the meanings given in formula A, $L^{23}$ and $L^{24}$ each, independently of one another, are H or F, and $X^0$ is preferably F. Particularly preferred are compounds of formulae A1 and A2.

Particularly preferred compounds of formula A1 are selected from the group consisting of the following subformulae:

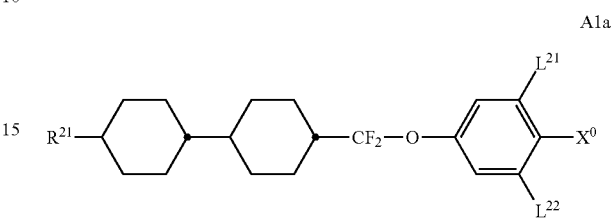

A1a

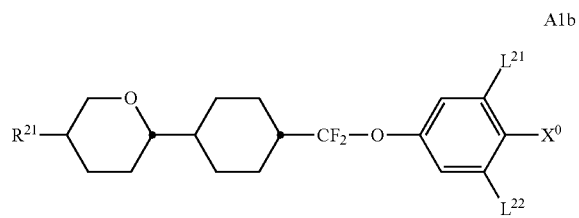

A1b

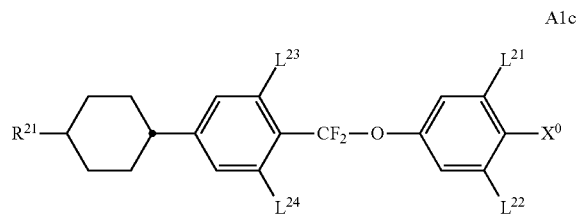

A1c

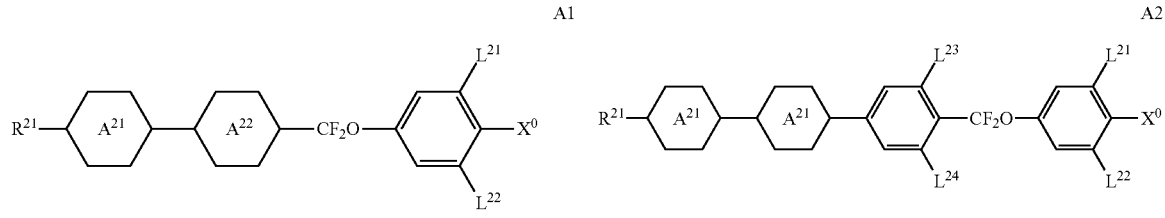

A1

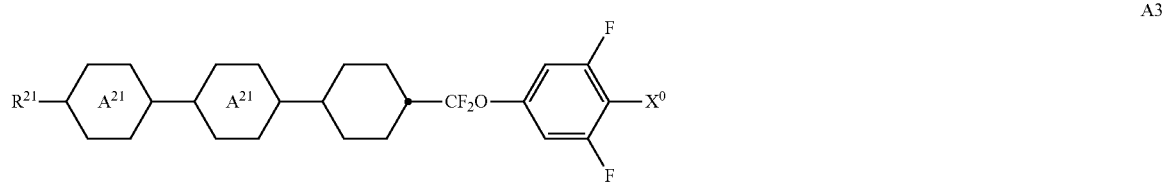

A2

A3

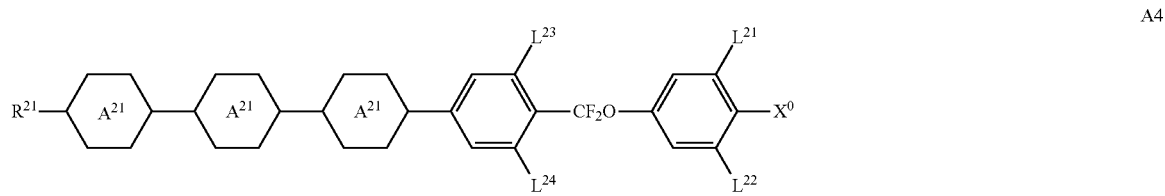

A4

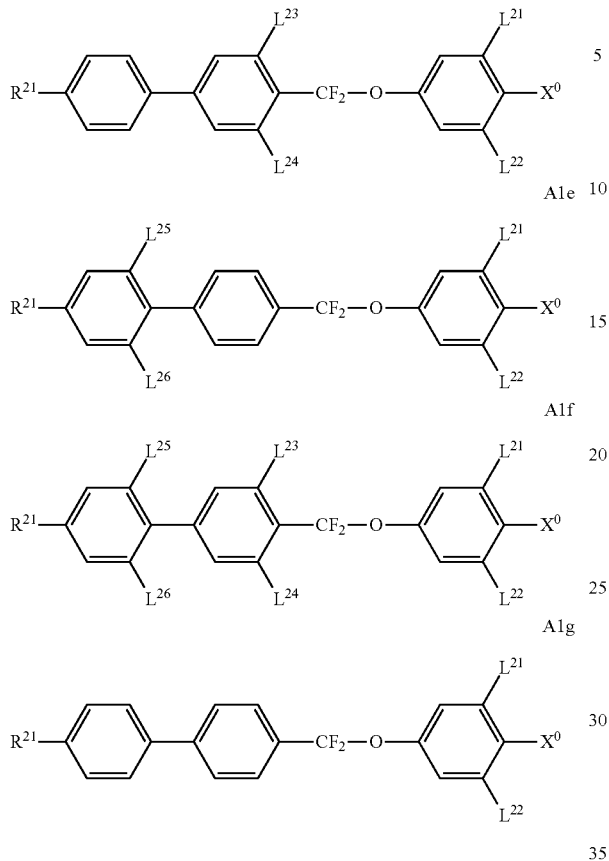

in which $R^{21}$, $X^0$, $L^{21}$ and $L^{22}$ have the meaning given in formula A1, $L^{23}$, $L^{24}$, $L^{25}$ and $L^{26}$ are each, independently of one another, H or F, and $X^0$ is preferably F.

Very particularly preferred compounds of formula A1 are selected from the group consisting of the following subformulae:

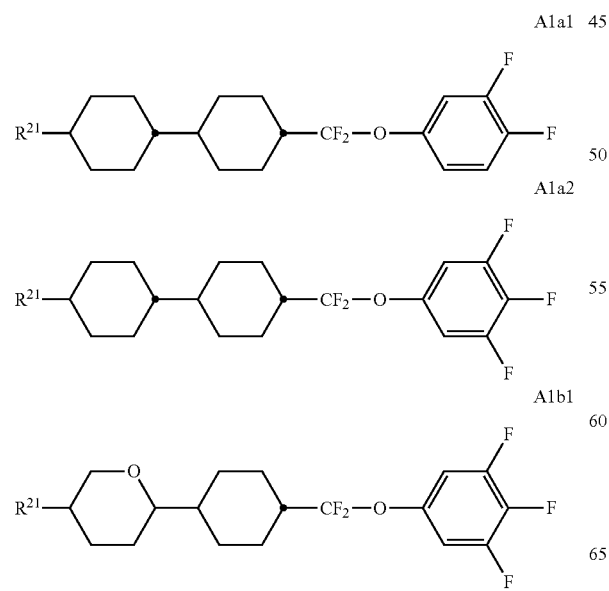

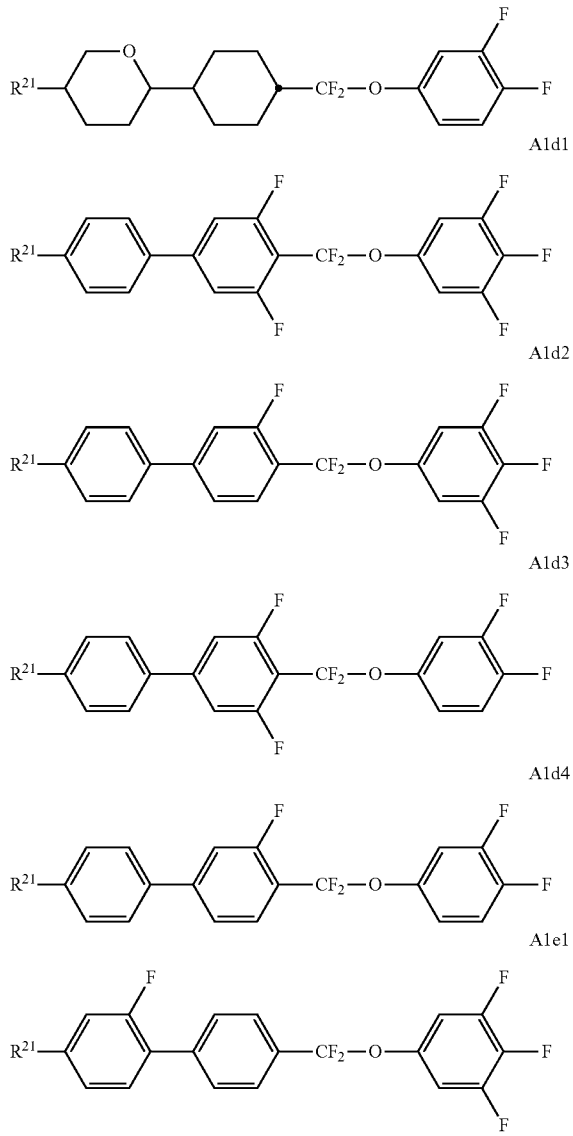

in which $R^{21}$ is as defined in formula A1.

Particularly preferred compounds of formula A2 are selected from the group consisting of the following subformulae:

in which $R^{21}$, $X^0$, $L^{21}$ and $L^{22}$ have the meaning given in formula A2, $L^{23}$, $L^{24}$, $L^{25}$ and $L^{26}$ each, independently of one another, are H or F, and $X^0$ is preferably F.

Very particularly preferred compounds of formula A2 are selected from the group consisting of the following subformulae:

A2i1
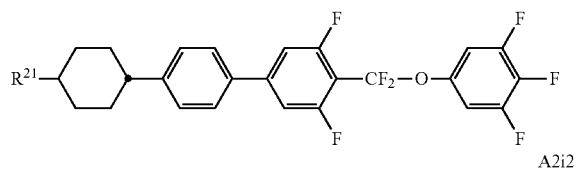

A2i2
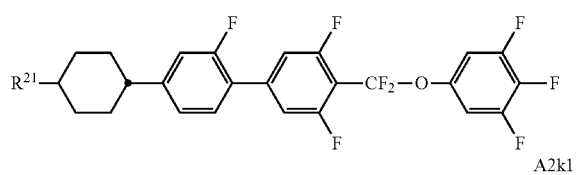

A2k1
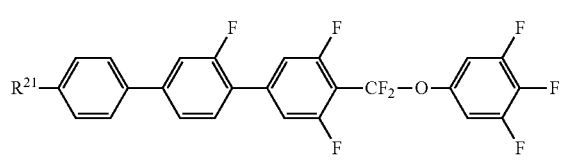

A2k2
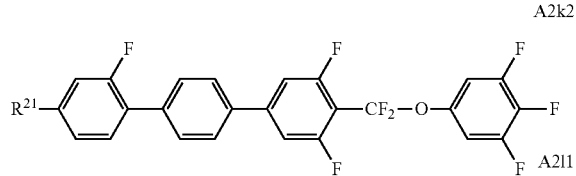

A2l1
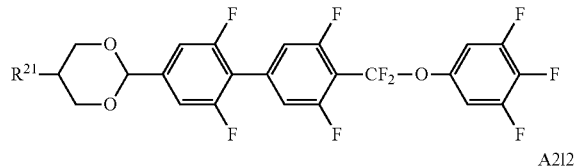

A2l2
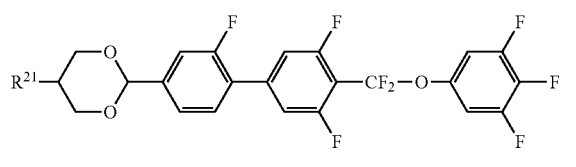

in which $R^{21}$ and $X^0$ are as defined in formula A2.

Particularly preferred compounds of formula A3 are selected from the group consisting of the following subformulae:

A3a
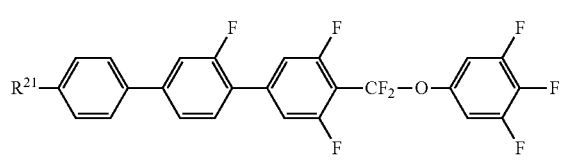

A3b
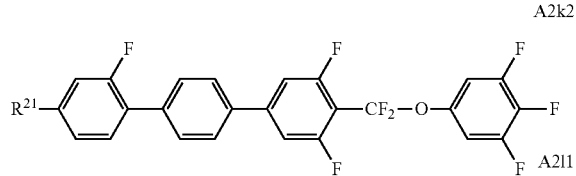

A3c
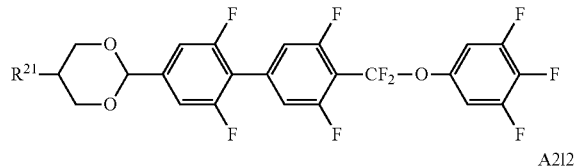

in which $R^{21}$, $X^0$, $L^{21}$ and $L^{22}$ have the meaning given in formula A3, and $X^0$ is preferably F.

Particularly preferred compounds of formula A4 are selected from the group consisting of the following subformulae:

A4a
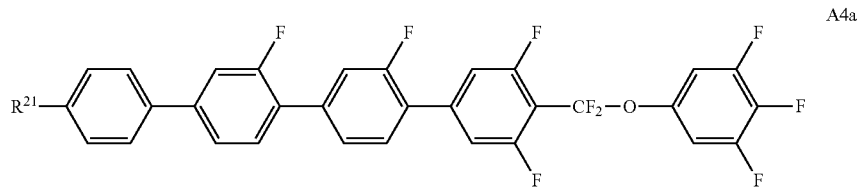

in which $R^{21}$ is as defined in formula A4.

Preferably component B) of the LC medium comprises one or more compounds of formula B selected from the group consisting of the following formulae:

B1
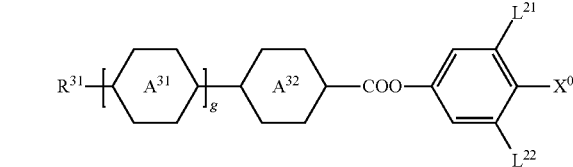

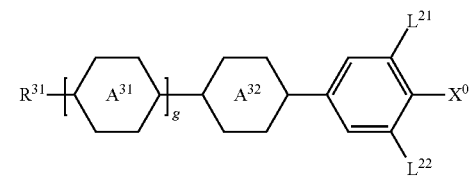
B2

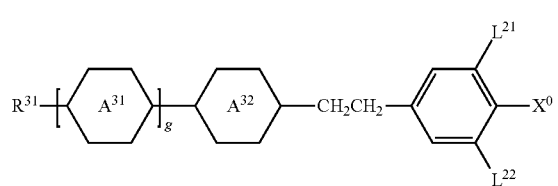
B3 in which g, $A^{31}$, $A^{32}$, $R^{31}$, $X^0$, $L^{31}$ and $L^{32}$ have the meanings given in formula B, and $X^0$ is preferably F. Particularly preferred are compounds of formulae B1 and B2.

Particularly preferred compounds of formula B1 are selected from the group consisting of the following subformulae:

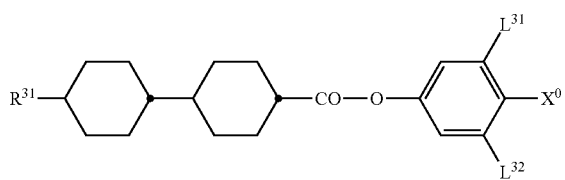
B1a

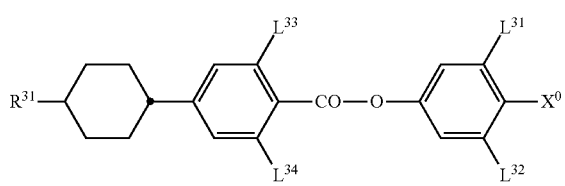
B1b in which $R^{31}$, $X^0$, $L^{31}$ and $L^{32}$ have the meaning given in formula B1, and $X^0$ is preferably F.

Very particularly preferred compounds of formula B1a are selected from the group consisting of the following subformulae:

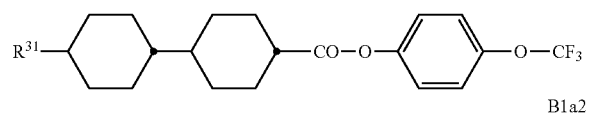
B1a1

B1a2

B1a3

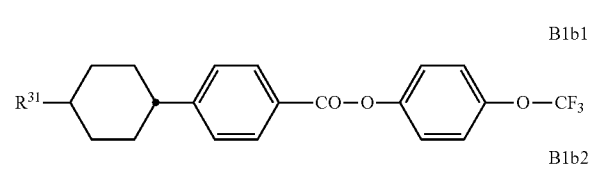
B1a4

B1a5

B1a6 in which $R^{31}$ is as defined in formula B1.

Very particularly preferred compounds of formula B1 b are selected from the group consisting of the following subformulae:

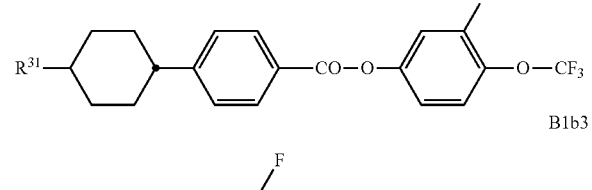
B1b1

B1b2

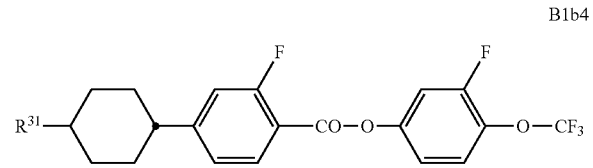
B1b3

B1b4 in which $R^{31}$ is as defined in formula B1.

Particularly preferred compounds of formula B2 are selected from the group consisting of the following subformulae:

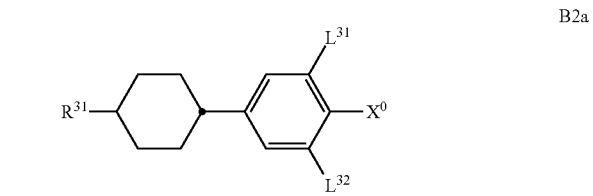
B2a

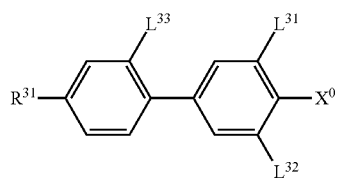 B2b

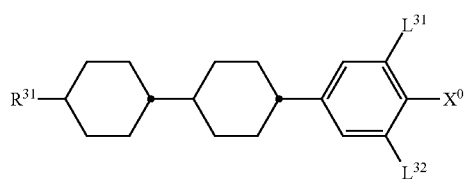 B2c

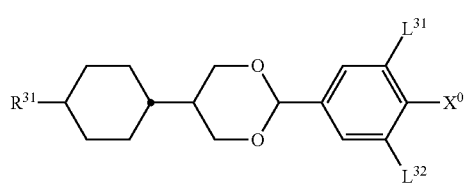 B2d

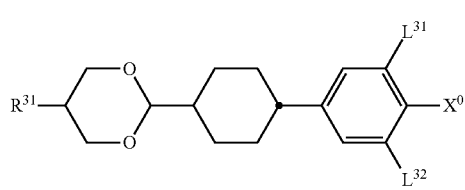 B2e

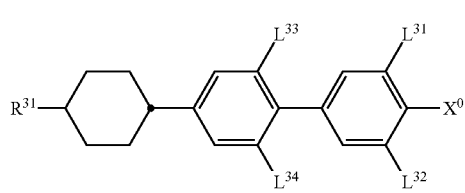 B2f

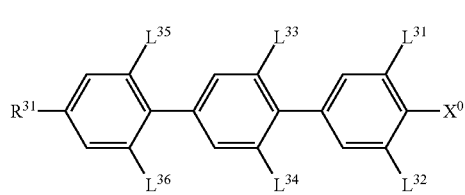 B2g

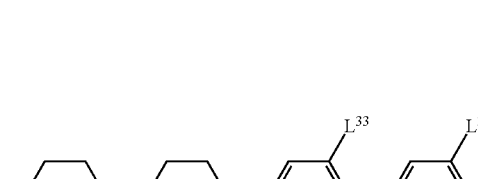 B2h

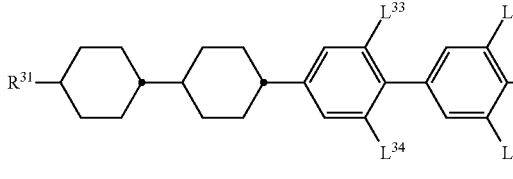 B2i

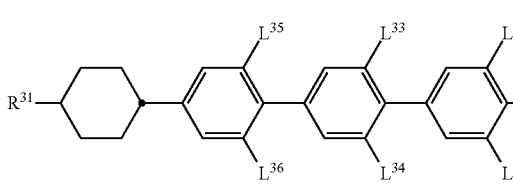

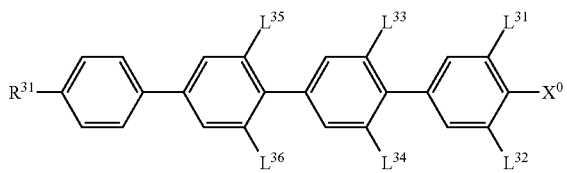 B2k

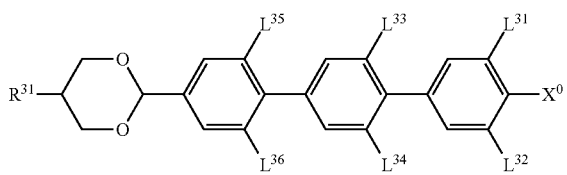 B2l in which $R^{31}$, $X^0$, $L^{31}$ and $L^{32}$ have the meaning given in formula B2, $L^{33}$, $L^{34}$, $L^{35}$ and $L^{36}$ are each, independently of one another, H or F, and $X^0$ is preferably F.

Very particularly preferred compounds of formula B2 are selected from the group consisting of the following subformulae:

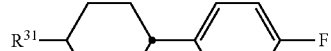 B2a1

 B2a2

 B2a3

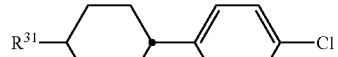 B2a4

 B2a5 in which $R^{31}$ is as defined in formula B2.

Very particularly preferred compounds of formula B2b are selected from the group consisting of the following subformulae

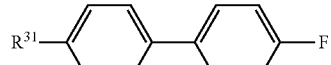 B2b1

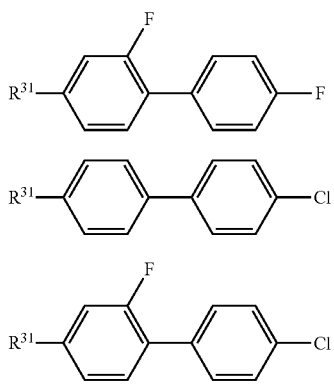

in which R³¹ is as defined in formula B2.

Very particularly preferred compounds of formula B2c are selected from the group consisting of the following subformulae:

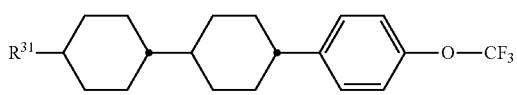
B2c1

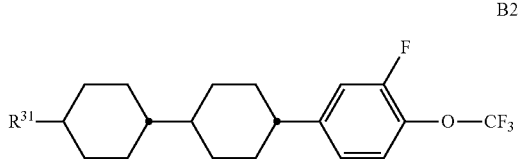
B2c2

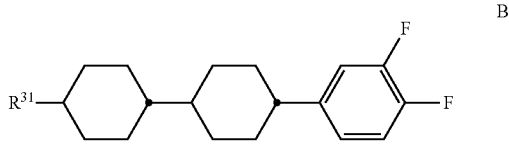
B2c3

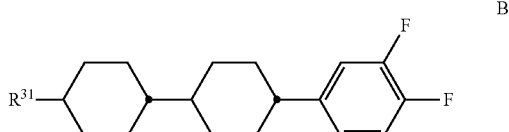
B2c4

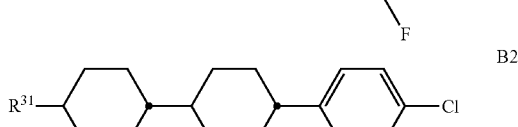
B2c5 in which R³¹ is as defined in formula B2.

Very particularly preferred compounds of formula B2d and B2e are selected from the group consisting of the following subformulae:

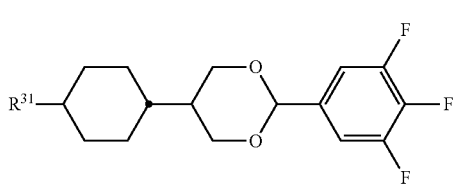
B2d1

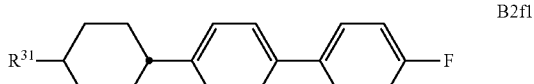
B2e1 in which R³¹ is as defined in formula B2.

Very particularly preferred compounds of formula B2f are selected from the group consisting of the following subformulae:

B2f1

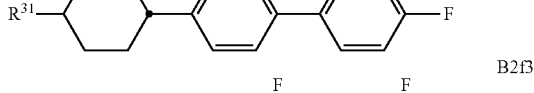
B2f2

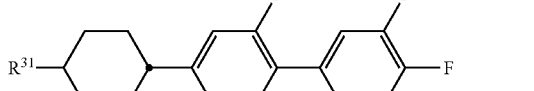
B2f3

B2f4

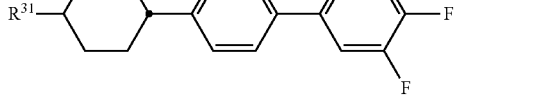
B2f5 in which R³¹ is as defined in formula B2.

Very particularly preferred compounds of formula B2g are selected from the group consisting of the following subformulae:

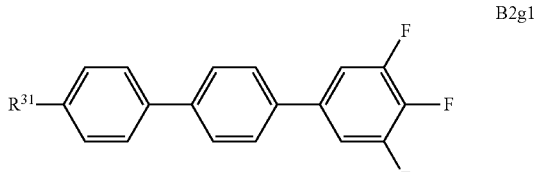
B2g1

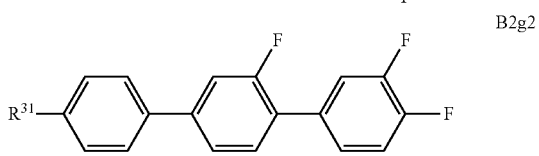
B2g2

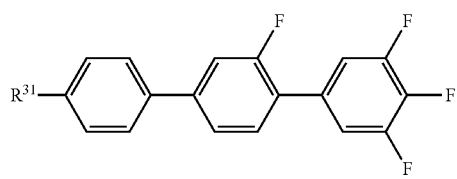

B2g3

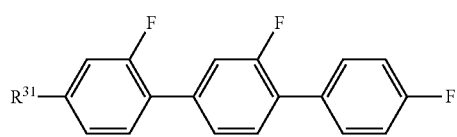

B2g4

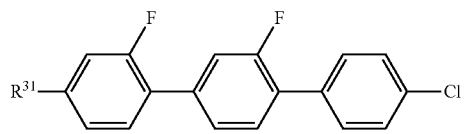

B2g5 in which R³¹ is as defined in formula B2.

Very particularly preferred compounds of formula B2h are selected from the group consisting of the following subformulae:

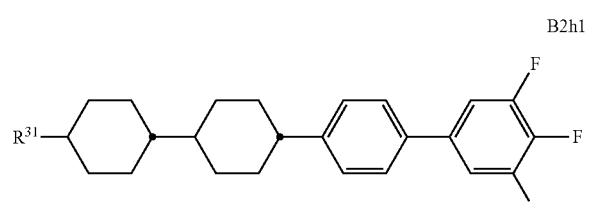

B2h1

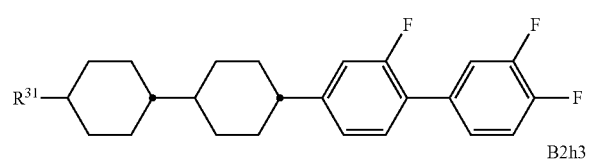

B2h2

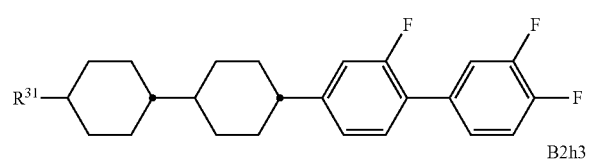

B2h3

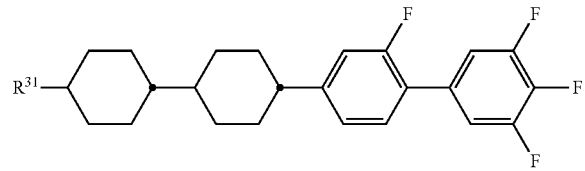

in which R³¹ is as defined in formula B2.

Very particularly preferred compounds of formula B2i are selected from the group consisting of the following subformulae:

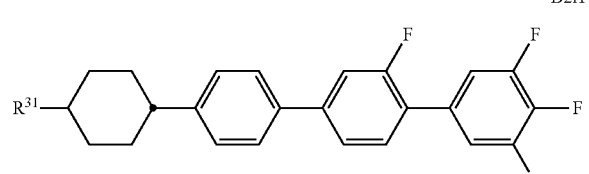

B2i1

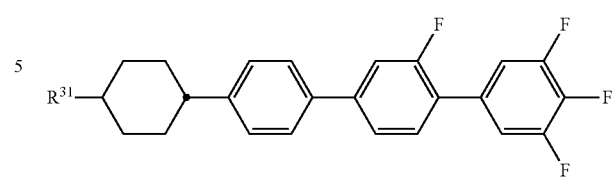

B2i2 in which R³¹ is as defined in formula B2.

Very particularly preferred compounds of formula B2k are selected from the group consisting of the following subformulae:

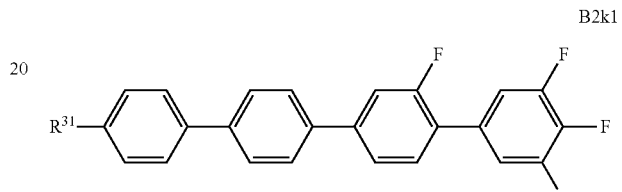

B2k1

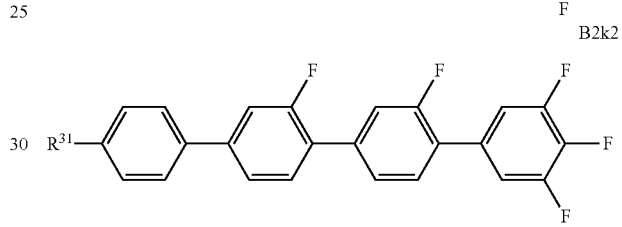

B2k2 in which R³¹ is as defined in formula B2.

Very particularly preferred compounds of formula B2k are selected from the group consisting of the following subformulae:

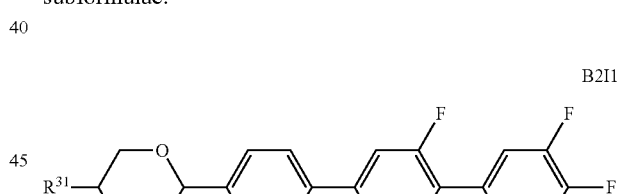

B2l1

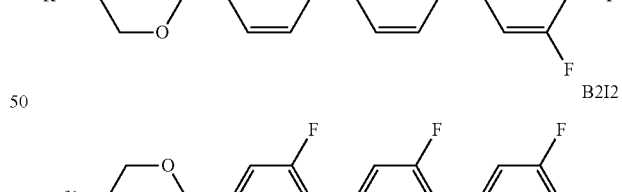

B2l2 in which R³¹ is as defined in formula B2.

Alternatively to, or in addition to, the compounds of formula B1 and/or B2 component B) of the LC medium may also comprise one or more compounds of formula B3 as defined above.

Particularly preferred compounds of formula B3 are selected from the group consisting of the following subformulae:

B3a

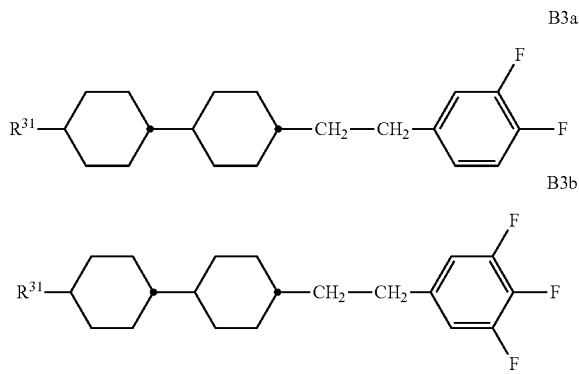

B3b in which $R^{31}$ is as defined in formula B3.

Preferably component B) of the LC medium comprises, in addition to the compounds of formula A and/or B, one or more compounds of formula C

C

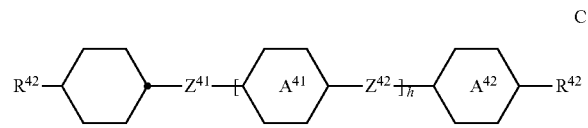

in which the individual radicals have the following meanings:

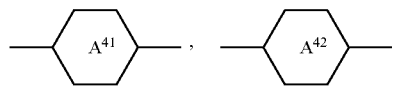

each, independently of one another, and on each occurrence, identically or differently

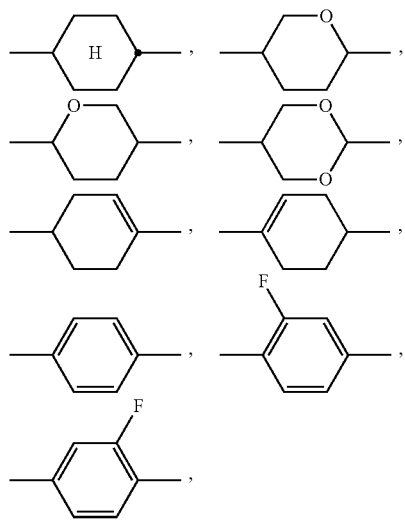

$R^{41}$, $R^{42}$ each, independently of one another, alkyl, alkoxy, oxaalkyl or alkoxyalkyl having 1 to 9 C atoms or alkenyl or alkenyloxy having 2 to 9 C atoms, all of which are optionally fluorinated, $Z^{41}$, $Z^{42}$ each, independently of one another, —CH$_2$CH$_2$—, —COO—, trans-CH=CH—, trans-CF=CF—, —CH$_2$O—, —CF$_2$O—, —C≡C— or a single bond, preferably a single bond, h 0, 1, 2 or 3.

In the compounds of formula C, $R^{41}$ and $R^{42}$ are preferably selected from straight-chain alkyl or alkoxy with 1, 2, 3, 4, 5 or 6 C atoms, and straight-chain alkenyl with 2, 3, 4, 5, 6 or 7 C atoms.

In the compounds of formula C, h is preferably 0, 1 or 2.

In the compounds of formula C, $Z^{41}$ and $Z^{42}$ are preferably selected from COO, trans-CH=CH and a single bond, very preferably from COO and a single bond.

Preferred compounds of formula C are selected from the group consisting of the following subformulae:

C1
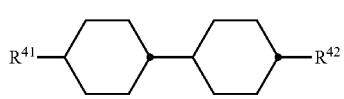

C2
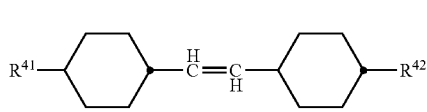

C3

C4
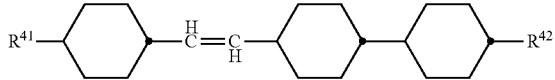

C5
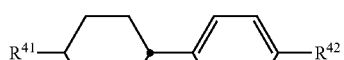

C6
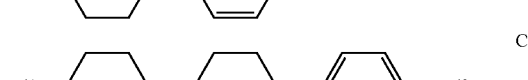

C7
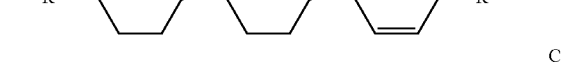

C8
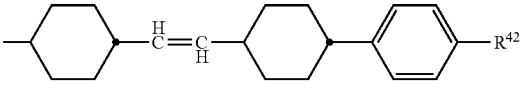

C9
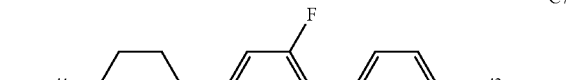

C10
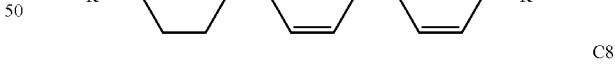

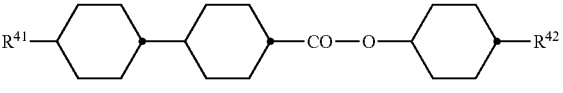

-continued

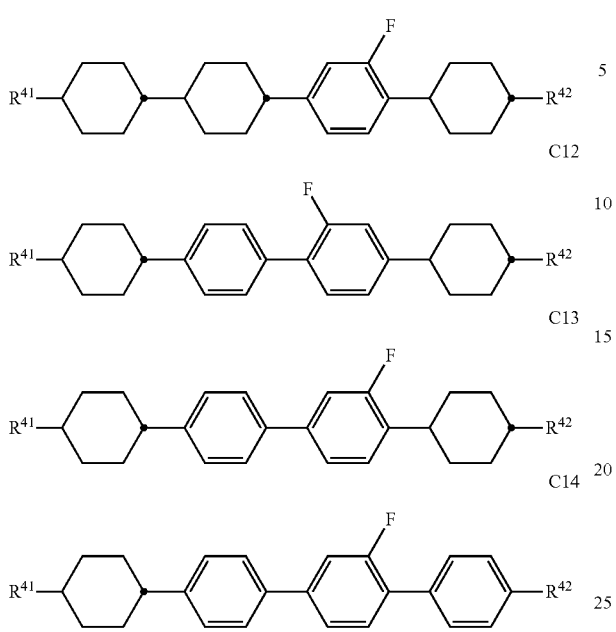

C11

C12

C13

C14 wherein $R^{41}$ and $R^{42}$ have the meanings given in formula C, and preferably denote each, independently of one another, alkyl, alkoxy, fluorinated alkyl or fluorinated alkoxy with 1 to 7 C atoms, or alkenyl, alkenyloxy, alkoxyalkyl or fluorinated alkenyl with 2 to 7 C atoms.

In another preferred embodiment of the present invention component B) of the LC medium comprises, in addition to the compounds of formula A and/or B, one or more compounds of formula D

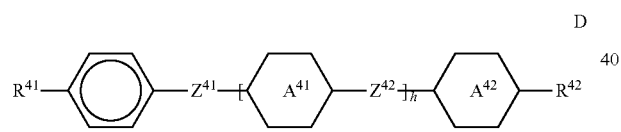

D in which $A^{41}$, $A^{42}$, $Z^{41}$, $Z^{42}$, $R^{41}$, $R^{42}$ and h have the meanings given in formula C or one of the preferred meanings given above.

Preferred compounds of formula D are selected from the group consisting of the following subformulae:

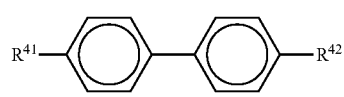

D1

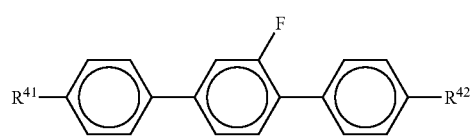

D2 in which $R^{41}$ and $R^{42}$ have the meanings given in formula D and $R^{41}$ preferably denotes alkyl bedeutet, and in formula D1 $R^{42}$ preferably denotes alkenyl, particularly preferably —(CH$_2$)$_2$—CH=CH—CH$_3$, and in formula D2 $R^{42}$ preferably denotes alkyl, —(CH$_2$)$_2$—CH=CH$_2$ or —(CH$_2$)$_2$—CH=CH—CH$_3$.

In another preferred embodiment of the present invention component B) of the LC medium comprises, in addition to the compounds of formula A and/or B, one or more compounds of formula E containing an alkenyl group

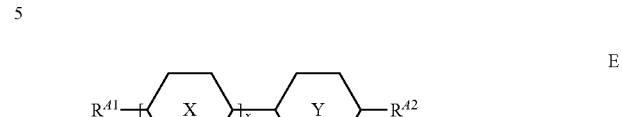

E in which the individual radicals, on each occurrence identically or differently, each, independently of one another, have the following meaning:

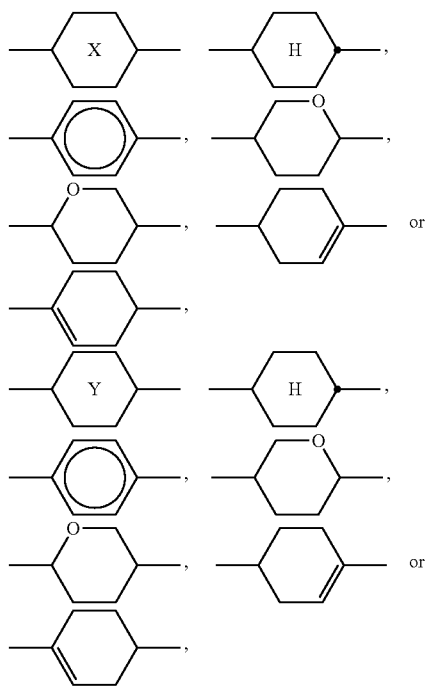

$R^{A1}$ alkenyl having 2 to 9 C atoms or, if at least one of the rings X, Y and Z denotes cyclohexenyl, also one of the meanings of $R^{A2}$, $R^{A2}$ alkyl having 1 to 12 C atoms, in which, in addition, one or two non-adjacent CH$_2$ groups may be replaced by —O—, —CH=CH—, —CO—, —OCO— or —COO— in such a way that O atoms are not linked directly to one another, x 1 or 2.

$R^{A2}$ is preferably straight-chain alkyl or alkoxy having 1 to 8 C atoms or straight-chain alkenyl having 2 to 7 C atoms.

Preferred compounds of formula E are selected from the following subformulae:

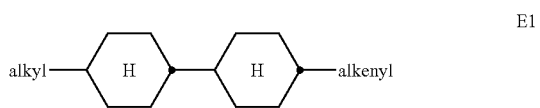

E1

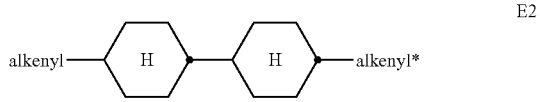

E2

-continued

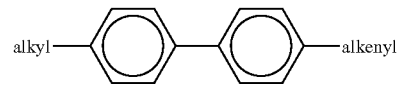

E3

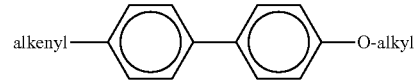

E4

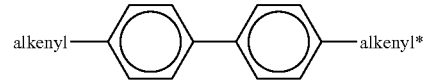

E5

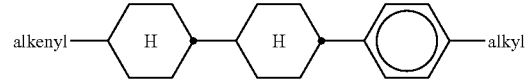

E6

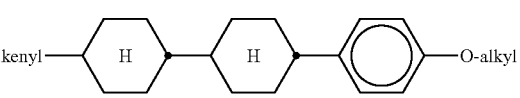

E7

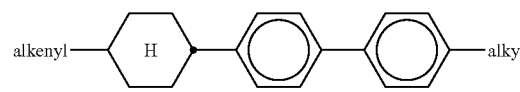

E8

E9

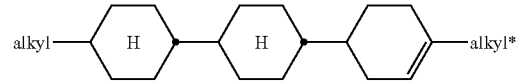

E10

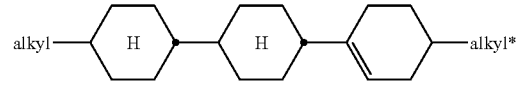

E11

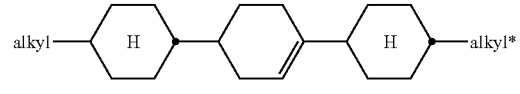

E12 in which alkyl and alkyl* each, independently of one another, denote a straight-chain alkyl radical having 1-6 C atoms, and alkenyl and alkenyl* each, independently of one another, denote a straight-chain alkenyl radical having 2-7 C atoms. Alkenyl and alkenyl* preferably denote CH$_2$=CH—, CH$_2$=CHCH$_2$CH$_2$—, CH$_3$—CH=CH—, CH$_3$—CH$_2$—CH=CH—, CH$_3$—(CH$_2$)$_2$—CH=CH—, CH$_3$—(CH$_2$)$_3$—CH=CH— or CH$_3$—CH=CH—(CH$_2$)$_2$—.

Very preferred compounds of the formula E are selected from the following sub-formulae:

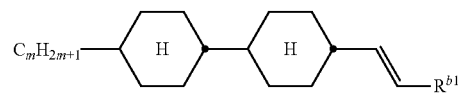

E1a

-continued

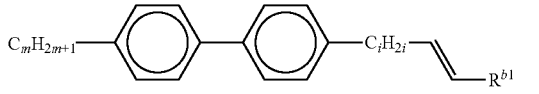

E3a

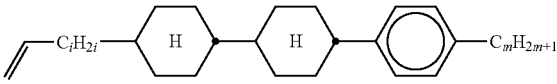

E6a in which m denotes 1, 2, 3, 4, 5 or 6, i denotes 0, 1, 2 or 3, and $R^{b}1$ denotes H, CH$_3$ or C$_2$H$_5$.

Very particularly preferred compounds of the formula E are selected from the following sub-formulae:

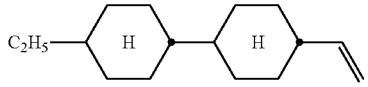

E1a1

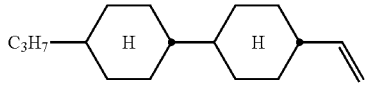

E1a2

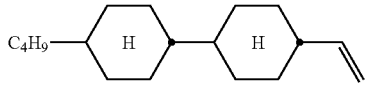

E1a3

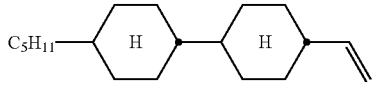

E1a4

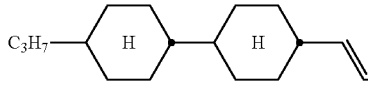

E1a5

E3a1

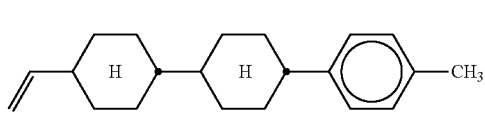

E6a1

Most preferred are compounds of formula E1a2, E1a5, E3a1 and E6a1.

In another preferred embodiment of the present invention component B) of the LC medium comprises, in addition to the compounds of formula A and/or B, one or more compounds of formula F

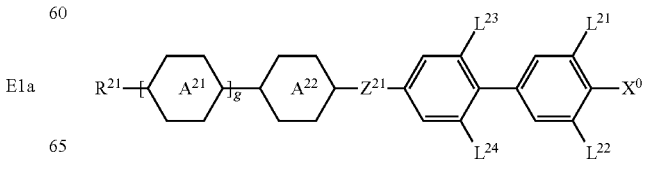

F in which the individual radicals have, independently of each other and on each occurrence identically or differently, the following meanings:

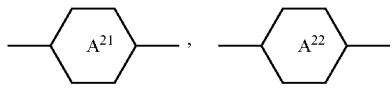

denote

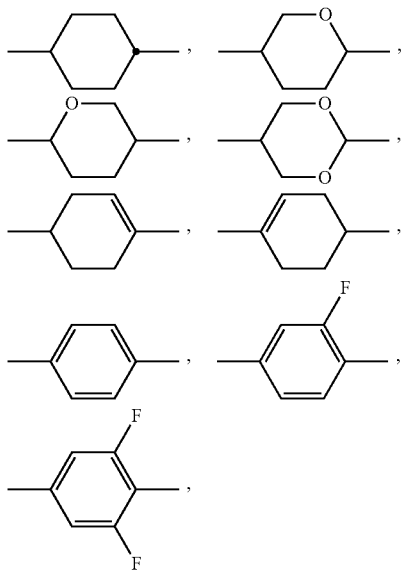

$R^{21}$, $R^{31}$ each, independently of one another, alkyl, alkoxy, oxaalkyl or alkoxyalkyl having 1 to 9 C atoms or alkenyl or alkenyloxy having 2 to 9 C atoms, all of which are optionally fluorinated, $X^0$ F, Cl, halogenated alkyl or alkoxy having 1 to 6 C atoms or halogenated alkenyl or alkenyloxy having 2 to 6 C atoms, $Z^{21}$ —CH$_2$CH$_2$—, —CF$_2$CF$_2$—, —COO—, trans-CH=CH—, trans-CF=CF—, —CH$_2$O— or a single bond, preferably —CH$_2$CH$_2$—, —COO—, trans-CH=CH— or a single bond, particularly preferably —COO—, trans-CH=CH— or a single bond, $L^{21}$, $L^{22}$, $L^{23}$, $L^{24}$ each, independently of one another, H or F, g 0, 1, 2 or 3.

Particularly preferred compounds of formula F are selected from the group consisting of the following formulae:

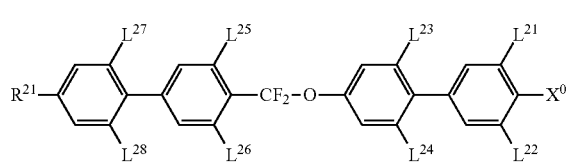

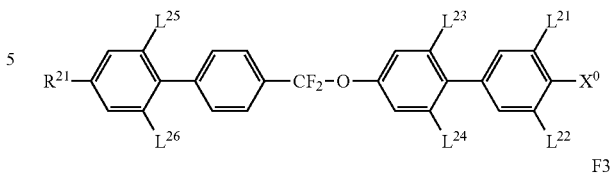

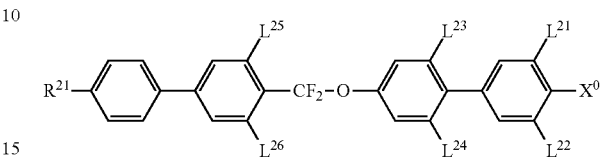

in which $R^{21}$, $X^0$, $L^{21}$ and $L^{22}$ have the meaning given in formula F, $L^{25}$, $L^{26}$, $L^{27}$ and $L^{28}$ are each, independently of one another, H or F, and $X^0$ is preferably F.

Very particularly preferred compounds of formula F1-F3 are selected from the group consisting of the following subformulae:

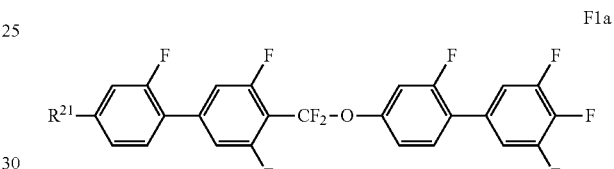

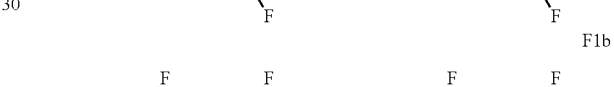

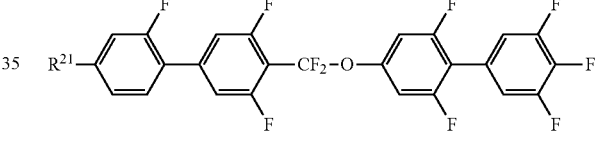

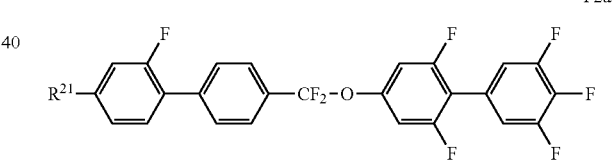

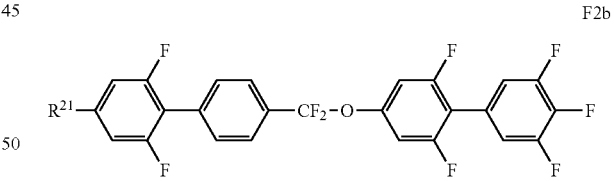

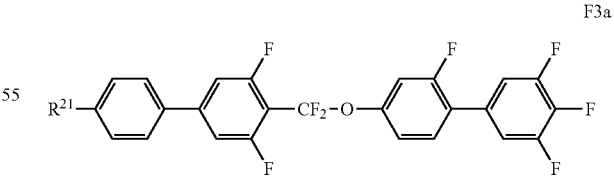

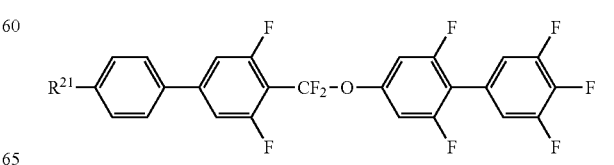

in which $R^{21}$ is as defined in formula F1.

In another preferred embodiment of the present invention component B) of the LC medium comprises, in addition to the compounds of formula A and/or B, one or more compounds of formula G containing a cyano group.

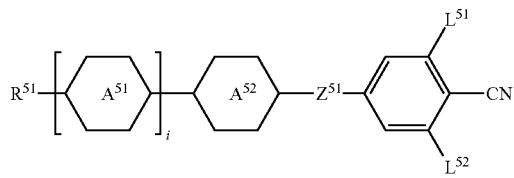

G in which the individual radicals have the following meanings:

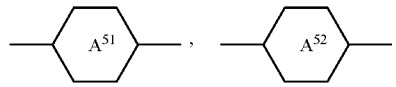

each, independently of one another, and on each occurrence, identically or differently

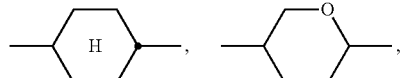

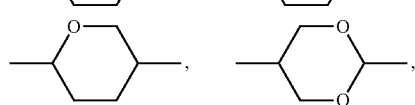

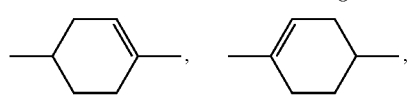

$R^{51}$, $R^{52}$ each, independently of one another, alkyl, alkoxy, oxaalkyl or alkoxyalkyl having 1 to 9 C atoms or alkenyl or alkenyloxy having 2 to 9 C atoms, all of which are optionally fluorinated, $Z^{51}$, $Z^{52}$ —CH$_2$CH$_2$—, —COO—, trans-CH=CH—, trans-CF=CF—, —CH$_2$O—, —CF$_2$O—, —C≡C— or a single bond, preferably a single bond, $L^{51}$, $L^{52}$ each, independently of one another, H or F, i 0, 1, 2 or 3.

Preferred compounds of formula G are selected from the following subformulae

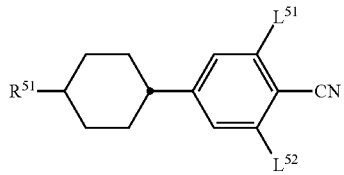

G1

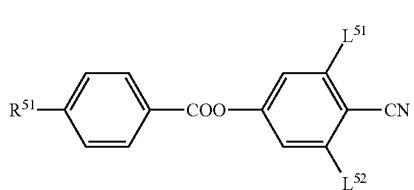

G2

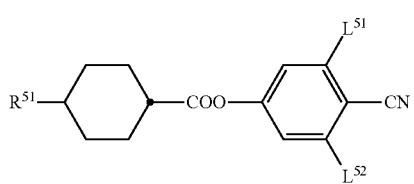

G3

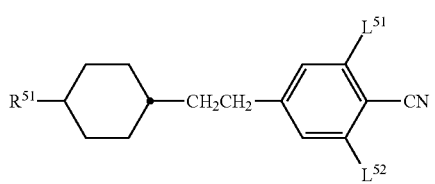

G4

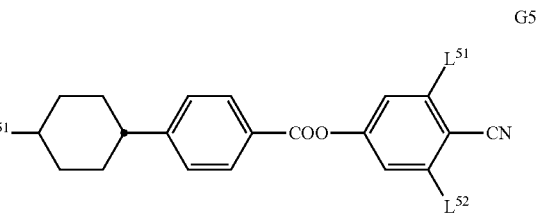

G5

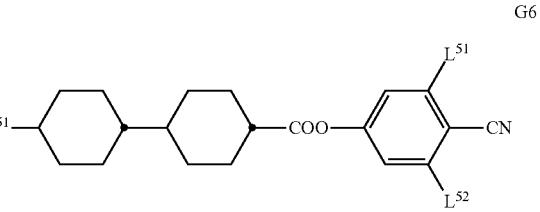

G6

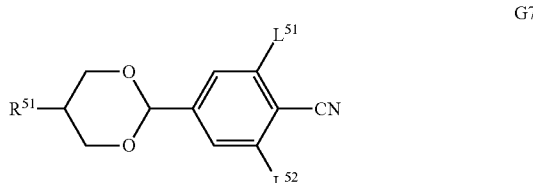

G7

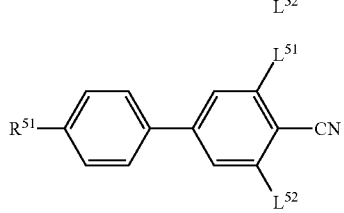

G8

-continued

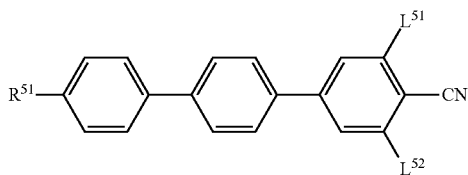
G9 in which $R^{51}$ is as defined in formula G and $L^1$ and $L^2$ are each, independently of one another, H or F.

Very preferred are compounds of formula G1, G2 and G5.

Preferred compounds of formula G1-G9 are those wherein $L^{51}$ and $L^{52}$ are F.

Further preferred compounds of formula G1-G7 are those wherein $L^{51}$ is F and $L^{52}$ is H.

Very preferred compounds of formula G are selected from the group consisting of the following subformulae:

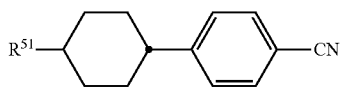
G1a

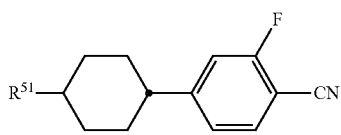
G1b

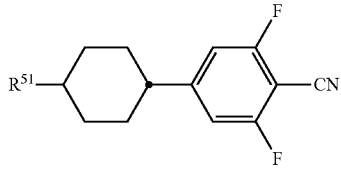
G1c

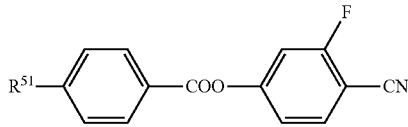
G2a

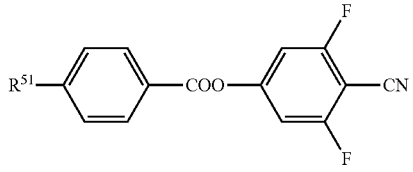
G2b

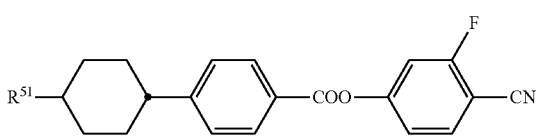
G5a

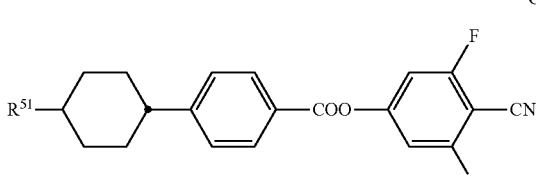
G5b

-continued

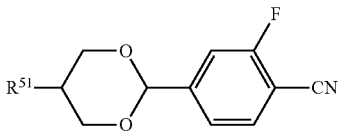
G7a

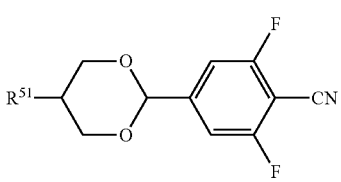
G7b in which $R^{51}$ is as defined in formula G.

In the compounds of formula G, G1-G7 and their subformulae, $R^{51}$ is particularly preferably alkyl or alkoxy having 1 to 8 carbon atoms, or alkenyl having from 2 to 7 carbon atoms.

The concentration of the compounds of formula A and B in the LC host mixture is preferably from 2 to 60%, very preferably from 3 to 45%, most preferably from 4 to 35%.

The concentration of the compounds of formula C and D in the LC host mixture is preferably from 2 to 70%, very preferably from 5 to 65%, most preferably from 10 to 60%.

The concentration of the compounds of formula E in the LC host mixture is preferably from 5 to 50%, very preferably from 5 to 35%.

The concentration of the compounds of formula F in the LC host mixture is preferably from 2 to 30%, very preferably from 5 to 20%.

Further preferred embodiments of the present invention are listed below, including any combination thereof.

a) The LC host mixture comprises one or more compounds of formula A and/or B with high positive dielectric anisotropy, preferably with $\Delta\varepsilon > 15$.

b) The LC host mixture comprises one or more compounds selected from the group consisting of formulae A1a2, A1b1, A1d1, A1f1, A2a1, A2h1, A2l1, A2l2, A2k1, B2h3, B2l1, F1a. The proportion of these compounds in the LC host mixture is preferably from 4 to 40%, very preferably from 5 to 35%.

c) The LC host mixture comprises one or more compounds selected from the group consisting of formulae C3, C4, C5, C9 and D2. The proportion of these compounds in the LC host mixture is preferably from 8 to 70%, very preferably from 10 to 60%.

d) The LC host mixture comprises one or more compounds selected from the group consisting of formulae G1, G2 and G5, preferably G1a, G2a and G5a. The proportion of these compounds in the LC host mixture is preferably from 4 to 40%, very preferably from 5 to 35%.

e) The LC host mixture comprises one or more compounds selected from the group consisting of formulae E1, E3 and E6, preferably E1a, E3a and E6a, very preferably E1a2, E1a5, E3a1 and E6a1. The proportion of these compounds in the LC host mixture is preferably from 5 to 60%, very preferably from 10 to 50%.

In the LC medium according to the present invention, the use of an LC host mixture comprising compounds of formula A and/or B together with the use of a polymerisable component comprising a combination of a first and a second polymerisable compound as described above leads to advantageous properties in LC displays. In particular, one or more of the following advantages could be achieved:

easy and quick formation of polymer walls by polymerisation-induced phase separation of the polymer formed by the first and second polymerisable compounds, formation of polymer walls with highly defined shape and constant thickness, constant cell gap, high flexibility of the display cell in case plastic substrates are used, high resistance of the display cell against mechanical pressure, and low variation of the cell gap under pressure, good adhesion of the polymer walls to the substrates, low number of defects, reduced formation of domains with different electrooptical properties like response time or contrast, high transparency, good contrast, fast response times.

The display manufacture process is known to the skilled person and is described in the literature, for example in U.S. Pat. No. 6,130,738 and EP2818534 A1.

The present invention also relates to a process for the production of an LC display as described above and below, comprising the steps of providing an LC medium as described above and below into the display, and polymerising the polymerisable compounds in defined regions of the display.

Preferably the polymerisable compounds are photopolymerised by exposure to UV irradiation.

Further preferably the polymerisable compounds are photopolymerised by exposure to UV irradiation through a photomask.

The photomask is preferably designed such that it comprises regions that are transparent to the UV radiation used for photopolymerisation, and regions that are not transparent to the UV radiation used for photopolymerisation, and wherein the transparent regions form a pattern or image that corresponds to the desired shape of the polymer walls. As a result the polymerisable compounds are only polymerised in those parts of the display that are covered by the transparent regions of the photomask, thus forming polymer walls of the desired shape.

For example, an LC display according to the present invention can be manufactured as follows. Polymerisable compounds as described above and below are combined with a suitable LC host mixture. This resulting LC medium can then be included into the display by using conventional manufacturing processes. The resulting LC medium can be filled for example using capillary forces into the cell gap formed by two substrates.

Alternatively, the LC medium can be deposited as a layer onto a substrate, and another substrate is placed on top of the LC layer under vacuum in order to prevent inclusion of air bubbles. The LC medium is in either case located in the cell gap formed by the two substrates, as exemplarily illustrated in FIG. 1a. These substrates usually are covered by an alignment layer which is in direct contact with the LC medium. The substrates itself can carry other functional components like TFTs, black matrix, colour filter, or similar.

Subsequently, polymerisation induced phase separation is initiated by exposure of the LC medium, which is either in the nematic or the isotropic phase, to UV radiation with collimated light through a photomask, as exemplarily illustrated in FIG. 1b. This leads to the formation of polymer wall structures, restoration of the LC host, and alignment of the LC phase with the alignment layer, as exemplarily illustrated in FIG. 1c.

Polymerisation of the polymerisable compounds in the LC medium is preferably carried out a room temperature. At the polymerisation temperature the LC medium can be in the nematic or isotropic phase, depending on the concentration of the polymerisable compounds. For example, if the polymerisable compounds are present in higher concentration, for example above 10-15%, it is possible that the LC medium is in the isotropic phase at room temperature.

This process can advantageously utilize display manufacturing processes that are established in the industry. Thus, both the display filling process, for example by one-drop-filling (ODF), and the radiation initiated polymerization step after sealing the display, which is known for example from polymer stabilised or PS-type display modes like PS-VA, are established techniques in conventional LCD manufacturing.

A preferred LC display of the present invention comprises:

a first substrate including a pixel electrode defining pixel areas, the pixel electrode being connected to a switching element disposed in each pixel area and optionally including a micro-slit pattern, and optionally a first alignment layer disposed on the pixel electrode, a second substrate including a common electrode layer, which may be disposed on the entire portion of the second substrate facing the first substrate, and optionally a second alignment layer, an LC layer disposed between the first and second substrates and including an LC medium comprising a polymerisable component A) and a liquid-crystalline component B) as described above and below, wherein the polymerisable component A) is polymerised.

The LC display may comprise further elements, like a colour filter, a black matrix, a passivation layer, optical retardation layers, transistor elements for addressing the individual pixels, etc., all of which are well known to the person skilled in the art and can be employed without inventive skill.

The electrode structure can be designed by the skilled person depending on the individual display type. For example for VA displays a multi-domain orientation of the LC molecules can be induced by providing electrodes having slits and/or bumps or protrusions in order to create two, four or more different tilt alignment directions.

The first and/or second alignment layer controls the alignment direction of the LC molecules of the LC layer. For example, in TN displays the alignment layer is selected such that it imparts to the LC molecules an orientation direction parallel to the surface, while in VA displays the alignment layer is selected such that it imparts to the LC molecules a homeotropic alignment, i.e. an orientation direction perpendicular to the surface. Such an alignment layer may for example comprise a polyimide, which may also be rubbed, or may be prepared by a photoalignment method.

The substrate can be a glass substrate. The use of an LC medium according to the present invention in an LC display with glass substrates can provide several advantages. For example, the formation of polymer wall structures in the LC medium helps to prevent the so-called "pooling effect" where pressure applied on the glass substrates causes unwanted optical defects. The stabilizing effect of the polymer wall structures also allows to further minimize the panel thickness. Moreover, in bent panels with glass substrates the polymer wall structures enable a smaller radius of curvature.

For flexible LC displays preferably plastic substrates are used. These plastic substrates preferably have a low birefringence. Examples are polycarbonate (PC), polyethersulfone (PES), polycyclic olefine (PCO), polyarylate (PAR), polyetheretherketone (PEEK), or colourless polyimide (CPI) substrates.

The LC layer with the LC medium can be deposited between the substrates of the display by methods that are conventionally used by display manufacturers, for example the one-drop-filling (ODF) method. The polymerisable component of the LC medium is then polymerised for example by UV photopolymerisation.

The polymerisation can be carried out in one step or in two or more steps. It is also possible to carry out the polymerisation in a sequence of several UV irradiation and/or heating or cooling steps. For example, a display manufacturing process may include a first UV irradiation step at room temperature to start polymerisation, and subsequently, in a second polymerisation step to polymerise or crosslink the compounds which have not reacted in the first step ("end curing").

Upon polymerisation the polymerisable compounds react with each other to a polymer which undergoes macroscopical phase-separation from the LC host mixture and forms polymer walls in the LC medium.

Suitable and preferred polymerisation methods are, for example, thermal or photopolymerisation, preferably photopolymerisation, in particular UV induced photopolymerisation, which can be achieved by exposure of the polymerisable compounds to UV radiation.

Optionally one or more polymerisation initiators are added to the LC medium. Suitable conditions for the polymerisation and suitable types and amounts of initiators are known to the person skilled in the art and are described in the literature. Suitable for free-radical polymerisation are, for example, the commercially available photoinitiators Irgacure651®, Irgacure184®, Irgacure907®, Irgacure369® or Darocurel 173® (Ciba AG). If a polymerisation initiator is employed, its proportion is preferably 0.001 to 5% by weight, particularly preferably 0.001 to 1% by weight.

The polymerisable compounds according to the invention are also suitable for polymerisation without an initiator, which is accompanied by considerable advantages, such, for example, lower material costs and in particular less contamination of the LC medium by possible residual amounts of the initiator or degradation products thereof. The polymerisation can thus also be carried out without the addition of an initiator. In a preferred embodiment, the LC medium contains a polymerisation initiator.

The LC medium may also comprise one or more stabilisers or inhibitors in order to prevent undesired spontaneous polymerisation of the RMs, for example during storage or transport. Suitable types and amounts of stabilisers are known to the person skilled in the art and are described in the literature. Particularly suitable are, for example, the commercially available stabilisers from the Irganox® series (Ciba AG), such as, for example, Irganox® 1076. If stabilisers are employed, their proportion, based on the total amount of RMs or the polymerisable component (component A), is preferably 10-500,000 ppm, particularly preferably 50-50,000 ppm.

Preferably the LC medium according to the present invention does essentially consist of a polymerisable component A) and an LC component B) (or LC host mixture) as described above and below. However, the LC medium may additionally comprise one or more further components or additives.

The LC media according to the invention may also comprise further additives which are known to the person skilled in the art and are described in the literature, such as, for example, polymerisation initiators, inhibitors, stabilisers, surface-active substances or chiral dopants. These may be polymerisable or non-polymerisable. Polymerisable additives are accordingly ascribed to the polymerisable component or component A). Non-polymerisable additives are accordingly ascribed to the non-polymerisable component or component B).

Preferred additives are selected from the list including but not limited to co-monomers, chiral dopants, polymerisation initiators, inhibitors, stabilizers, surfactants, wetting agents, lubricating agents, dispersing agents, hydrophobing agents, adhesive agents, flow improvers, defoaming agents, deaerators, diluents, reactive diluents, auxiliaries, colourants, dyes, pigments and nanoparticles.

In a preferred embodiment the LC media contain one or more chiral dopants, preferably in a concentration from 0.01 to 1% by weight, very preferably from 0.05 to 0.5% by weight. The chiral dopants are preferably selected from the group consisting of compounds from Table B below, very preferably from the group consisting of R- or S-1011, R- or S-2011, R- or S-3011, R- or S-4011, and R- or S-5011.

In another preferred embodiment the LC media contain a racemate of one or more chiral dopants, which are preferably selected from the chiral dopants mentioned in the previous paragraph.

Furthermore, it is possible to add to the LC media, for example, 0 to 15% by weight of pleochroic dyes, furthermore nanoparticles, conductive salts, preferably ethyldimethyldodecylammonium 4-hexoxybenzoate, tetrabutyl-ammonium tetraphenylborate or complex salts of crown ethers (cf., for example, Haller et al., Mol. Cryst. Liq. Cryst. 24, 249-258 (1973)), for improving the conductivity, or substances for modifying the dielectric anisotropy, the viscosity and/or the alignment of the nematic phases. Substances of this type are described, for example, in DE-A 22 09 127, 22 40 864, 23 21 632, 23 38 281, 24 50 088, 26 37 430 and 28 53 728.

The LC media which can be used in accordance with the invention are prepared in a manner conventional per se, for example by mixing one or more of the above-mentioned compounds with one or more polymerisable compounds as defined above, and optionally with further liquid-crystalline compounds and/or additives. In general, the desired amount of the components used in lesser amount is dissolved in the components making up the principal constituent, advantageously at elevated temperature. It is also possible to mix solutions of the components in an organic solvent, for example in acetone, chloroform or methanol, and to remove the solvent again, for example by distillation, after thorough mixing. The invention furthermore relates to the process for the preparation of the LC media according to the invention.

It goes without saying to the person skilled in the art that the LC media according to the invention may also comprise compounds in which, for example, H, N, O, Cl, F have been replaced by the corresponding isotopes like deuterium etc.

The following examples explain the present invention without restricting it. However, they show the person skilled in the art preferred mixture concepts with compounds preferably to be employed and the respective concentrations thereof and combinations thereof with one another. In addition, the examples illustrate which properties and property combinations are accessible.

The following abbreviations are used:
(n, m, z: in each case, independently of one another, 1, 2, 3, 4, 5 or 6)

TABLE A
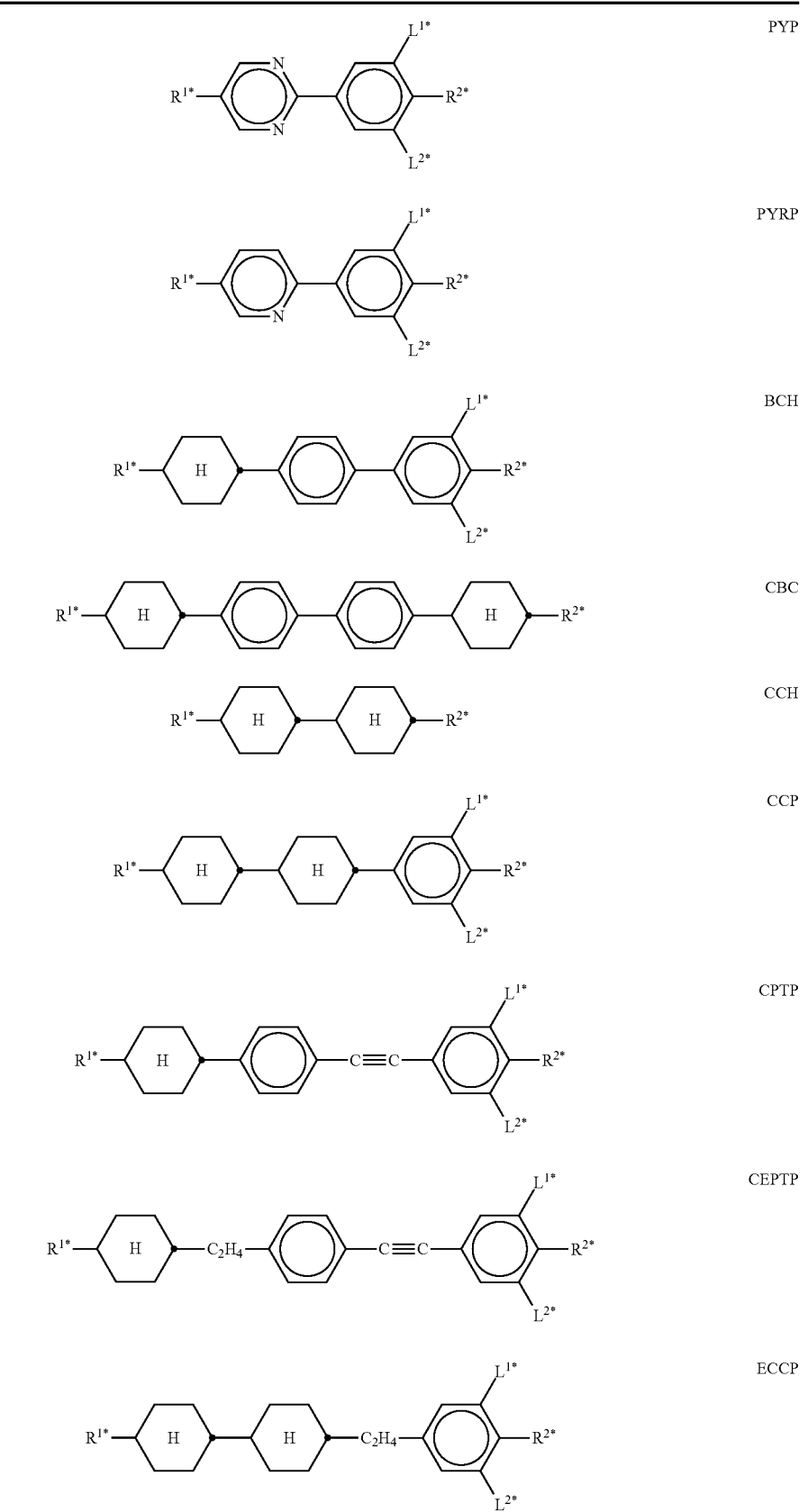

TABLE A-continued

| Structure | Code |
|---|---|
| R¹*—H—C₂H₄—H—[benzene with L¹*, R²*, L²*] | CECP |
| R¹*—H—C₂H₄—[benzene with L¹*, R²*, L²*] | EPCH |
| R¹*—H—[benzene with L¹*, R²*, L²*] | PCH |
| R¹*—H—H—COO—H—R²* | CH |
| R¹*—[benzene]—C≡C—[benzene with L¹*, R²*, L²*] | PTP |
| R¹*—H—H—COO—[benzene]—H—R²* | CCPC |
| R¹*—H—H—COO—[benzene]—R²* | CP |
| R¹*—H—C₂H₄—[benzene]—[benzene with L¹*, R²*, L²*] | BECH |
| R¹*—H—[benzene]—C₂H₄—[benzene with L¹*, R²*, L²*] | EBCH |
| R¹*—H—[benzene]—H—R²* | CPC |

TABLE A-continued
| | |
|---|---|
| 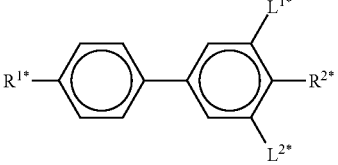 | B |
| 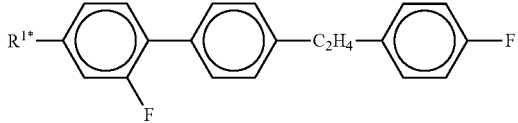 | FET-nF |
| 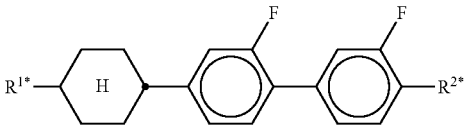 | CGG |
| 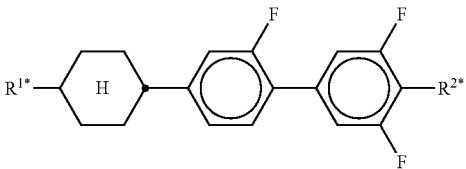 | CGU |
| 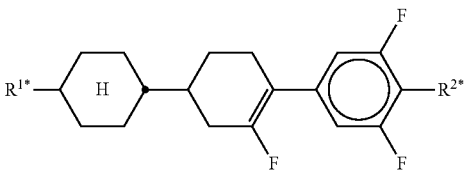 | CFU |
| 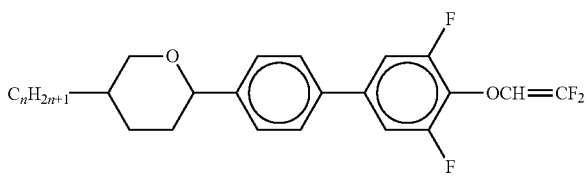 | APU-n-OXF |
| 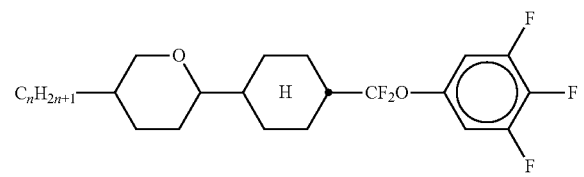 | ACQU-n-F |
| 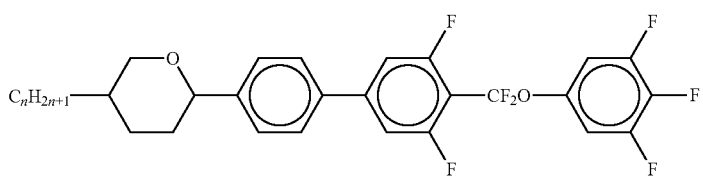 | APUQU-n-F |
| 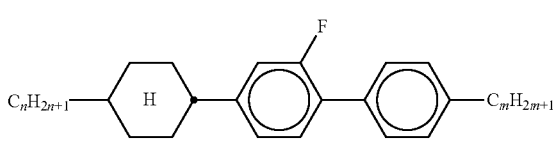 | BCH-n.Fm |

TABLE A-continued

| Structure | Code |
|---|---|
| $C_nH_{2n+1}$—[H]—[H]—[Ar(F)]—F, with F on middle ring | CFU-n-F |
| $C_nH_{2n+1}$—[H]—[Ar(F)]—[Ar]—[H]—$C_mH_{2m+1}$ | CBC-nmF |
| $C_nH_{2n+1}$—[H]—[H]—$C_2H_4$—[Ar]—$C_mH_{2m+1}$ | ECCP-nm |
| $C_nH_{2n+1}$—[H]—[H]—COO—[Ar(F,F,F)] | CCZU-n-F |
| $C_nH_{2n+1}$—[Ar]—[Ar(F)]—[Ar]—$C_mH_{2m+1}$ | PGP-n-m |
| $C_nH_{2n+1}$—[H]—[Ar(F)]—[Ar(F,F,F)] | CGU-n-F |
| $C_nH_{2n+1}$—[H]—[Ar]—[Ar(F,F)]—CH=CH—$CF_3$ | CPU-n-VT |
| $C_nH_{2n+1}$—[H]—[Ar]—[Ar(F,F)]—C≡C—$CF_3$ | CPU-n-AT |
| $C_nH_{2n+1}$—[H]—[dioxane]—[Ar(F,F)]—$CF_2O$—[Ar(F,F)] | CDUQU-n-F |
| $C_nH_{2n+1}$—[dioxane]—[Ar(F)]—[Ar(F,F)]—$CF_2O$—[Ar(F,F)] | DGUQU-n-F |

TABLE A-continued
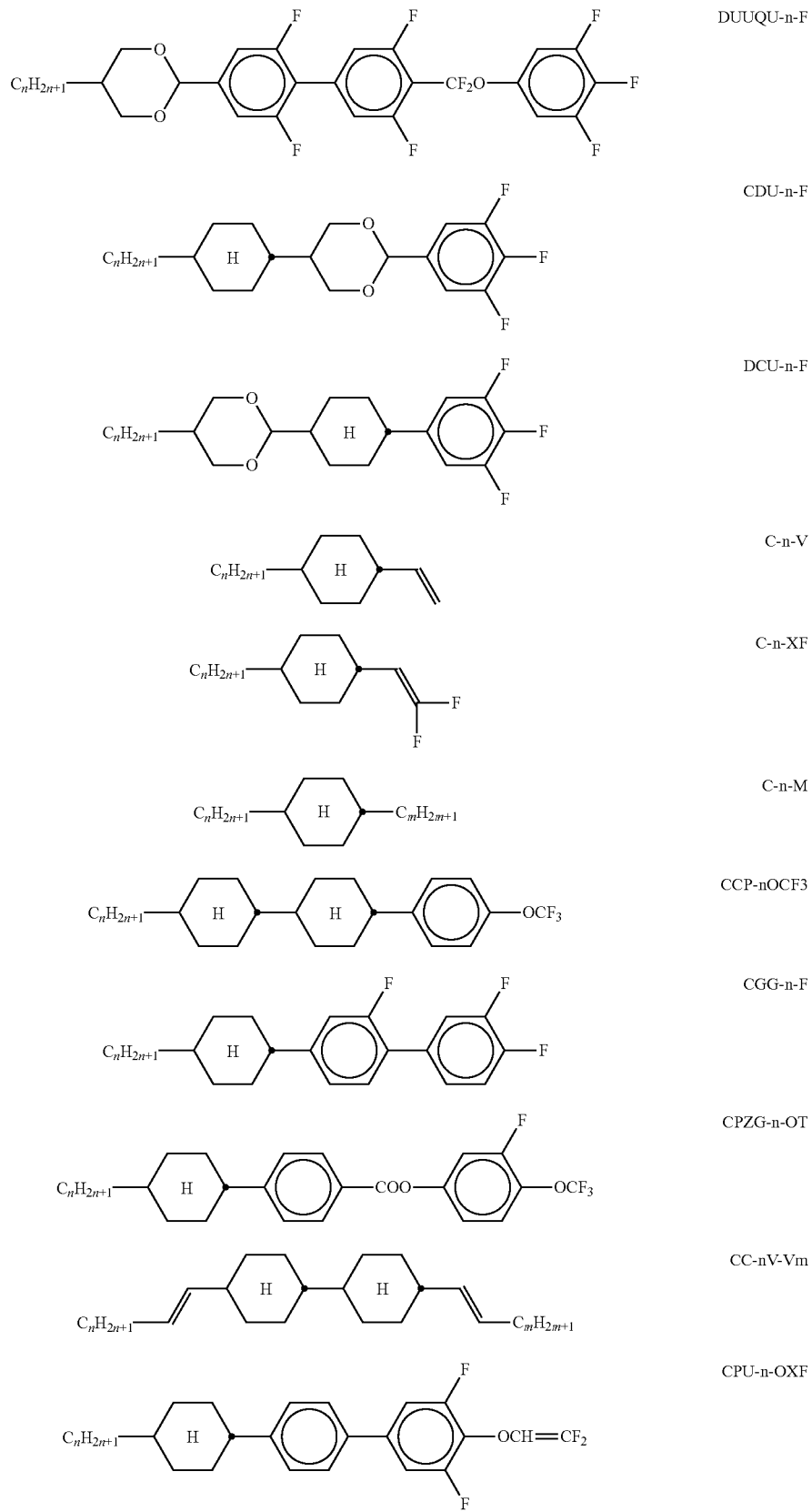
DUUQU-n-F
CDU-n-F
DCU-n-F
C-n-V
C-n-XF
C-n-M
CCP-nOCF3
CGG-n-F
CPZG-n-OT
CC-nV-Vm
CPU-n-OXF TABLE A-continued

| Structure | Code |
|---|---|
| $C_nH_{2n}$—[H]—[H]—⟨⟩—$C_mH_{2m+1}$ (with allyl) | CCP-Vn-m |
| CH$_2$=CH—[H]—[H]—⟨⟩(3,4-diF) | CCG-V-F |
| $C_nH_{2n+1}$—CH=CH—[H]—[H]—⟨⟩—$C_mH_{2m+1}$ | CCP-nV-m |
| $C_nH_{2n+1}$—[H]—[H]—CH=CH$_2$ | CC-n-V |
| $C_nH_{2n+1}$—[H]—[H]—CH$_2$CH$_2$CH=CH$_2$ | CC-n-2V1 |
| $C_nH_{2n+1}$—[H]—[H]—CH=CH—CH$_3$ | CC-n-V1 |
| $C_nH_{2n+1}$—[H]—[H]—CH=CH—[H]—CH=CH$_2$ | CCVC-n-V |
| $C_nH_{2n+1}$—[H]—[H]—⟨⟩—$C_mH_{2m+1}$ | CCP-n-m |
| $C_nH_{2n+1}$—[H]—[H]—CF$_2$O—⟨⟩(3,4,5-triF) | CCQU-n-F |
| $C_nH_{2n+1}$—[H]—[H]—CH=CH—$C_mH_{2m+1}$ | CC-n-Vm |
| $C_nH_{2n+1}$—[H]—[H]—⟨2,6-diF⟩—CF$_2$O—⟨⟩(3,4,5-triF) | CLUQU-n-F |
| $C_nH_{2n+1}$—CH=CH—[H]—⟨⟩—⟨⟩—[H]—CH=CH—$C_mH_{2m+1}$ | CPPC-nV-Vm |
| $C_nH_{2n+1}$—[H]—[H]—CF$_2$O—⟨⟩(3,4-diF) | CCQG-n-F |

TABLE A-continued
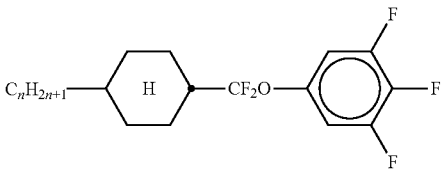 CQU-n-F
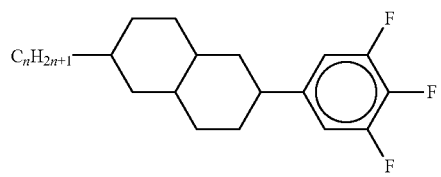 Dec-U-n-F
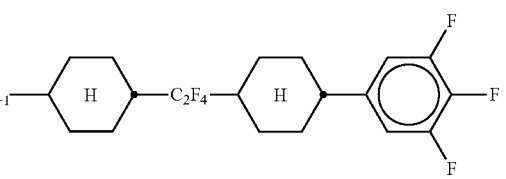 CWCU-n-F
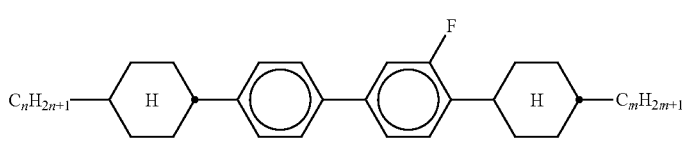 CPGP-n-m
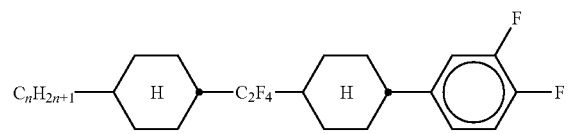 CWCG-n-F
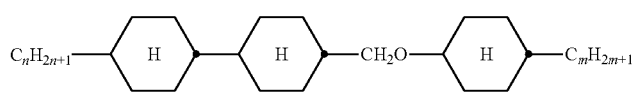 CCOC-n-m
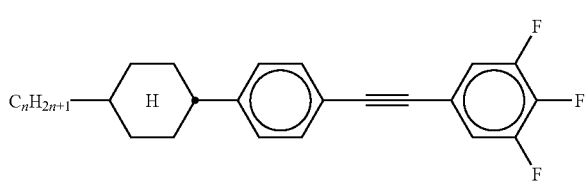 CPTU-n-F
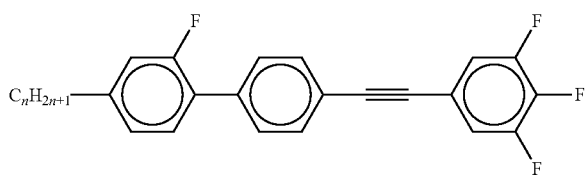 GPTU-n-F
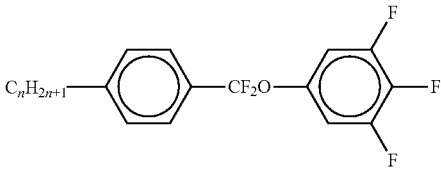 PQU-n-F TABLE A-continued

| Structure | Code |
|---|---|
| (chemical structure) | PUQU-n-F |
| (chemical structure) | PGU-n-F |
| (chemical structure) | CGZP-n-OT |
| (chemical structure) | CCGU-n-F |
| (chemical structure) | CCQG-n-F |
| (chemical structure) | DPGU-n-F |
| (chemical structure) | DPGU-n-OT |
| (chemical structure) | CUQU-n-F |
| (chemical structure) | GUQU-n-F |

TABLE A-continued

| Structure | Code |
|---|---|
| $C_nH_{2n+1}$–[H]–[H]–[H]–$CF_2O$–[benzene-3,4,5-triF] | CCCQU-n-F |
| $C_nH_{2n+1}$–[H]–[benzene-2F]–[benzene-3,5-diF]–$CF_2O$–[benzene-3,4,5-triF] | CGUQU-n-F |
| $C_nH_{2n+1}$–[H]–[benzene]–[benzene-2F]–[benzene-3,5-diF]–$OCF_3$ | CPGU-n-OT |
| $C_nH_{2n+1}$–[pyrimidine]–[benzene]–F | PYP-nF |
| $C_nH_{2n+1}$–[H]–[benzene]–[benzene-2F]–[benzene-3,4,5-triF] | CPGU-n-F |
| CH$_3$CH=CH–[H]–CH=CH–[H]–[benzene]–$OCF_3$ | CVCP-1V-OT |
| $C_nH_{2n+1}$–[benzene-2F]–[benzene-2F]–[benzene]–Cl | GGP-n-Cl |
| $C_nH_{2n+1}$–CH=CH–[benzene]–[benzene]–CH=CH–$C_mH_{2m+1}$ | PP-nV-Vm |
| $H_3C$–[benzene]–[benzene]–$C_nH_{2n}$–CH=CH–$C_mH_{2m+1}$ | PP-1-nVm |
| $C_nH_{2n+1}$–[H]–$C_2F_4$–[H]–$CF_2O$–[benzene-3,4,5-triF] | CWCQU-n-F |

TABLE A-continued
| | |
|---|---|
| 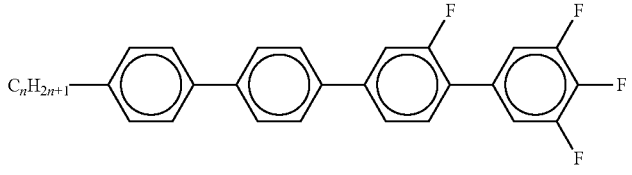 | PPGU-n-F |
| 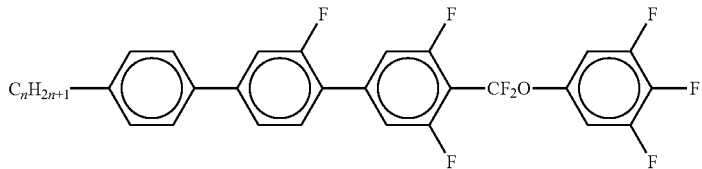 | PGUQU-n-F |
| 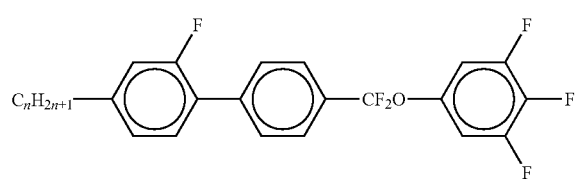 | GPQU-n-F |
| 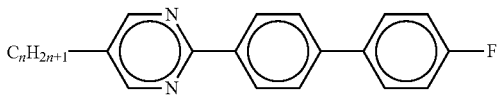 | MPP-n-F |
| 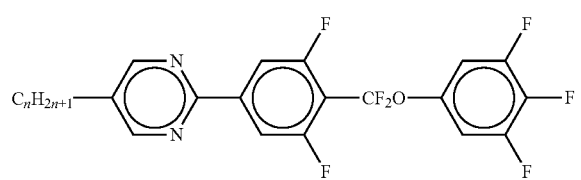 | MUQU-n-F |
| 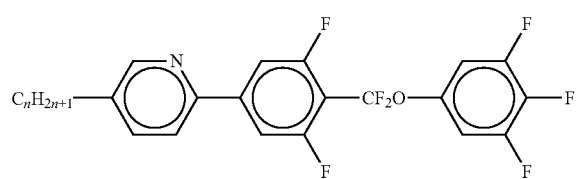 | NUQU-n-F |
| 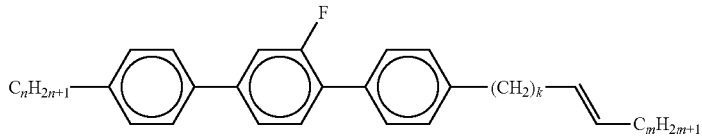 | PGP-n-kVm |
| 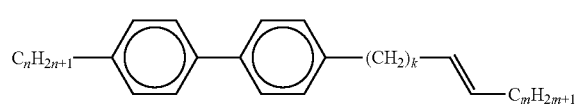 | PP-n-kVm |
| 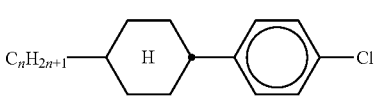 | PCH-nCl |
| 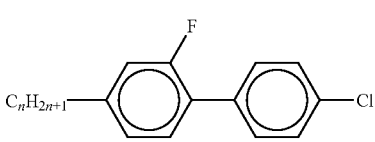 | GP-n-Cl |

TABLE A-continued

| Structure | Code |
|---|---|
| $C_nH_{2n+1}$–[C6H3(F)]–[C6H3(F)]–[C6H4]–F | GGP-n-F |
| $C_nH_{2n+1}$–[C6H4]–[C6H3(F)]–[C6H3(F)]–F | PGIGI-n-F |
| $C_nH_{2n+1}$–[C6H4]–[C6H3(F)]–[C6H2(F)(F)]–OCH=CF$_2$ | PGU-n-OXF |
| $C_nH_{2n+1}$–[Cy]–[C6H4]–OC$_m$H$_{2m+1}$ | PCH-nOm |
| $C_nH_{2n+1}$–[C6H3(F)]–[C6H2(F)(F)]–CF$_2$O–[C6H3(F)]–[C6H3(F)]–F | GUQGU-n-F |
| $C_nH_{2n+1}$–[Cy]–[C6H4]–CN | PCH-n |
| $C_nH_{2n+1}$–[C6H4]–COO–[C6H3(F)]–CN | MEnN.F |
| $C_nH_{2n+1}$–[Cy]–[C6H4]–COO–[C6H3(F)]–CN | HPnN.F |
| $C_nH_{2n+1}$–[C6H4]–[C6H4]–CN | K3-n |
| $C_nH_{2n+1}$–[Cy]–[C6H4]–[C6H2(F)(F)(F)]–F | BCH-nF.F.F |
| $R^{1*}$–[Cy]–[C6H4]–[C6H4]–[Cy]–$R^{2*}$ | CBC-nmF |
| $C_nH_{2n+1}$–[Cy]–[Cy]–[C6H4]–OCF$_3$ | CCP-n0CF3 |

TABLE A-continued
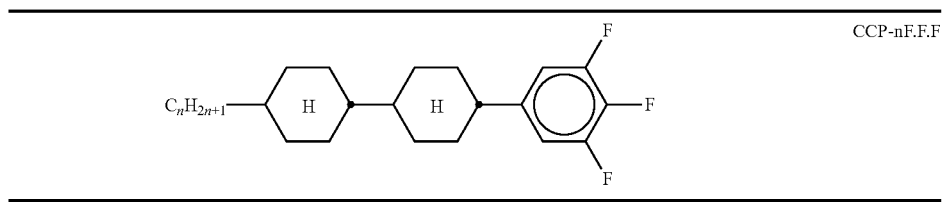
CCP-nF.F.F
(n = 1-15; (O)$C_nH_{2n+1}$ means $C_nH_{2n+1}$ or $OC_nH_{2n+1}$)
In a preferred embodiment of the present invention, the LC media according to the invention comprise one or more compounds selected from the group consisting of compounds from Table A.
TABLE B
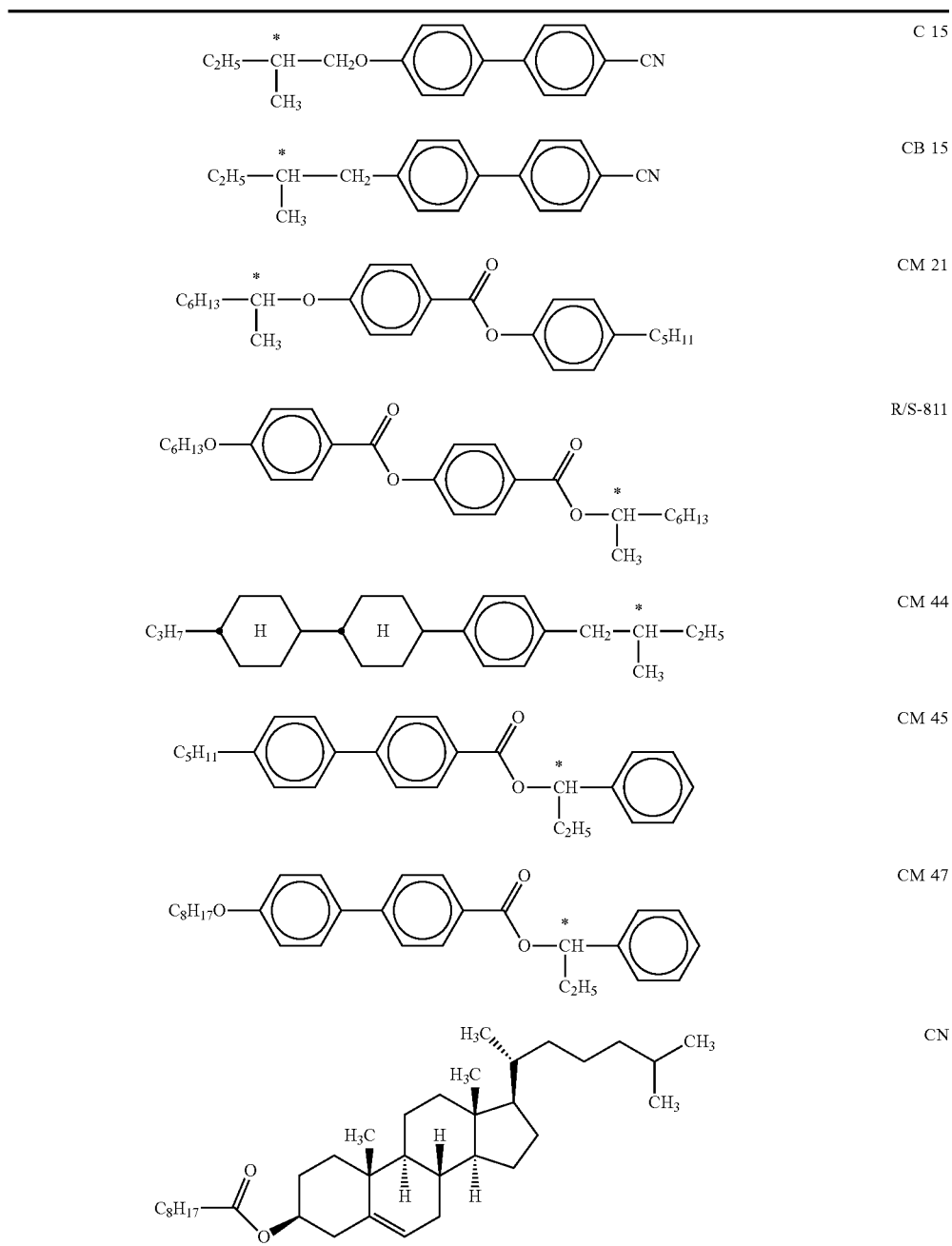

TABLE B-continued

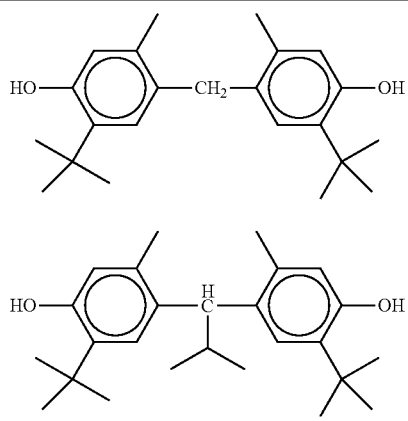

Table B shows possible chiral dopants which can be added to the LC media according to the invention.

The LC media preferably comprise 0 to 10% by weight, in particular 0.01 to 5% by weight, particularly preferably 0.1 to 3% by weight, of dopants. The LC media preferably comprise one or more dopants selected from the group consisting of compounds from Table B.

TABLE C

TABLE C-continued
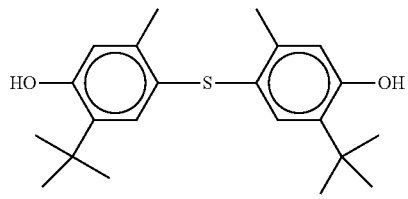
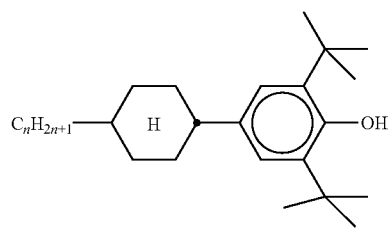
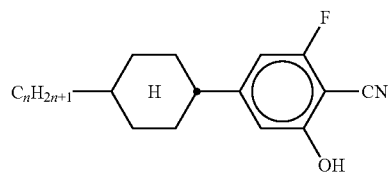
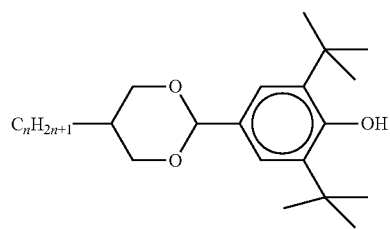
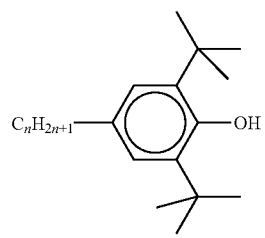
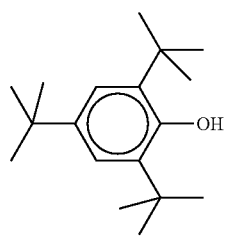
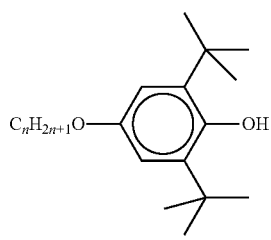

TABLE C-continued
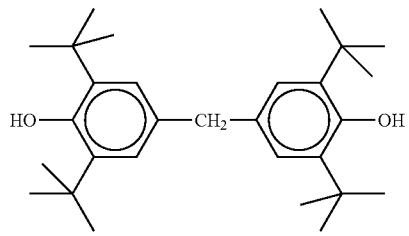
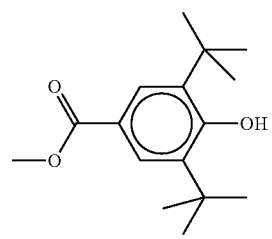
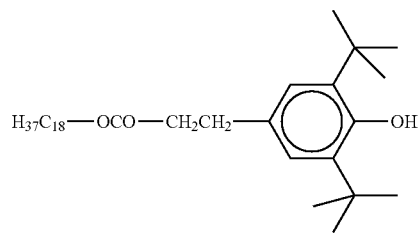
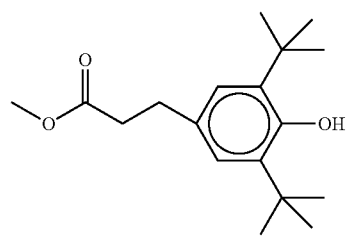
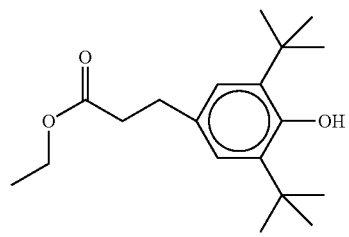
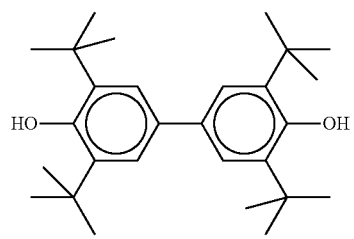

TABLE C-continued
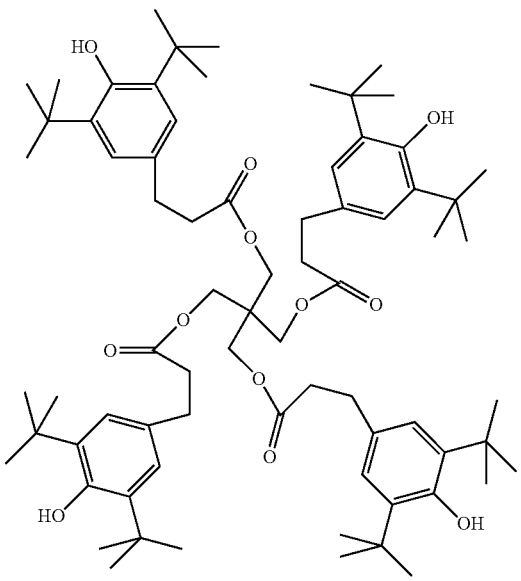 [SMILES: CC(C)(C)c1cc(CCC(=O)OCC(COC(=O)CCc2cc(C(C)(C)C)c(O)c(C(C)(C)C)c2)(COC(=O)CCc2cc(C(C)(C)C)c(O)c(C(C)(C)C)c2)COC(=O)CCc2cc(C(C)(C)C)c(O)c(C(C)(C)C)c2)cc(C(C)(C)C)c1O]
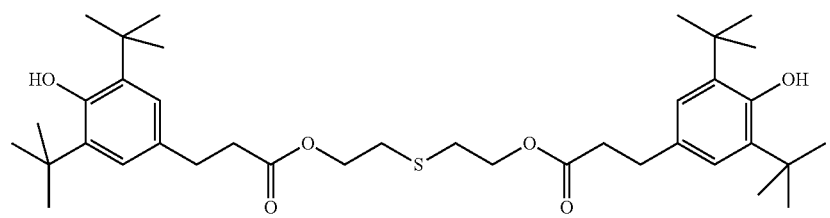 [SMILES: CC(C)(C)c1cc(CCC(=O)OCCSCCOC(=O)CCc2cc(C(C)(C)C)c(O)c(C(C)(C)C)c2)cc(C(C)(C)C)c1O]
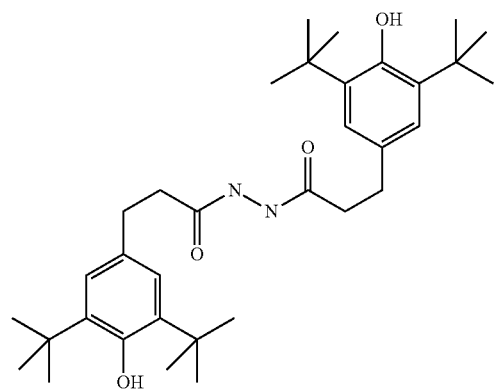 [SMILES: CC(C)(C)c1cc(CCC(=O)NNC(=O)CCc2cc(C(C)(C)C)c(O)c(C(C)(C)C)c2)cc(C(C)(C)C)c1O]
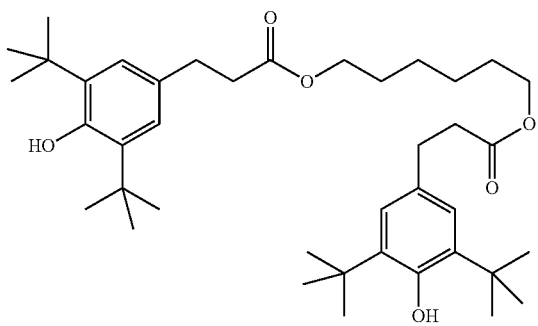 [SMILES: CC(C)(C)c1cc(CCC(=O)OCCCCCCOC(=O)CCc2cc(C(C)(C)C)c(O)c(C(C)(C)C)c2)cc(C(C)(C)C)c1O]

TABLE C-continued
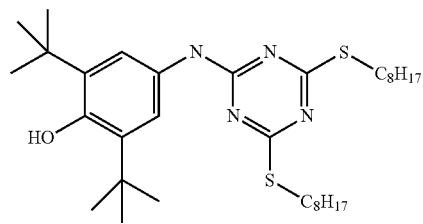
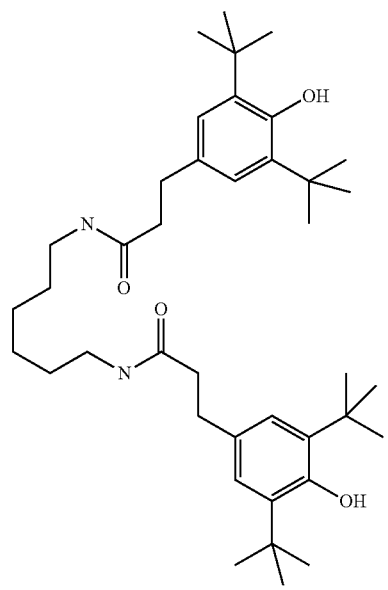 [SMILES: CC(C)(C)c1cc(CCC(=O)NCCCCCCNC(=O)CCc2cc(C(C)(C)C)c(O)c(C(C)(C)C)c2)cc(C(C)(C)C)c1O]
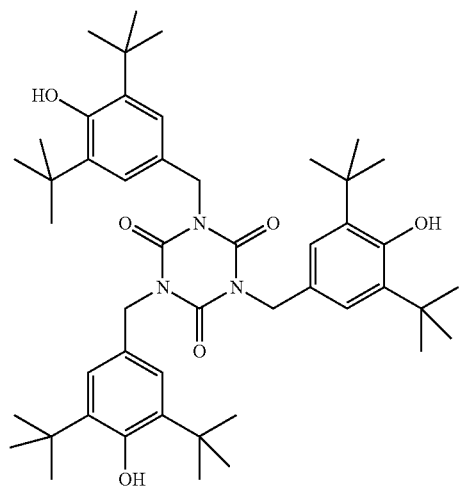 [SMILES: CC(C)(C)c1cc(Cn2c(=O)n(Cc3cc(C(C)(C)C)c(O)c(C(C)(C)C)c3)c(=O)n(Cc3cc(C(C)(C)C)c(O)c(C(C)(C)C)c3)c2=O)cc(C(C)(C)C)c1O]

TABLE C-continued
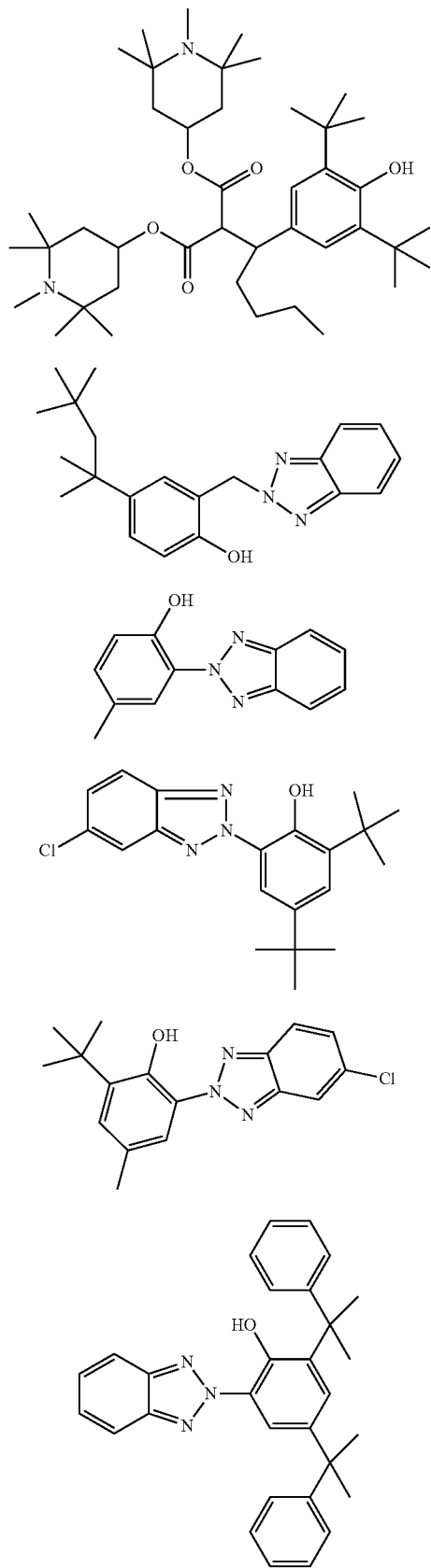

TABLE C-continued
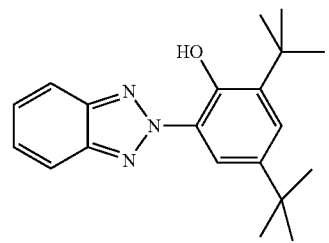 [SMILES: CC(C)(C)c1cc(-n2nc3ccccc3n2)c(O)c(C(C)(C)C)c1]
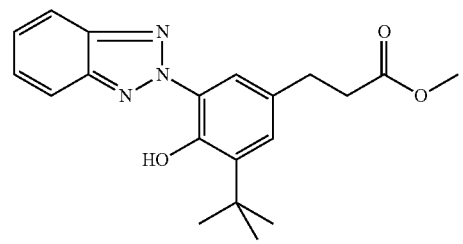 [SMILES: COC(=O)CCc1cc(-n2nc3ccccc3n2)c(O)c(C(C)(C)C)c1]
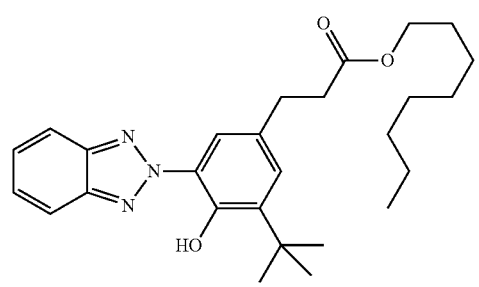 [SMILES: CCCCCCCCOC(=O)CCc1cc(-n2nc3ccccc3n2)c(O)c(C(C)(C)C)c1]
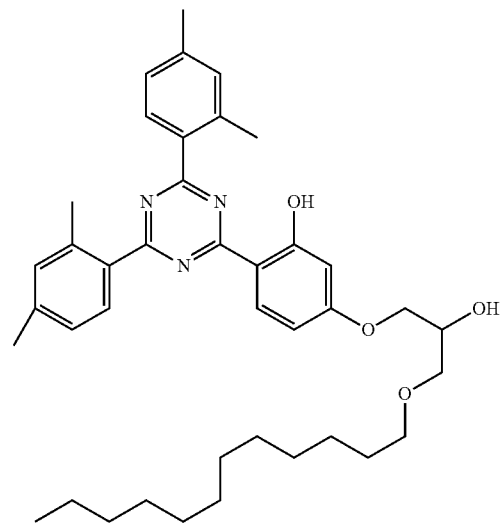 [SMILES: CCCCCCCCCCCCOCC(O)COc1ccc(-c2nc(-c3ccc(C)cc3C)nc(-c3ccc(C)cc3C)n2)c(O)c1]

TABLE C-continued
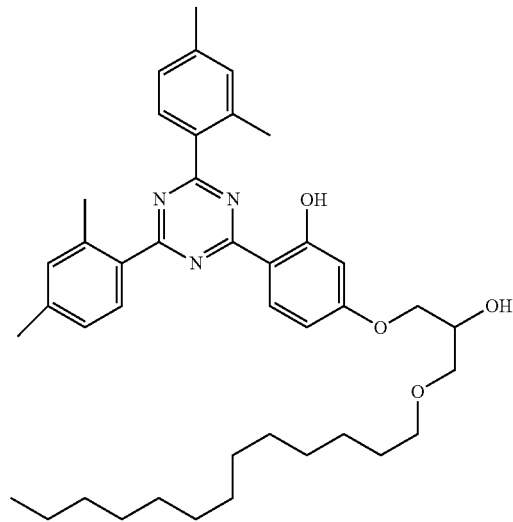 [SMILES: CCCCCCCCCCCCCOCC(O)COc1ccc(-c2nc(-c3ccc(C)cc3C)nc(-c3ccc(C)cc3C)n2)c(O)c1]
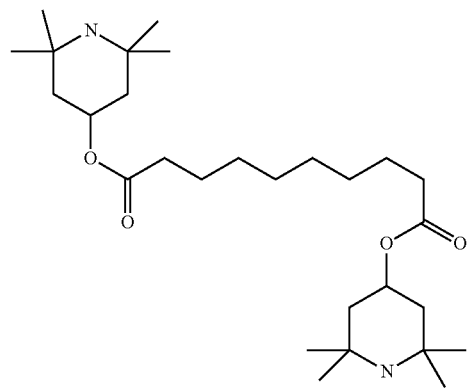
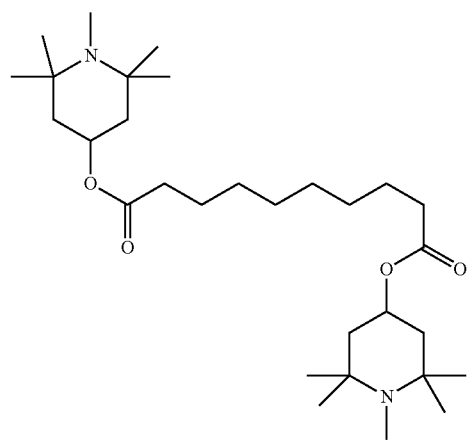

TABLE C-continued
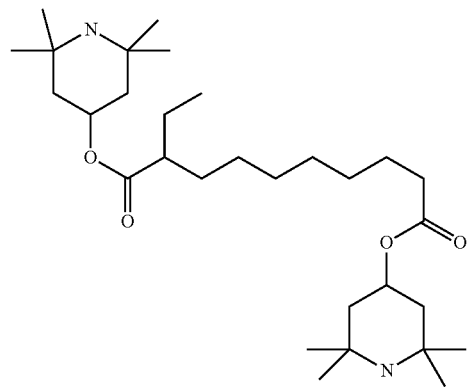
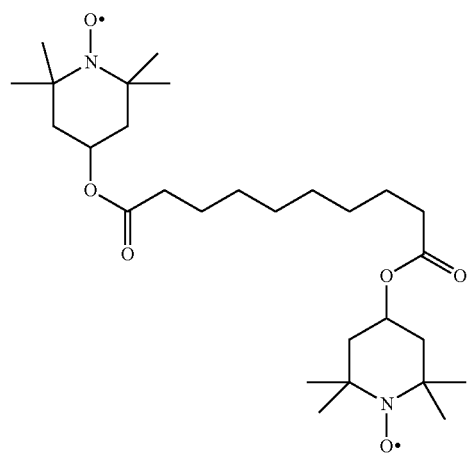
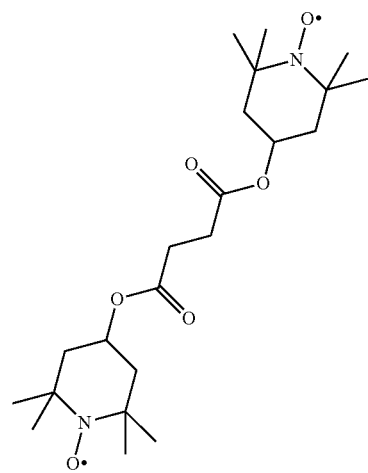

TABLE C-continued

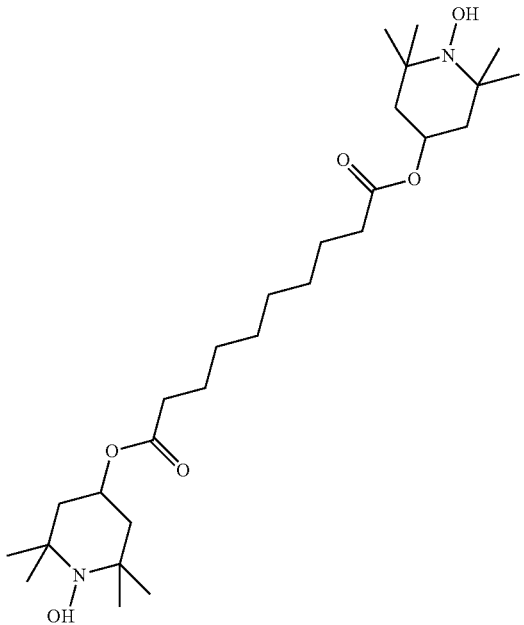

Table C shows possible stabilisers which can be added to the LC media according to the invention.
(n here denotes an integer from 1 to 12, preferably 1, 2, 3, 4, 5, 6, 7 or 8, terminal methyl groups are not shown).

The LC media preferably comprise 0 to 10% by weight, in particular 1 ppm to 5% by weight, particularly preferably 1 ppm to 1% by weight, of stabilisers. The LC media preferably comprise one or more stabilisers selected from the group consisting of compounds from Table C.

In addition, the following abbreviations and symbols are used:
$V_0$ threshold voltage, capacitive [V] at 20° C.,
$n_e$ extraordinary refractive index at 20° C. and 589 nm,
$n_o$ ordinary refractive index at 20° C. and 589 nm,
$\Delta n$ optical anisotropy at 20° C. and 589 nm,
$\varepsilon_\perp$ dielectric permittivity perpendicular to the director at 20° C. and 1 kHz,
$\varepsilon_\parallel$ dielectric permittivity parallel to the director at 20° C. and 1 kHz,
$\Delta\varepsilon$ dielectric anisotropy at 20° C. and 1 kHz,
cl.p., T(N,I) clearing point [° C.],
$\gamma_1$ rotational viscosity at 20° C. [mPa·s],
$K_1$ elastic constant, "splay" deformation at 20° C. [pN],
$K_2$ elastic constant, "twist" deformation at 20° C. [pN],
$K_3$ elastic constant, "bend" deformation at 20° C. [pN].

Unless explicitly noted otherwise, all concentrations in the present application are quoted in percent by weight, and preferably relate to the corresponding mixture as a whole, comprising all solid or liquid-crystalline components, without solvents.

Unless explicitly noted otherwise, all temperature values indicated in the present application, such as, for example, for the melting point T(C,N), the transition from the smectic (S) to the nematic (N) phase T(S,N) and the clearing point T(N,I), are quoted in degrees Celsius (° C.). M.p. denotes melting point, cl.p.=clearing point. Furthermore, C=crystalline state, N=nematic phase, S=smectic phase and I=isotropic phase. The data between these symbols represent the transition temperatures.

All physical properties are and have been determined in accordance with "Merck Liquid Crystals, Physical Properties of Liquid Crystals", Status November 1997, Merck KGaA, Germany, and apply for a temperature of 20° C., and $\Delta n$ is determined at 589 nm and $\Delta\varepsilon$ at 1 kHz, unless explicitly indicated otherwise in each case.

The term "threshold voltage" for the present invention relates to the capacitive threshold ($V_0$), also known as the Freedericks threshold, unless explicitly indicated otherwise. In the examples, the optical threshold may also, as generally usual, be quoted for 10% relative contrast ($V_{10}$).

EXAMPLES

LC Host Mixtures

Example 1

The nematic LC host mixture N1 is formulated as follows.

| PCH-3 | 16.00% | cl.p. | 73.8° C. |
|---|---|---|---|
| PUQU-3-F | 11.00% | $\Delta n$ | 0.0862 |
| CCP-3F.F.F | 10.00% | $\Delta\varepsilon$ | 6.5 |
| PCH-301 | 10.00% | $\varepsilon_\parallel$ | 10.5 |
| PCH-302 | 10.00% | $\gamma_1$ | 114 mPa · s |
| CCH-303 | 9.00% | | |
| CCH-501 | 8.00% | | |
| CH-33 | 4.00% | | |
| CH-35 | 4.00% | | |
| CH-43 | 4.00% | | |
| CH-45 | 3.00% | | |
| CCPC-33 | 3.00% | | |
| CCPC-35 | 3.00% | | |
| CCP-3-1 | 5.00% | | |

Example 2

The nematic LC host mixture N2 is formulated as follows.

| | | | |
|---|---|---|---|
| PUQU-2-F | 10.00% | cl.p. | 73.5° C. |
| PUQU-3-F | 12.00% | Δn | 0.0822 |
| CCP-2F.F.F | 4.00% | Δε | 6.6 |
| CCP-3F.F.F | 10.00% | $\gamma_1$ | 95 mPa·s |
| PCH-301 | 11.00% | | |
| PCH-302 | 10.00% | | |
| CCH-303 | 9.00% | | |
| CCH-501 | 8.00% | | |
| CH-33 | 4.00% | | |
| CH-35 | 4.00% | | |
| CH-43 | 4.00% | | |
| CH-45 | 3.00% | | |
| CCPC-33 | 3.00% | | |
| CCPC-35 | 3.00% | | |
| CCP-3-1 | 5.00% | | |

Example 3

The nematic LC host mixture N3 is formulated as follows.

| | | | |
|---|---|---|---|
| K6 | 8.00% | cl.p. | 72.0° C. |
| K15 | 8.00% | Δn | 0.0993 |
| PUQU-3-F | 10.00% | Δε | 6.7 |
| CCP-3F.F.F | 10.00% | $\gamma_1$ | 94 mPa·s |
| PCH-301 | 11.00% | | |
| PCH-302 | 10.00% | | |
| CCH-303 | 9.00% | | |
| CCH-501 | 8.00% | | |
| CH-33 | 4.00% | | |
| CH-35 | 4.00% | | |
| CH-43 | 4.00% | | |
| CH-45 | 3.00% | | |
| CCPC-33 | 3.00% | | |
| CCPC-35 | 3.00% | | |
| CCP-3-1 | 5.00% | | |

Example 4

The nematic LC host mixture N4 is formulated as follows.

| | | | |
|---|---|---|---|
| ME2N.F | 8.00% | cl.p. | 71.0° C. |
| ME3N.F | 8.00% | Δn | 0.0900 |
| PUQU-3-F | 11.00% | Δε | 13.0 |
| CCP-3F.F.F | 10.00% | $\gamma_1$ | 105 mPa·s |
| PCH-301 | 10.00% | | |
| PCH-302 | 10.00% | | |
| CCH-303 | 9.00% | | |
| CCH-501 | 8.00% | | |
| CH-33 | 4.00% | | |
| CH-35 | 4.00% | | |
| CH-43 | 4.00% | | |
| CH-45 | 3.00% | | |
| CCPC-33 | 3.00% | | |
| CCPC-35 | 3.00% | | |
| CCP-3-1 | 5.00% | | |

Example 5

The nematic LC host mixture N5 is formulated as follows.

| | | | |
|---|---|---|---|
| GUQU-3-F | 8.00% | cl.p. | 74.5° C. |
| GUQGU-3-F | 8.00% | Δn | 0.0874 |
| PUQU-3-F | 11.00% | Δε | 8.6 |
| CCP-3F.F.F | 10.00% | $\gamma_1$ | 111 mPa·s |
| PCH-301 | 10.00% | | |
| PCH-302 | 10.00% | | |
| CCH-303 | 9.00% | | |
| CCH-501 | 8.00% | | |
| CH-33 | 4.00% | | |
| CH-35 | 4.00% | | |
| CH-43 | 4.00% | | |
| CH-45 | 3.00% | | |
| CCPC-33 | 3.00% | | |
| CCPC-35 | 3.00% | | |
| CCP-3-1 | 5.00% | | |

Example 6

The nematic LC host mixture N6 is formulated as follows.

| | | | |
|---|---|---|---|
| DUUQU-3-F | 8.00% | cl.p. | 77.5° C. |
| DUUQU-4-F | 8.00% | Δn | 0.0833 |
| PUQU-3-F | 11.00% | Δε | 10.1 |
| CCP-3F.F.F | 5.00% | $\gamma_1$ | 116 mPa·s |
| PCH-301 | 15.00% | | |
| PCH-302 | 10.00% | | |
| CCH-303 | 9.00% | | |
| CCH-501 | 8.00% | | |
| CH-33 | 4.00% | | |
| CH-35 | 4.00% | | |
| CH-43 | 4.00% | | |
| CH-45 | 3.00% | | |
| CCPC-33 | 3.00% | | |
| CCPC-35 | 3.00% | | |
| CCP-3-1 | 5.00% | | |

Example 7

The nematic LC host mixture N7 is formulated as follows.

| | | | |
|---|---|---|---|
| CC-3-V | 8.00% | cl.p. | 76.5° C |
| PP-1-2V1 | 8.00% | Δn | 0.0837 |
| PUQU-3-F | 11.00% | Δε | 3.4 |
| CCP-3F.F.F | 10.00% | $\gamma_1$ | 83 mPa·s |
| PCH-301 | 10.00% | | |
| PCH-302 | 10.00% | | |
| CCH-303 | 9.00% | | |
| CCH-501 | 8.00% | | |
| CH-33 | 4.00% | | |
| CH-35 | 4.00% | | |
| CH-43 | 4.00% | | |
| CH-45 | 3.00% | | |
| CCPC-33 | 3.00% | | |
| CCPC-35 | 3.00% | | |
| CCP-3-1 | 5.00% | | |

Example 8

The nematic LC host mixture N8 is formulated as follows.

| | | | |
|---|---|---|---|
| PUQU-2-F | 10.00% | cl.p. | 72.8° C. |
| PUQU-3-F | 10.00% | Δn | 0.0969 |
| CCP-2F.F.F | 8.00% | Δε | 6.5 |
| CCP-3F.F.F | 10.00% | $\gamma_1$ | 85 mPa·s |
| PCH-301 | 10.00% | | |
| PCH-302 | 10.00% | | |
| CCH-303 | 9.00% | | |
| CCH-501 | 7.00% | | |
| CCP-3-1 | 8.00% | | |
| CCP-3-3 | 6.00% | | |
| CBC-33 | 4.00% | | |

-continued

| | | | |
|---|---|---|---|
| BCH-32 | 6.00% | | |
| CPGP-5-2 | 2.00% | | |

Example 9

The nematic LC host mixture N9 is formulated as follows.

| | | | |
|---|---|---|---|
| PUQU-3-F | 10.00% | cl.p. | 74.7° C |
| CCP-2F.F.F | 9.00% | $\Delta n$ | 0.0929 |
| CCP-3F.F.F | 10.00% | $\Delta\varepsilon$ | 4.0 |
| PCH-53 | 7.00% | $\gamma_1$ | 81 mPa·s |
| PCH-301 | 10.00% | | |
| PCH-302 | 10.00% | | |
| CCH-303 | 9.00% | | |
| CCH-501 | 7.00% | | |
| CCP-3-1 | 8.00% | | |
| CCP-3-3 | 6.00% | | |
| CBC-33 | 4.00% | | |
| BCH-32 | 8.00% | | |
| CPGP-5-2 | 2.00% | | |

Example 10

The nematic LC host mixture N10 is formulated as follows.

| | | | |
|---|---|---|---|
| PUQU-2-F | 10.00% | cl.p. | 79.8° C |
| PUQU-3-F | 12.00% | $\Delta n$ | 0.0895 |
| ACQU-3-F | 9.00% | $\Delta\varepsilon$ | 6.6 |
| BCH-32 | 5.00% | $\gamma_1$ | 64 mPa·s |
| CCP-3-1 | 9.00% | | |
| CCP-3-3 | 6.00% | | |
| CC-3-V | 33.00% | | |
| CCP-V-1 | 16.00% | | |

Example 11

The nematic LC host mixture N11 is formulated as follows.

| | | | |
|---|---|---|---|
| CC-3-V | 13.00% | cl.p. | 80.5° C |
| CC-3-V1 | 3.50% | $\Delta n$ | 0.1021 |
| CCP-V-1 | 8.00% | $\Delta\varepsilon$ | 10.3 |
| PUQU-3-F | 9.00% | $\varepsilon_\parallel$ | 14.1 |
| CCQU-2-F | 4.00% | $\gamma_1$ | 99 mPa·s |
| CCQU-3-F | 9.00% | | |
| CCQU-5-F | 10.00% | | |
| PGP-2-3 | 3.00% | | |
| PGP-2-4 | 4.00% | | |
| CCP-2F.F.F | 4.00% | | |
| CCP-3F.F.F | 6.00% | | |
| CCP-3OCF3 | 7.00% | | |
| BCH-3F.F.F | 3.00% | | |
| CCGU-3-F | 3.50% | | |
| PCH-3 | 13.00% | | |

Example 12

The nematic LC host mixture N12 is formulated as follows.

| | | | |
|---|---|---|---|
| CC-3-V | 40.00% | cl.p. | 82.0° C |
| CCP-V-1 | 16.00% | $\Delta n$ | 0.1025 |

-continued

| | | | |
|---|---|---|---|
| PGP-2-3 | 3.00% | $\Delta\varepsilon$ | 10.3 |
| PGP-2-4 | 4.00% | $\varepsilon_\parallel$ | 13.9 |
| PUQU-3-F | 10.00% | $\gamma_1$ | 74 mPa·s |
| APUQU-2-F | 5.00% | | |
| APUQU-3-F | 10.00% | | |
| CDUQU-3-F | 12.00% | | |

Example 13

The nematic LC host mixture N13 is formulated as follows.

| | | | |
|---|---|---|---|
| PGU-2-F | 7.00 | cl.p. | 80.0° C |
| PGU-3-F | 8.00 | $\Delta n$ | 0.1026 |
| CC-3-V1 | 13.00 | $\Delta\varepsilon$ | 6.9 |
| CC-5-V | 15.00 | $\varepsilon_\parallel$ | 10.2 |
| PCH-302 | 8.50 | $\gamma_1$ | 84 mPa·s |
| CCP-V-1 | 10.00 | | |
| CCP-V2-1 | 7.00 | | |
| CCG-V-F | 8.00 | | |
| PUQU-3-F | 8.50 | | |
| CCQU-3-F | 9.00 | | |
| CCQU-5-F | 4.00 | | |
| CCOC-3-3 | 2.00 | | |

Example 14

The nematic LC host mixture N14 is formulated as follows.

| | | | |
|---|---|---|---|
| APUQU-2-F | 6.00 | cl.p. | 79.5° C |
| APUQU-3-F | 6.00 | $\Delta n$ | 0.1086 |
| CC-3-V | 44.50 | $\Delta\varepsilon$ | 9.6 |
| CC-3-V1 | 4.00 | $\varepsilon_\parallel$ | 12.9 |
| CCP-3OCF3 | 7.00 | $\gamma_1$ | 67 mPa·s |
| CCP-V-1 | 5.00 | | |
| CPGU-3-OT | 3.00 | | |
| PGP-2-2V | 5.50 | | |
| PGUQU-3-F | 3.00 | | |
| PGUQU-4-F | 7.00 | | |
| PGUQU-5-F | 3.00 | | |
| PUQU-3-F | 6.00 | | |

Example 15

The nematic LC host mixture N15 is formulated as follows.

| | | | |
|---|---|---|---|
| CGU-3-F | 7.00 | cl.p. | 82.0° C |
| CCP-1F.F.F | 7.00 | $\Delta n$ | 0.0781 |
| CCP-2F.F.F | 10.00 | $\Delta\varepsilon$ | 9.1 |
| CCP-3F.F.F | 10.00 | $\varepsilon_\parallel$ | 12.8 |
| CCQU-2-F | 10.00 | $\gamma_1$ | 125 mPa·s |
| CCQU-3-F | 10.00 | | |
| CCQU-5-F | 10.00 | | |
| CCP-3OCF3.F | 8.00 | | |
| CCP-2OCF3 | 6.00 | | |
| CCP-3OCF3 | 6.00 | | |
| CCP-5OCF3 | 3.00 | | |
| BCH-32 | 4.00 | | |
| CCH-23 | 5.00 | | |
| CCH-301 | 4.00 | | |

Example 16

The nematic LC host mixture N16 is formulated as follows.

| | | | | |
|---|---|---|---|---|
| PUQU-3-F | 5.50 | cl.p. | 80.1° C | |
| CC-3-V | 40.00 | $\Delta n$ | 0.1095 | |
| CC-3-V1 | 10.00 | $\Delta\varepsilon$ | 9.1 | |
| CCP-V-1 | 10.00 | $\varepsilon_\parallel$ | 12.4 | |
| APUQU-2-F | 5.00 | $\gamma_1$ | 65 mPa·s | |
| APUQU-3-F | 10.50 | | | |
| PGUQU-3-F | 3.50 | | | |
| PGUQU-4-F | 8.00 | | | |
| PGP-2-2V | 7.50 | | | |

Example 17

The nematic LC host mixture N17 is formulated as follows.

| | | | | |
|---|---|---|---|---|
| PUQU-3-F | 13.50 | cl.p. | 83.3° C | |
| APUQU-3-F | 3.50 | $\Delta n$ | 0.0995 | |
| PGUQU-3-F | 4.25 | $\Delta\varepsilon$ | 6.5 | |
| CC-3-V | 33.50 | $\varepsilon_\parallel$ | 9.5 | |
| CC-3-V1 | 7.00 | $\gamma_1$ | 69 mPa·s | |
| PP-1-2V1 | 3.25 | | | |
| CCP-V-1 | 9.50 | | | |
| CCP-V2-1 | 12.00 | | | |
| ECCP-5F.F | 10.00 | | | |
| PPGU-3-F | 2.00 | | | |
| PGUQU-4-F | 1.50 | | | |
| PGUQU-3-F | 4.25 | | | |

Example 18

The nematic LC host mixture N18 is formulated as follows.

| | | | | |
|---|---|---|---|---|
| CC-3-V | 40.00% | cl.p. | 81.5° C | |
| CC-3-V1 | 8.00% | $\Delta n$ | 0.0827 | |
| PUQU-2-F | 3.00% | $\Delta\varepsilon$ | 9.4 | |
| PUQU-3-F | 8.00% | $\varepsilon_\parallel$ | 12.8 | |
| APUQU-2-F | 7.00% | $\gamma_1$ | 75 mPa·s | |
| APUQU-3-F | 7.00% | | | |
| CCP-3-1 | 7.00% | | | |
| CCOC-3-3 | 5.00% | | | |
| CCOC-4-3 | 5.00% | | | |
| CDUQU-3-F | 10.00% | | | |

Example 19

The nematic LC host mixture N19 is formulated as follows.

| | | | | |
|---|---|---|---|---|
| APUQU-2-F | 6.00% | cl.p. | 80.0° C | |
| APUQU-3-F | 8.00% | $\Delta n$ | 0.1125 | |
| CC-3-V | 26.00% | $\Delta\varepsilon$ | 10.5 | |
| CCP-V-1 | 14.00% | $\varepsilon_\parallel$ | 15.6 | |
| CCP-V2-1 | 12.00% | $\gamma_1$ | 95 mPa·s | |
| DGUQU-4-F | 5.00% | | | |
| DPGU-4-F | 5.00% | | | |
| PGP-2-2V | 4.50% | | | |
| PGUQU-3-F | 5.00% | | | |
| PGUQU-4-F | 3.00% | | | |
| PPGU-3-F | 0.50% | | | |
| Y-4O-O4 | 11.00% | | | |

Polymerisable Mixtures

Mixture preparation: LC mixtures for polymer wall formation were prepared by mixing LC host, monomer and photoinitiator and then homogenizing the resulting mixture by heating above the clearing point. The structures of the monomer (including its formula and name in the composition table) are listed below. The mixture compositions are shown in Table 1.

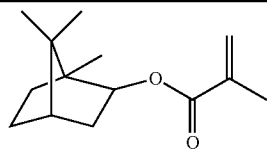

M1a
(IBOMA)
I1a1

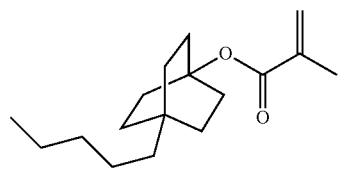 [SMILES: C=C(C)C(=O)OC12CCC(CCCCC)(CC1)CC2]

M1b
I2a1

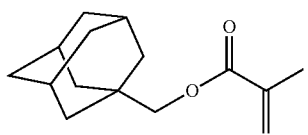 [SMILES: C=C(C)C(=O)OCC12CC3CC(CC(C3)C1)C2]

M1c
I3a3

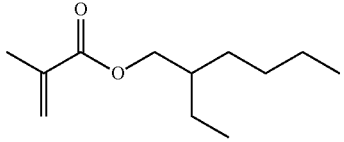

M2a
(EHMA)
II1a1

-continued
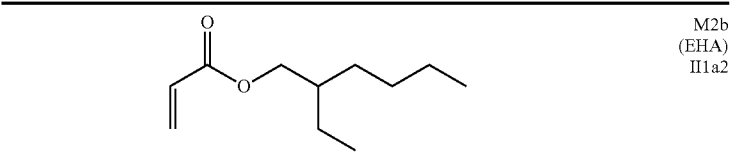
M2b
(EHA)
II1a2
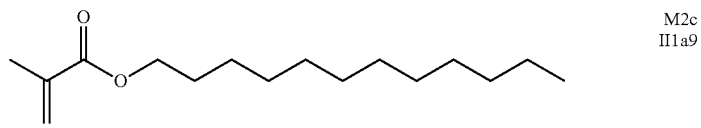
M2c
II1a9
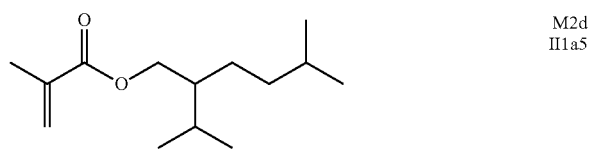
M2d
II1a5
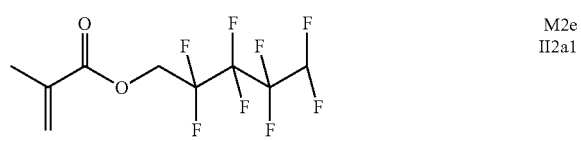
M2e
II2a1
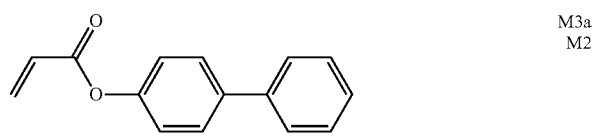
M3a
M2
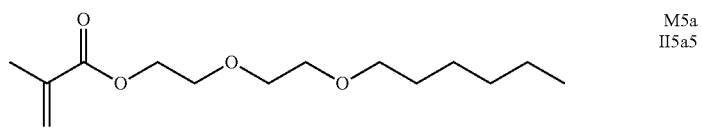
M5a
II5a5
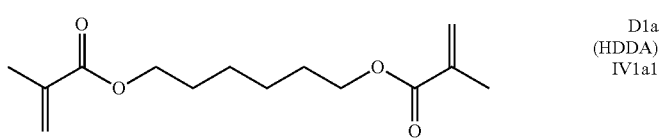
D1a
(HDDA)
IV1a1
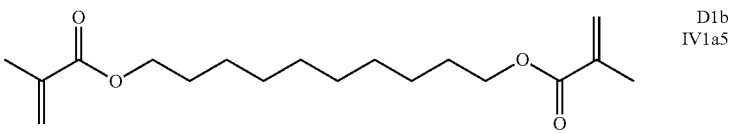
D1b
IV1a5
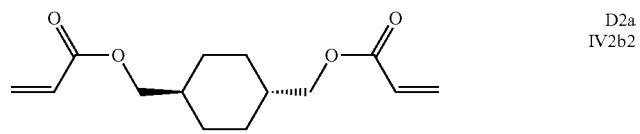
D2a
IV2b2
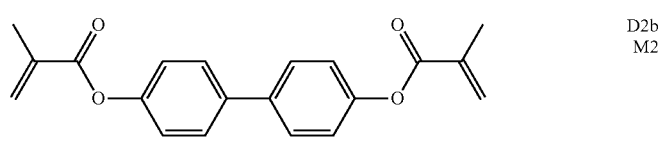
D2b
M2
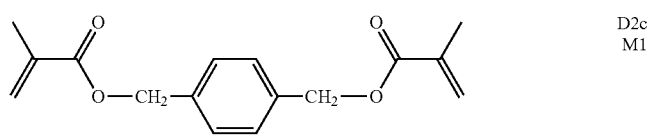
D2c
M1

-continued

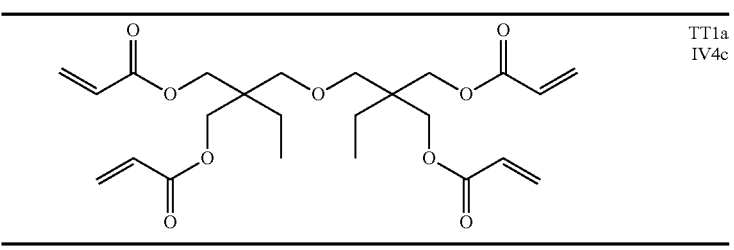

TT1a
IV4c

TABLE 1

Mixture Compositions

| No. | Host | [Host] (%) | Monomer 1 | [Monomer 1] (%) | Monomer 2 | [Monomer 2] (%) | Monomer 3 | [Monomer 3] (%) | IRG-651 [%] |
|---|---|---|---|---|---|---|---|---|---|
| 1 | N1 | 79.8 | M1a | 15.0 | M2b | 5.0 | | | 0.20 |
| 2 | N2 | 79.8 | M1a | 15.0 | M2a | 5.0 | | | 0.20 |
| 3 | N3 | 79.8 | M1a | 15.0 | M2a | 5.0 | | | 0.20 |
| 4 | N4 | 79.8 | M1a | 15.0 | M2a | 5.0 | | | 0.20 |
| 5 | N5 | 79.8 | M1a | 15.0 | M2a | 5.0 | | | 0.20 |
| 6 | N6 | 79.8 | M1a | 15.0 | M2a | 5.0 | | | 0.20 |
| 7 | N7 | 79.8 | M1a | 15.0 | M2a | 5.0 | | | 0.20 |
| 8 | N8 | 79.8 | M1a | 15.0 | M2a | 5.0 | | | 0.20 |
| 9 | N9 | 79.8 | M1a | 15.0 | M2a | 5.0 | | | 0.20 |
| 10 | N10 | 79.8 | M1a | 15.0 | M2a | 5.0 | | | 0.20 |
| 11 | N11 | 87.4 | M1a | 9.38 | M2b | 3.13 | | | 0.13 |
| 12 | N12 | 87.9 | M1a | 5.00 | M2e | 7.00 | | | 0.12 |
| 13 | N12 | 87.9 | M1a | 4.00 | M2e | 7.00 | D1a | 1.0 | 0.12 |
| 14 | N13 | 84.7 | M1a | 10.9 | M2b | 4.3 | | | 0.15 |
| 15 | N14 | 84.65 | M1a | 10.4 | M2b | 4.3 | M3a | 0.5 | 0.15 |
| 16 | N15 | 84.85 | M1a | 4.67 | M2b | 9.33 | D1a | 1.00 | 0.15 |
| 17 | N14 | 84.85 | M1a | 9.33 | M2b | 4.67 | D1a | 1.00 | 0.15 |
| 18 | N14 | 84.85 | M1c | 4.67 | M2b | 9.33 | D1a | 1.00 | 0.15 |
| 19 | N14 | 84.85 | M1a | 9.33 | M2c | 4.67 | D1a | 1.00 | 0.15 |
| 20 | N15 | 84.85 | M1a | 9.33 | M2c | 4.67 | D1a | 1.00 | 0.15 |
| 21 | N16 | 86.87 | M1c | 6.00 | M2c | 6.00 | D1a | 1.00 | 0.13 |
| 22 | N16 | 86.87 | M1c | 5.88 | M2c | 5.88 | D1b | 1.25 | 0.13 |
| 23 | N16 | 86.87 | M1c | 5.94 | M2c | 5.94 | D2a | 1.12 | 0.13 |
| 24 | N16 | 86.87 | M1c | 5.93 | M2c | 5.93 | D2b | 1.14 | 0.13 |
| 25 | N17 | 81.82 | M1a | 5.60 | M2b | 11.20 | TT1a | 1.20 | 0.18 |
| 26 | N18 | 84.85 | M1a | 9.33 | M2a | 4.67 | D1a | 1.00 | 0.13 |
| 27 | N19 | 84.86 | M1a | 4.67 | M5a | 9.33 | D2c | 1.00 | 0.15 |

Monomers/Initiator: The monomers ethyl hexyl methacrylate (EHMA, Aldrich, 290807) of formula IIa1, ethyl hexyl acrylate (EHA, Aldrich, 290815) of formula IIa2 and isobornyl methacrylate (IBOMA, Aldrich, 392111) of formula I1a1 were purified by column chromatography. The photoinitiator 2,2-dimethoxy-2-phenylacetophenone (IRG-651®, Aldrich, 196118) was used as received.

Device Examples

Test Cells: The test cells comprise two glass substrates coated with ITO, which are kept apart by spacer particles or foils at a layer thickness of 3-4 microns and glued together by an adhesive (usually Norland, NEA 123). On top of the electrode layers polyimide alignment layers (Nissan SE-6514 or SE2414) are applied which are rubbed parallel or antiparallel.

Wall formation: The test cells are filled with the LC medium and placed on a black, non-reflecting surface. A photomask was placed on top of the test cells and the sample was subjected for 30 min to UV radiation (Hg/Xe arch lamp, LOT QuantumDesign Europe, LS0205, intensity at sample 4 mW/cm$^2$ measured at 365+/−10 nm FWHM). Radiation of the emission spectrum below 320 nm were removed by a dichroic mirror.

Characterization: Samples were analyzed under a polarization microscope. The isotropic polymer walls could clearly be distinguished from areas containing birefringend LC. The width of the walls and inclusions of LC into the polymer walls, and defects in the pixel area caused by contamination of polymer, or misalignment of the LC caused by the wall formation process were observed.

Mechanical stress test: Test cells were subjected to a mechanical stress by applying pressure to the top substrate by a 0.5 mm$^2$ tip with a force of 10N for 10 s. Damages to the polymer wall structure were evaluated with the polarization microscope.

It was observed that the polymer wall structure did not show significant damages caused by mechanical stress.

Electron micrographs: The structure of the polymer walls and contamination of the pixel area by polymer was investigated by taking electron micrographs. The samples were prepared by either lifting off the top substrate for top-view images, or breaking the glass slides in half for viewing the cross section of the walls. The LC was removed by flushing the sample with cyclohexane, subsequently the substrates was dried in an air flow and sputter coated with a conductive layer (gold).

Electro-optical characterization: The electro-optical properties of the liquid crystal host were characterized by applying an electrical potential between 0 and 10V in steps of 0.05V. The resulting response was recorded by measuring the transmission change of the sample in between crossed polarizers (DMS 301 equipped with integration sphere).

It was observed that the electrooptical properties of the liquid crystal host were not significantly affected by the polymer wall structures.

Example A

Figure 2:
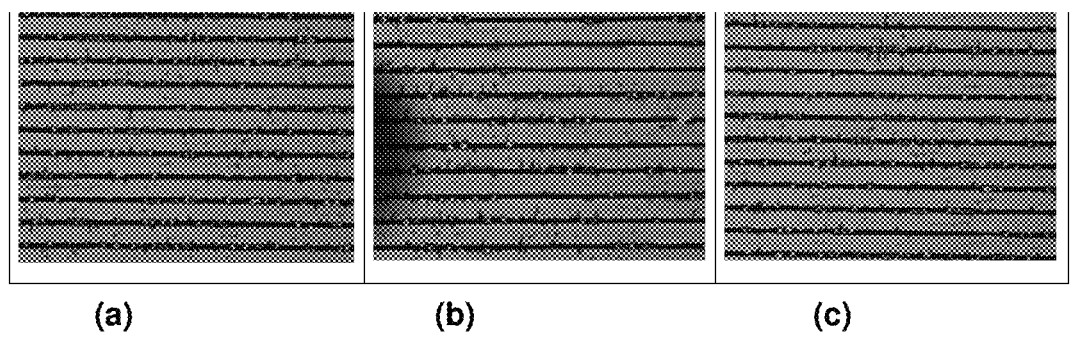
FIG. 2 shows polarization microscope images of a test cell of Device Example A containing polymerisable LC mixture 27 after polymerization (a), after mechanical stress test (b) and after thermal stress test (c).

Polymerisable LC mixture 27 is filled into a test cell and subjected to UV irradiation under a photomask as described above. FIG. 2 shows polarization microscope images of the test cell, after polymerization (a), after mechanical stress test (b) and after thermal stress test (c). The formed polymer walls can be seen as dark lines.

The invention claimed is:

1. A liquid crystal (LC) medium comprising
a polymerisable component A) which comprises:
one or more first polymerisable compounds comprising a polymerisable group and a bi- or polycylic hydrocarbon group, selected from the following formulae I1 to I4:

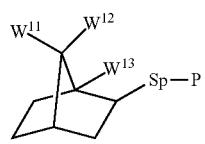

I1

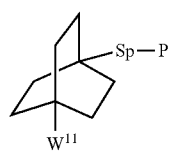

I2

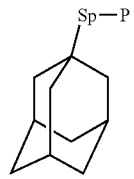

I3

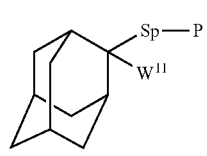

I4 wherein
P is a polymerisable group,
Sp is a spacer group or a single bond,
$W^{11}$, $W^{12}$ and $W^{13}$ are independently of each other H, F or $C_1$-$C_{12}$-alkyl, and
the cycloalkyl ring system in each of formulae I1 to I4 is optionally substituted with one or more groups L, where L is F, Cl, —CN, —$NO_2$—NCO, —NCS, —OCN, —SCN, —C(=O)N($R^x$)$_2$, —C(=O)$Y^1$, —C(=O)$R^x$, —N($R^x$)$_2$, optionally substituted silyl, optionally substituted aryl or heteroaryl having 5 to 20 ring atoms, or straight-chain or branched alkyl having 1 to 25, in which, in addition, one or more non-adjacent $CH_2$ groups may each be replaced, independently of one another, by —C($R^0$)=C($R^{00}$)—, —C≡C—, —N($R^0$)—, —O—, —S—, —CO—, —CO—O—, —O—CO—, —O—CO—O— in such a way that O and/or S atoms are not linked directly to one another, and in which, in addition, one or more H atoms may be replaced by F, Cl, —CN, $R^x$ is H, F, Cl, CN, or straight chain, branched or cyclic alkyl having 1 to 25 C atoms, wherein one or more non-adjacent $CH_2$-groups are optionally replaced by —O—, —S—, —CO—, —CO—O—, —O—CO—, —O—CO—O— in such a manner that O- and/or S-atoms are not directly connected with each other, and wherein one or more H atoms are each optionally replaced by F or Cl, $R^0$, $R^{00}$ are H or alkyl having 1 to 20 C atoms, and
$Y^1$ is halogen;

one or more second polymerisable compounds comprising a polymerisable group and a straight-chain, branched or monocyclic hydrocarbon group, selected from compounds of the formula II:

P-Sp-$G^2$     II wherein P and Sp independently have the meanings given above, and $G^2$ is a straight-chain, branched or monocyclic alkyl group with 1 to 20 C atoms that is optionally mono-, poly- or perfluorinated and is optionally substituted by one or more groups L independently as defined above, and wherein one or more $CH_2$-groups in the alkyl group are optionally replaced by —O—, —CO—, —O—CO— or —CO—O— such that O-atoms are not directly adjacent to one another; and a liquid-cystalline component B) which comprises one or more compounds selected from formula A and B:

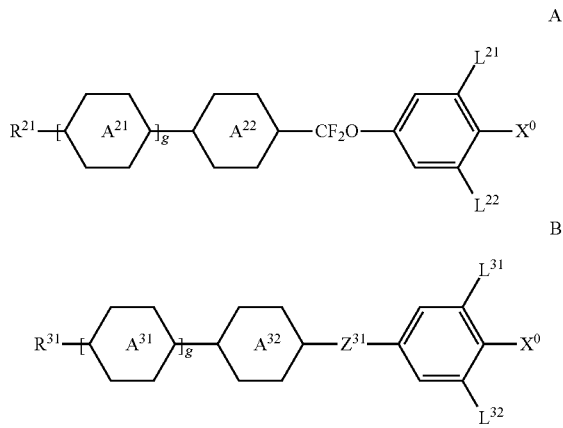

in which the individual radicals have, independently of each other and on each occurrence identically or differently, the following meanings:

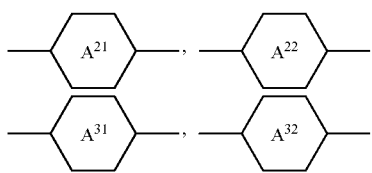

each, independently of one another, and on each occurrence, identically or differently, are:

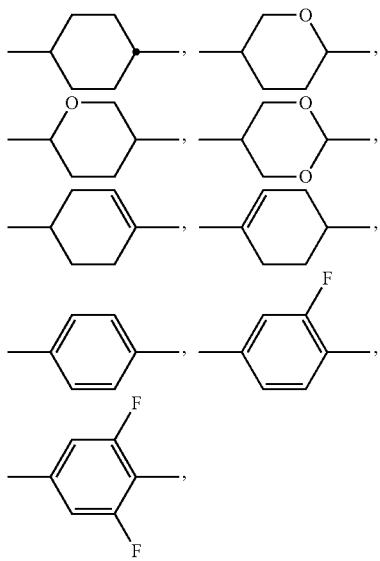

$R^{21}$, $R^{31}$ each, independently of one another, are alkyl, alkoxy, oxaalkyl or alkoxyalkyl having 1 to 9 C atoms or alkenyl or alkenyloxy having 2 to 9 C atoms, all of which are optionally fluorinated, $X^0$ is F, Cl, halogenated alkyl or alkoxy having 1 to 6 C atoms or halogenated alkenyl or alkenyloxy having 2 to 6 C atoms, $z^{31}$ is —CH$_2$CH$_2$—, —CF$_2$CF$_2$—, —COO—, trans-CH═CH—, trans-CF═CF—, —CH$_2$O— or a single bond, $L^{21}$, $L^{22}$, $L^{31}$, $L^{32}$ each, independently of one another, are H or F, and g is 0, 1, 2 or 3.

2. The LC medium according to claim 1, wherein component A) comprises one or more first polymerisable compounds selected from the following formulae I1a1
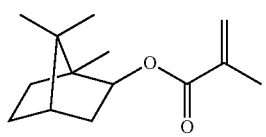

I1a2
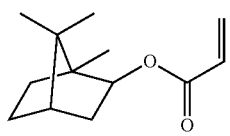

I2a1
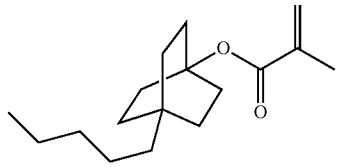

I2a2
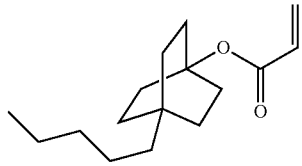

I3a1
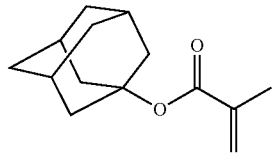

I3a2
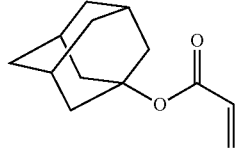

I3a3
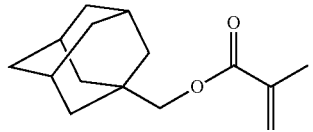

I3a4
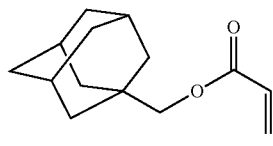

I3a5
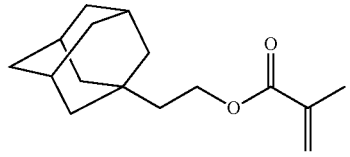

I3a6
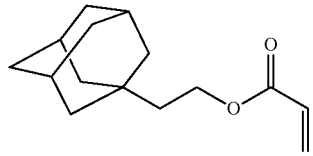

I3a7
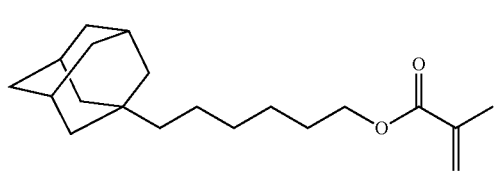

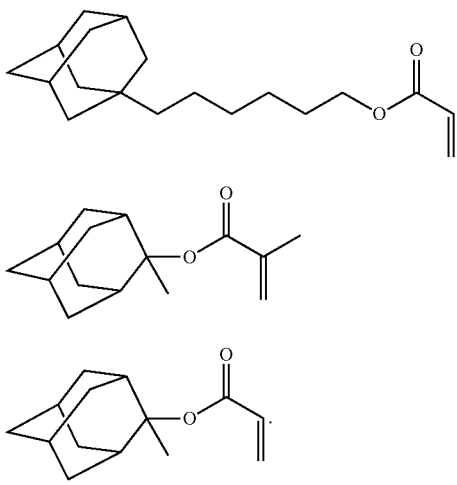

I3a8

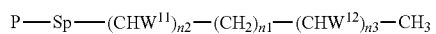

I4a1

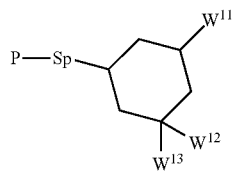

I4a2

3. The LC medium according to claim 1, wherein component A) comprises one or more second polymerisable compounds selected from the following formulae P—Sp—(CHW$^{11}$)$_{n2}$—(CH$_2$)$_{n1}$—(CHW$^{12}$)$_{n3}$—CH$_3$   II1

P—Sp—(CH$_2$)$_{n2}$—(CF$_2$)$_{n1}$—CFW$^{13}$W$^{14}$   II2

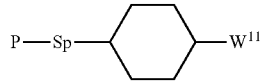

II3

II4

P—Sp—(CH$_2$)$_{n6}$—(CH$_2$CH$_2$O)$_{n5}$—(CH$_2$)$_{n7}$—CH$_3$   II5 wherein the individual radicals, independently of each other and on each occurrence identically or differently, have the following meanings P, Sp are as defined in claim 1,
W$^{11}$, W$^{12}$ are H, F or C$_1$-C$_{12}$-alkyl,
W$^{13}$, W$^{14}$ are H or F,
n1 is an integer from 2 to 15,
n2, n3 are 0 or an integer from 1 to 3,
n5 is an integer from 1 to 5, and
n6, n7 are 0 or an integer from 1 to 15.

4. The LC medium according to claim 1 wherein component A) comprises one or more second polymerisable compounds selected from the following formulae

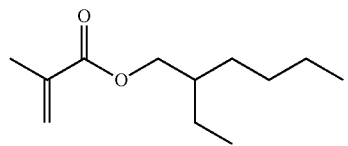

III a1

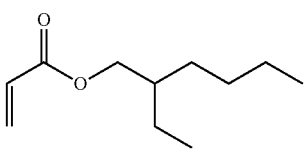

III a2

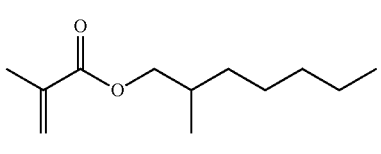

III a3

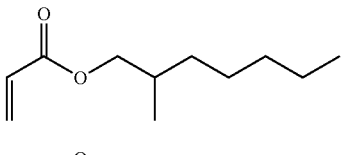

III a4

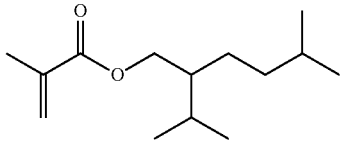 [SMILES: C=C(C)C(=O)OCC(CCC(C)C)C(C)C]

III a5

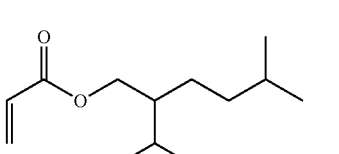

III a6

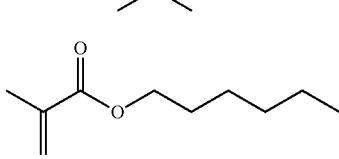

III a7

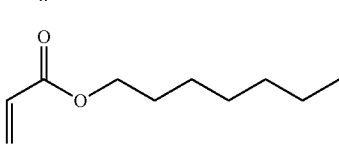

III a8

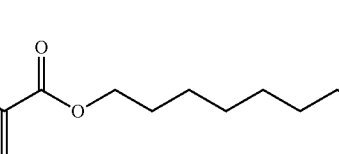

III a9

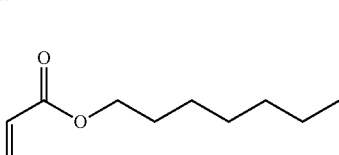

III a10

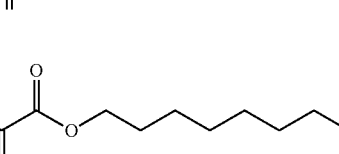

III a11

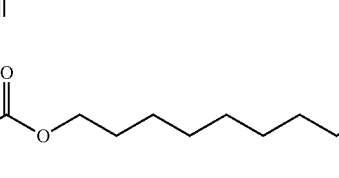

III a12

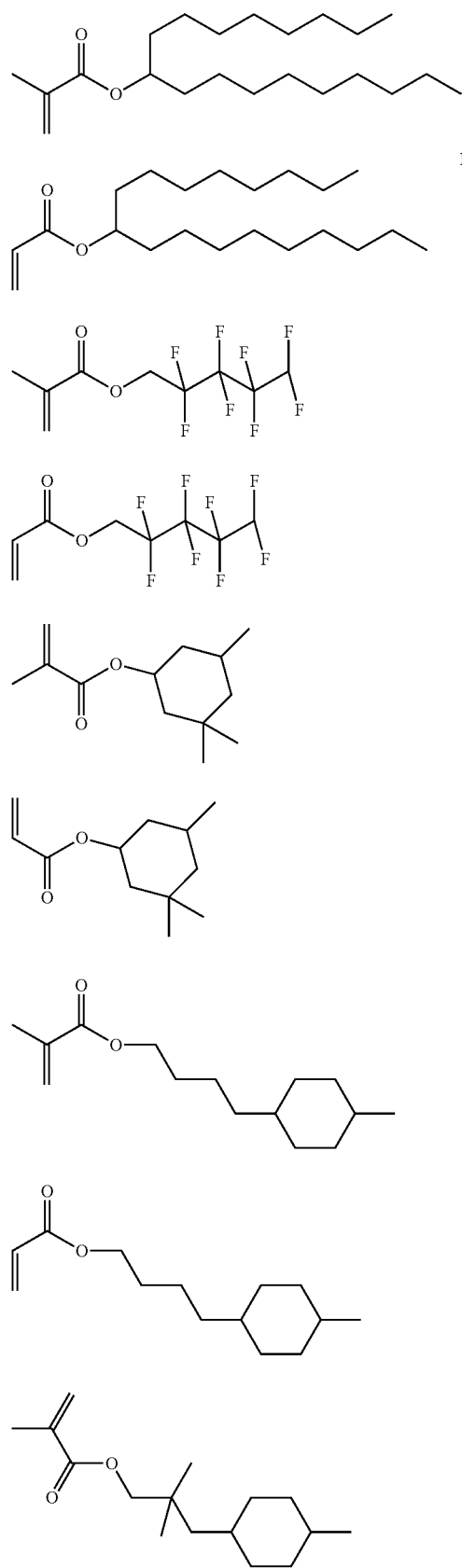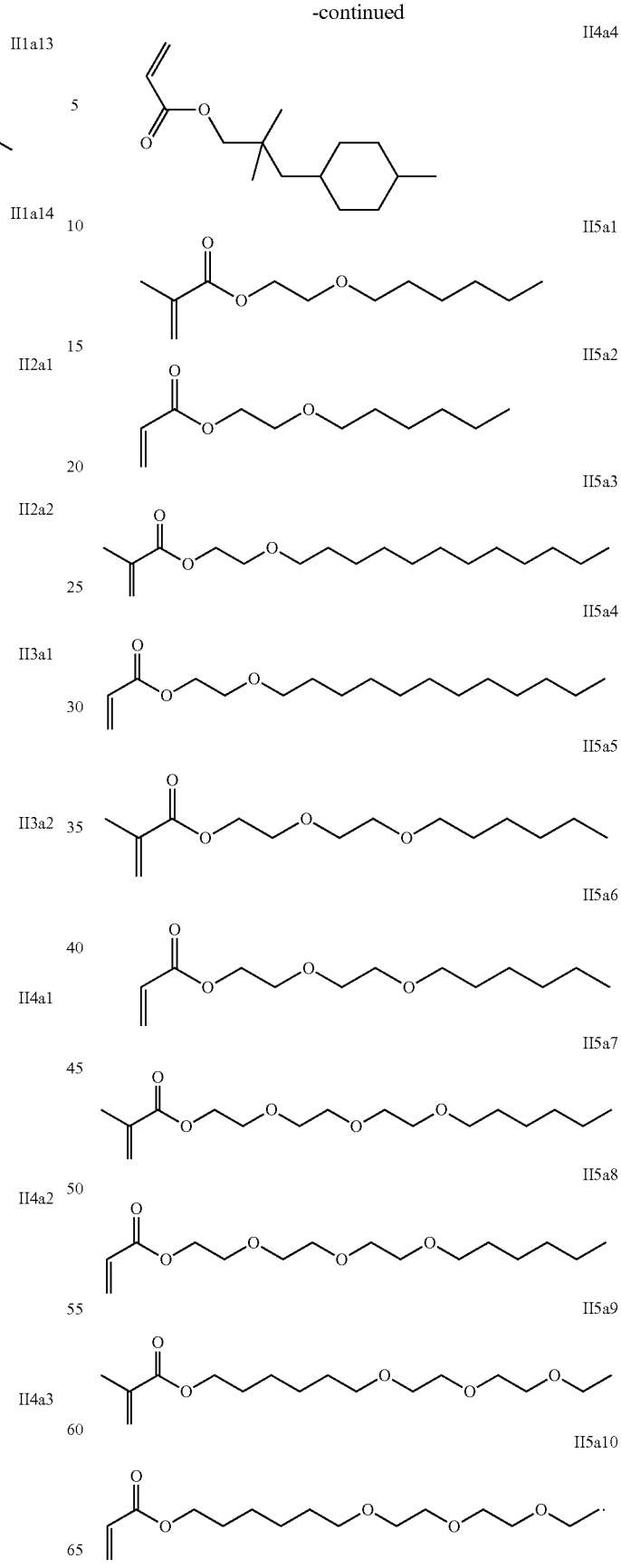

5. The LC medium according to claim 1, wherein component A) further comprises one or more polymerisable compounds which have two or more polymerisable groups and a straight-chain, branched or monocyclic hydrocarbon group.

6. The LC medium according to claim 5, wherein the further one or more polymerisable compounds which have two or more polymerisable groups are selected from compounds of the formula IV:

$$P^1\text{-}Sp^1\text{-}G^2\text{-}Sp^2\text{-}P^2 \qquad \text{IV}$$

wherein $G^2$ is as previously defined, $P^1$ and $P^2$ are, independently, as defined for P and $Sp^1$ and $Sp^2$ are, independently, as defined for Sp.

7. The LC medium according to claim 6, wherein the further one or more component A) polymerisable compounds which have two or more polymerisable groups are selected from compounds of the following formulae:

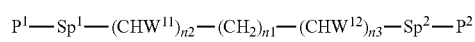  IV1

  IV2

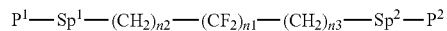  IV3 wherein $P^1$, $P^2$, $Sp^1$, $Sp^2$ are as defined in claim 6,
$W^{11}$, $W^{12}$ are H, F or $C_1$-$C_{12}$-alkyl,
$W^{13}$, $W^{14}$ are H or F,
n1 is an integer from 2 to 15,
n2, n3 are 0 or an integer from 1 to 3,
n5 is an integer from 1 to 5,
n6, n7 are 0 or an integer from 1 to 15 and
the cyclohexylene ring in formula IV2 is optionally substituted by one or more identical or different groups $W^{11}$.

8. The LC medium according to claim 6, wherein the further one or more polymerisable compounds which have two or more polymerisable groups are selected from compounds of the following formulae

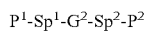  IV1a1

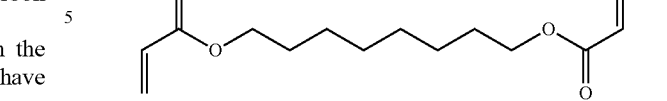

IV1a2

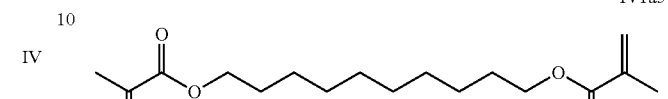

IV1a3

IV1a4

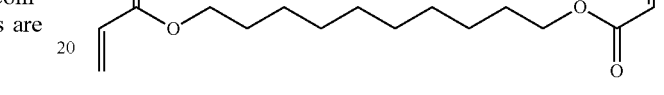

IV1a5

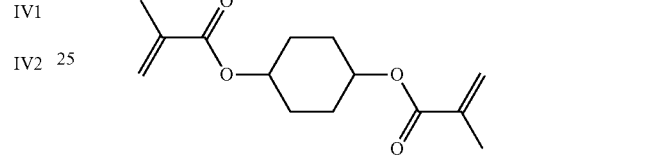

IV1a6

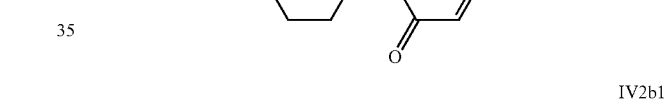

IV2a1

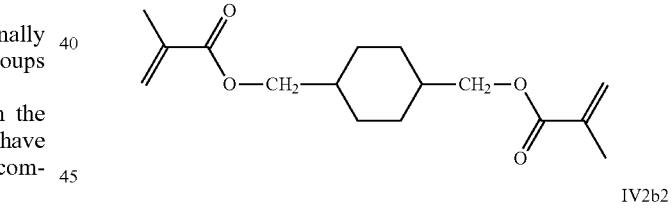

IV2a2

IV2b1

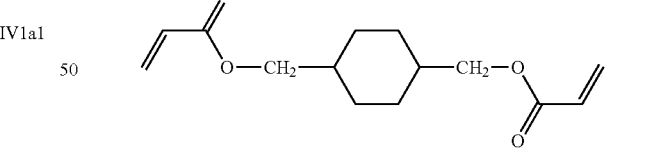

IV2b2

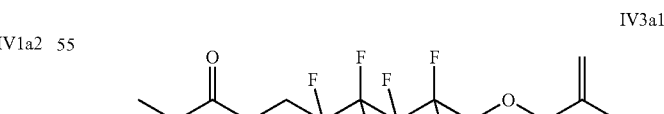

IV3a1

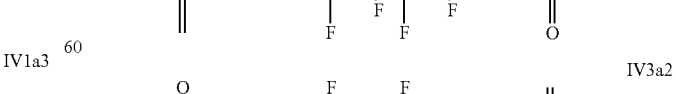

IV3a2

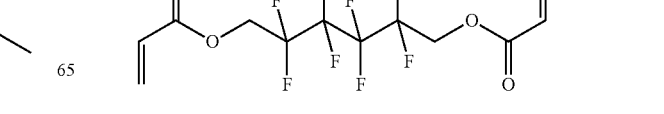
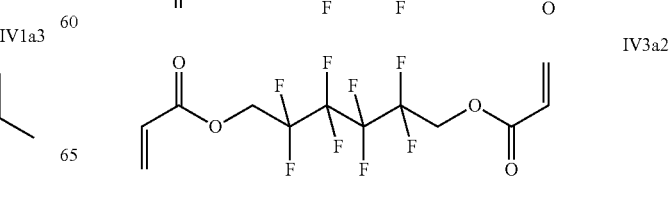

-continued

IV4a
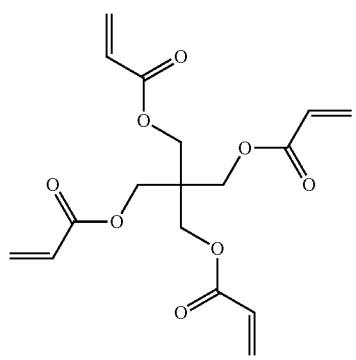

IV4b
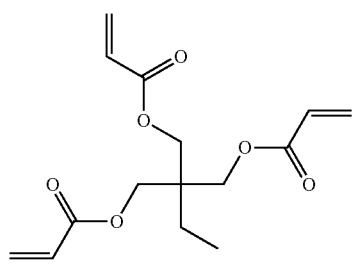

IV4c
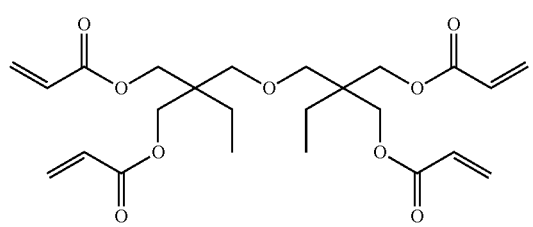 [SMILES: C=CC(=O)OCC(CC)(COCC(CC)(COC(=O)C=C)COC(=O)C=C)COC(=O)C=C]

IV4d
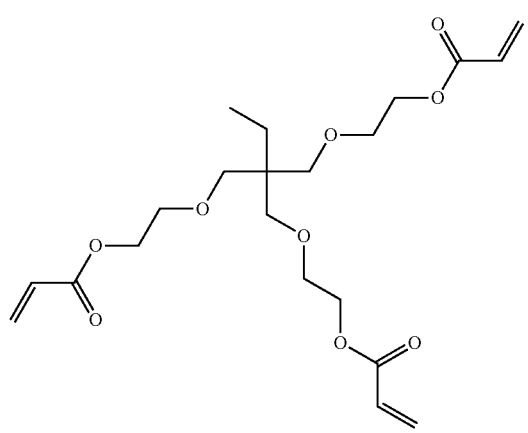

IV4e
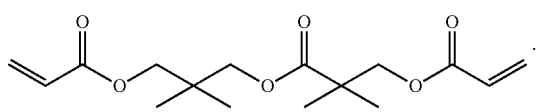

9. The LC medium according to claim 1, wherein the concentration of the first and second polymerisable compounds in the LC medium is from 1 to 30% by weight.

10. The LC medium according to claim 1, wherein the ratio of first polymerisable compounds relative to the second polymerisable compounds in the LC medium is from 10:1 to 1:10.

11. The LC medium according to claim 1, wherein component B) comprises one or more compounds of formula A selected from the group consisting of compounds of the following formulae:

A1
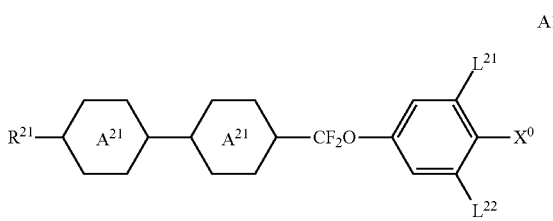

A2
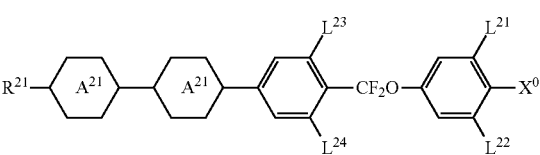

A3
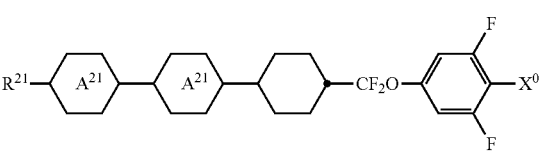

A4
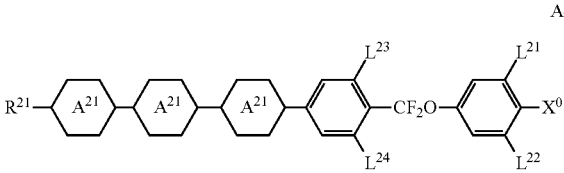

in which $A^{21}$, $R^{21}$, $X^0$, $L^{21}$ and $L^{22}$ have the meanings given in claim 1, and $L^{23}$ and $L^{24}$ each, independently of one another, are H or F.

12. The LC medium according to claim 1, wherein component B) comprises one or more compounds of formula A selected from the group consisting of compounds of the following formulae:

A1a1
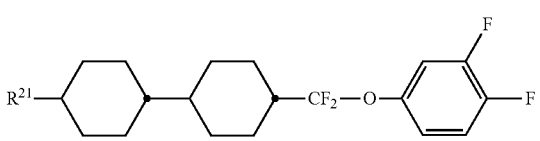

A1a2
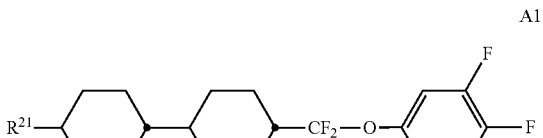

A1b1
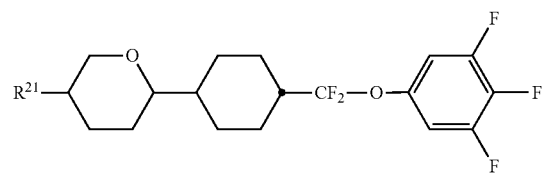
A1b2
A1d1
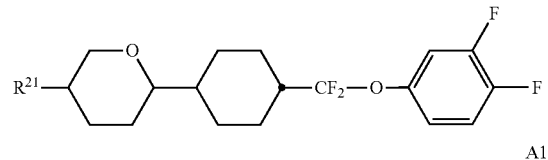
A1d2
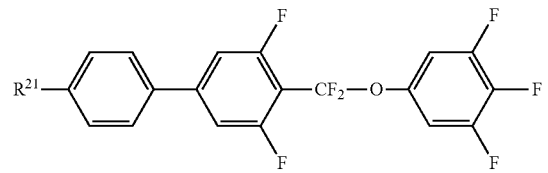
A1d3
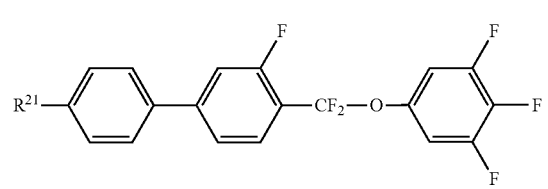
A1d4
A1e1
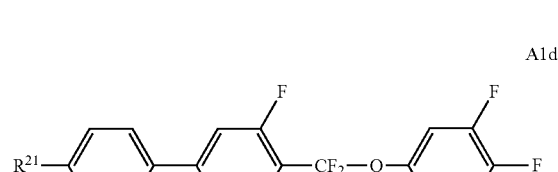
A1f1
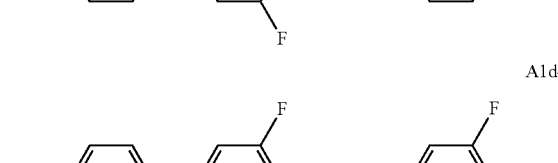
A1g1
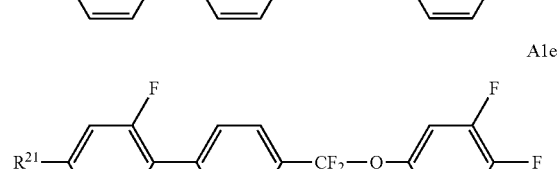
A2a1
A2c1
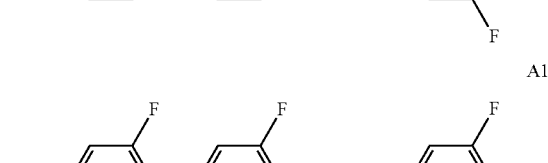
A2d1
A2e1
A2f1
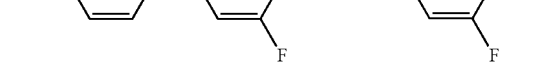
A2h1
A2i1
A2i2

-continued

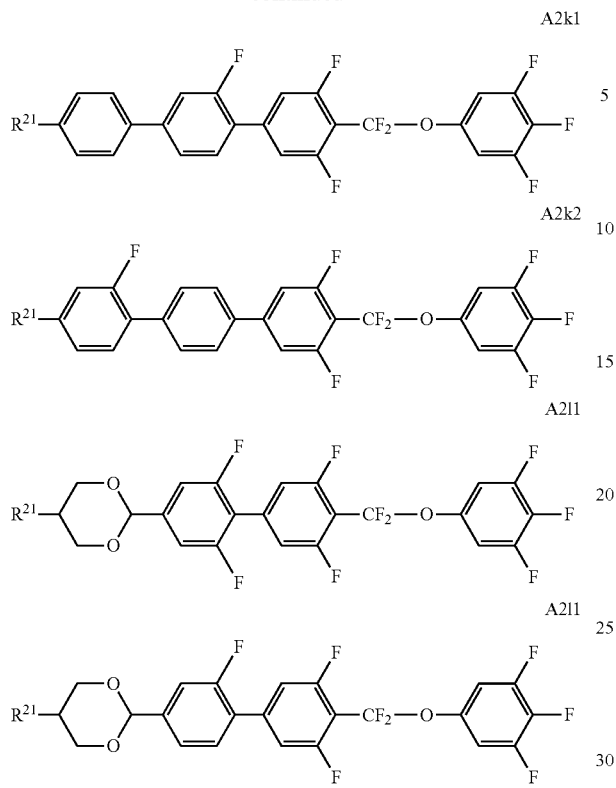

wherein R²¹ is as defined in claim 1.

13. The LC medium according to claim 1, wherein component B) comprises one or more compounds of formula B selected from the group consisting of compounds of the following formulae:

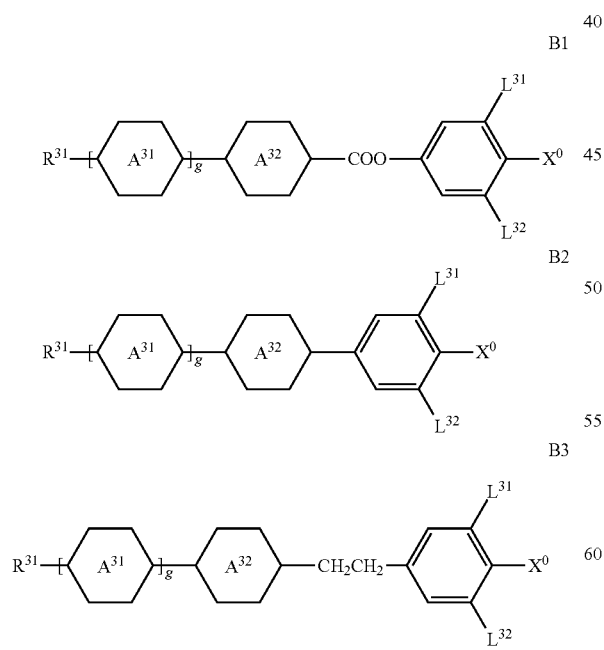

in which g, $A^{31}$, $A^{32}$, $R^{31}$, $X^0$, $L^{31}$ and $L^{32}$ have the meanings given in claim 1.

14. The LC medium according to claim 1, wherein component B) comprises one or more compounds of formula B selected from the group consisting of compounds of the following formulae:

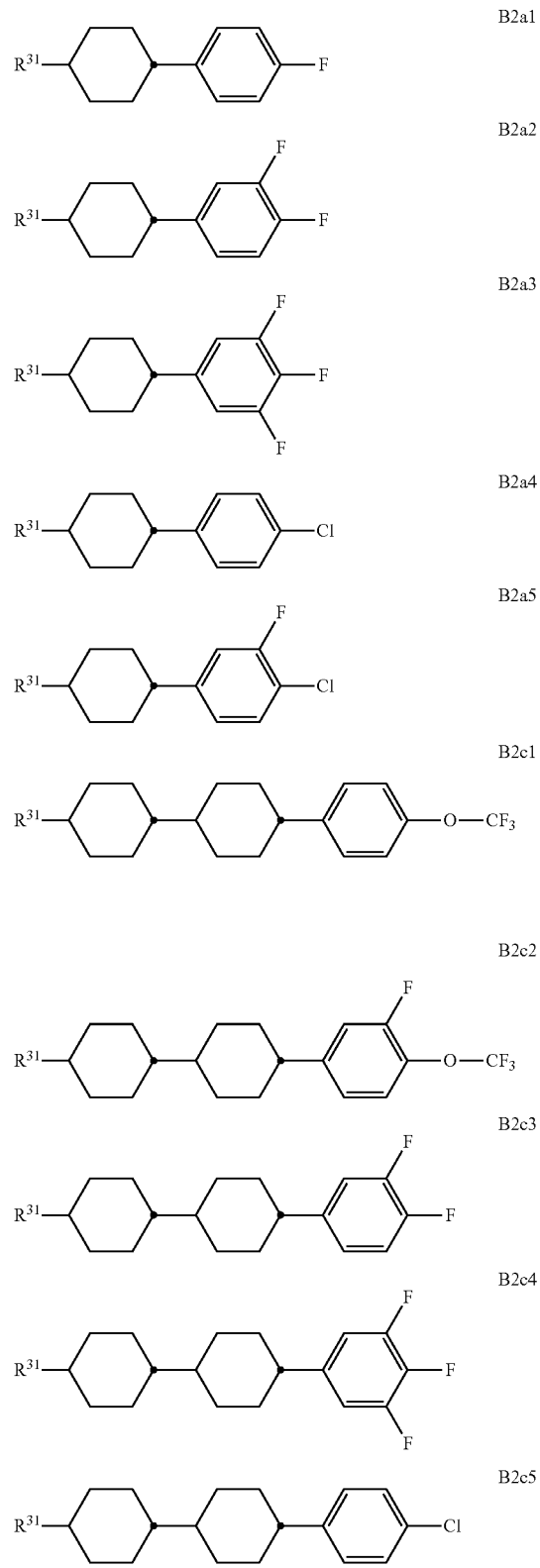

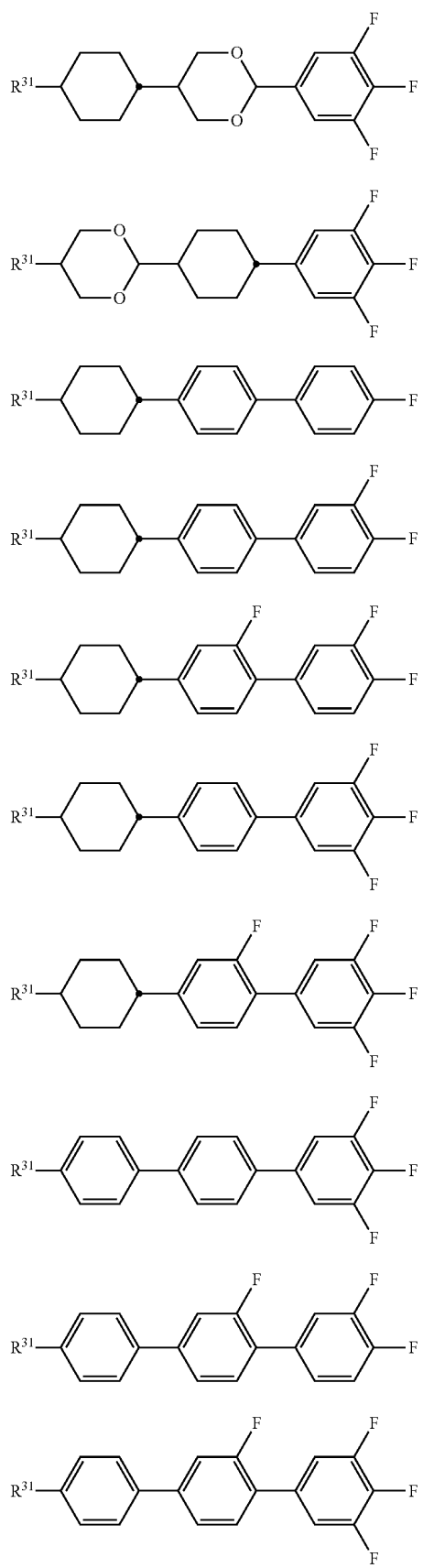
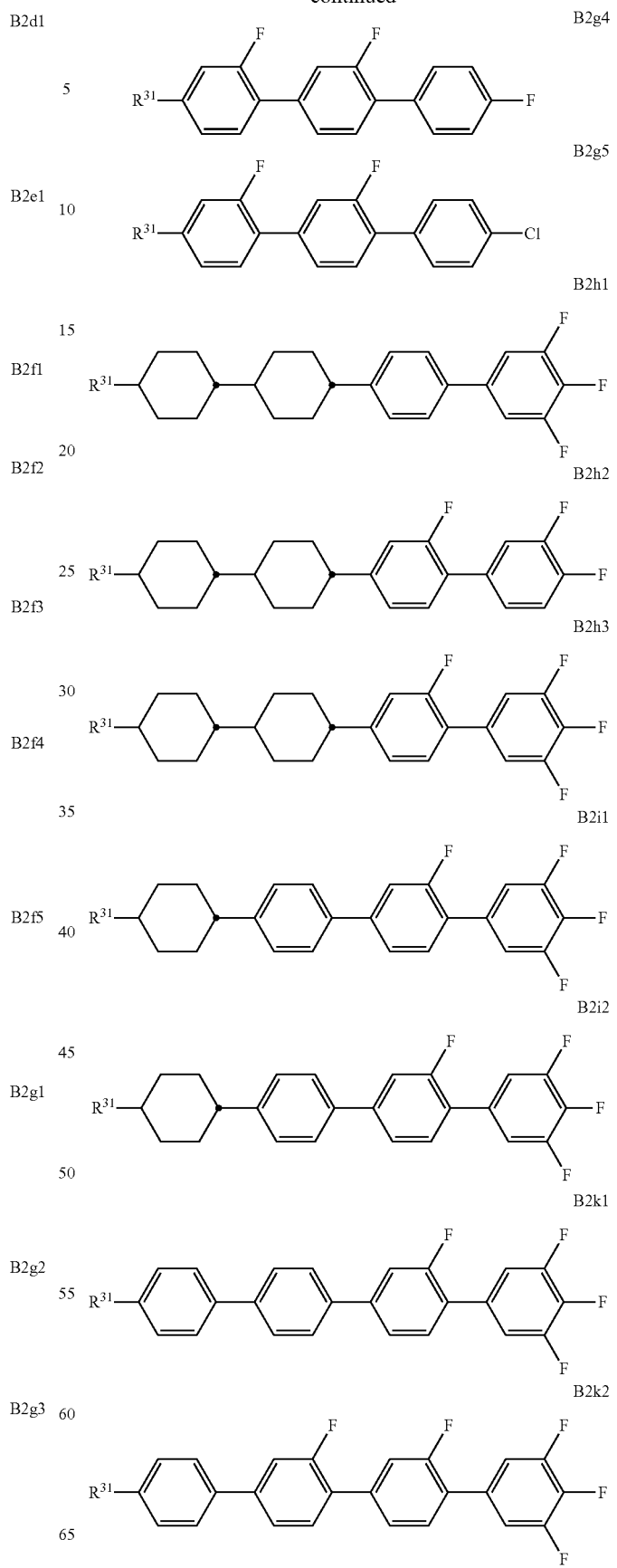

-continued

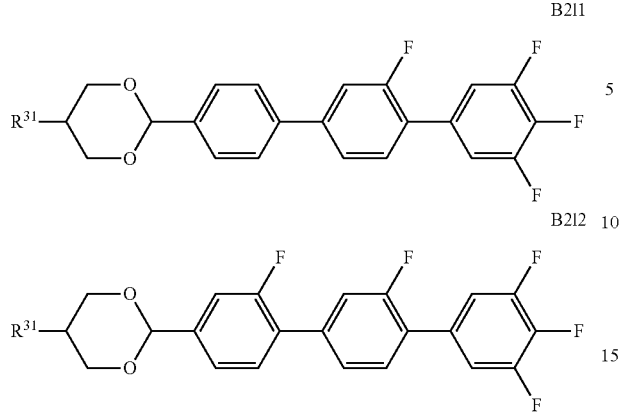

wherein R³¹ is as defined in claim 1.

15. The LC medium according to claim 1, wherein component B) comprises, in addition to the compounds of formula A and/or B, one or more compounds of formula C:

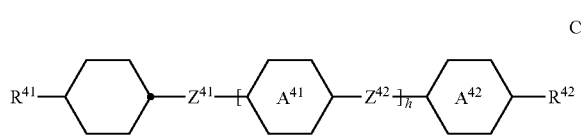

in which the individual radicals have the following meanings:

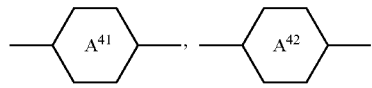

each, independently of one another, and
on each occurrence, identically or differently, are

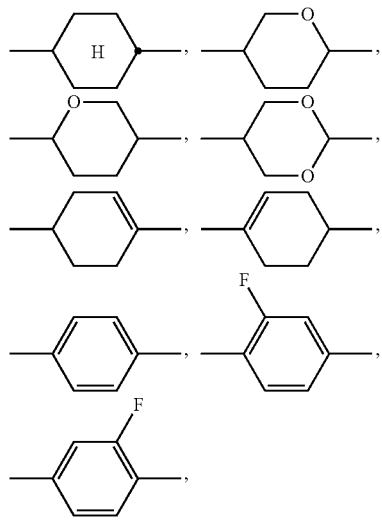

$R^{41}$, $R^{42}$ each, independently of one another, are alkyl, alkoxy, oxaalkyl or alkoxyalkyl having 1 to 9 C atoms or alkenyl or alkenyloxy having 2 to 9 C atoms, all of which are optionally fluorinated, $Z^{41}$, $Z^{42}$ each, independently of one another, are —CH₂CH₂—, —COO—, trans-CH=CH—, trans-CF=CF—, —CH₂O—, —CF₂O—, —C≡C— or a single bond, and h is 0, 1, 2 or 3.

16. The LC medium according to claim 15, wherein component B) comprises one or more compounds of formula C selected from the group consisting of compounds of the following subformulae:

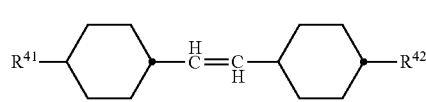

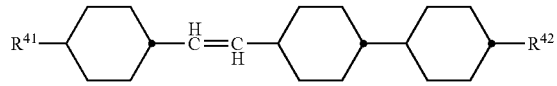

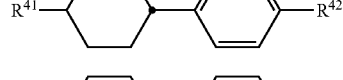

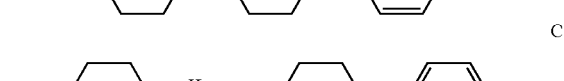

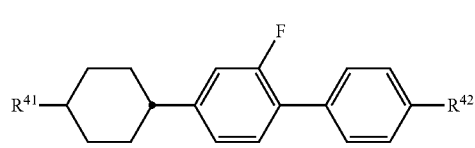

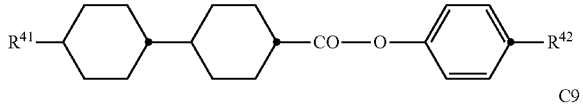

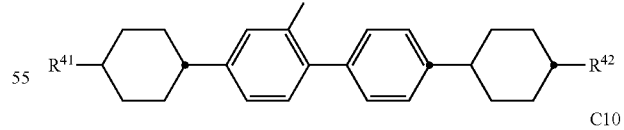

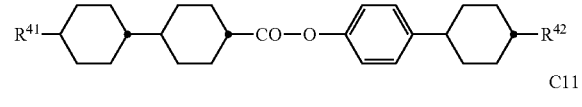

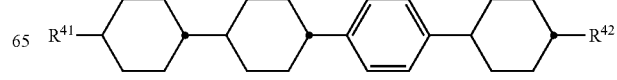

-continued

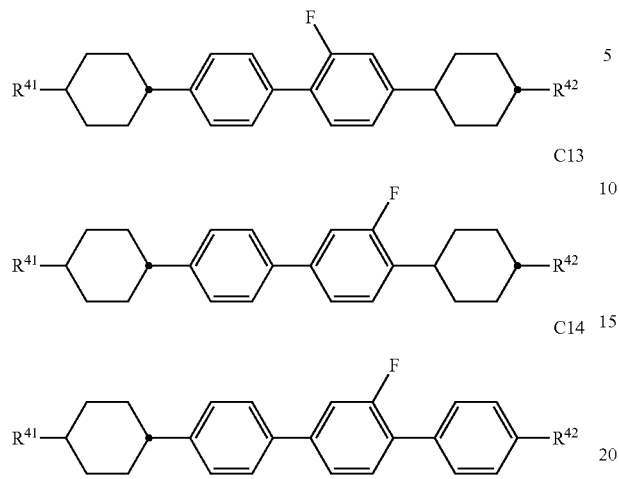

C12

C13

C14 in which $R^{41}$ and $R^{42}$ each, independently of one another, are alkyl, alkoxy, oxaalkyl or alkoxyalkyl having 1 to 9 C atoms or alkenyl or alkenyloxy having 2 to 9 C atoms, all of which are optionally fluorinated.

17. The LC medium according to claim 1, wherein component B) comprises, in addition to the compounds of formula A and/or B, one or more compounds selected from the group consisting of compounds of the following subformulae:

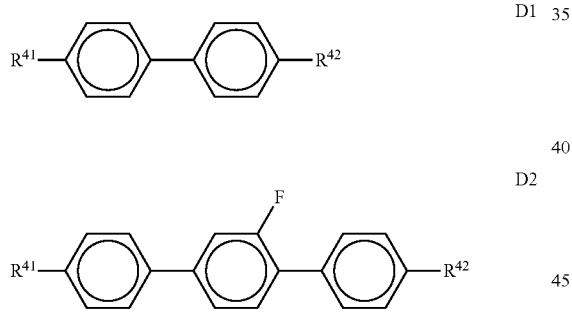

D1

D2 in which $R^{41}$ and $R^{42}$ each, independently of one another, are alkyl, alkoxy, oxaalkyl or alkoxyalkyl having 1 to 9 C atoms or alkenyl or alkenyloxy having 2 to 9 C atoms, all of which are optionally fluorinated.

18. The LC medium according to claim 1, wherein component B) comprises, in addition to the compounds of formula A and/or B, one or more compounds of formula E containing an alkenyl group

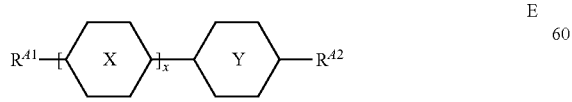

E in which the individual radicals, on each occurrence identically or differently, each, independently of one another, have the following meaning:

X is

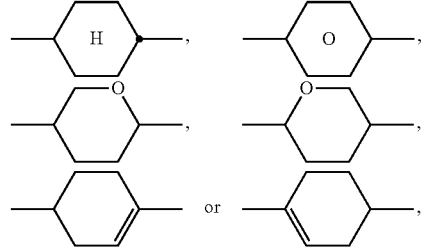

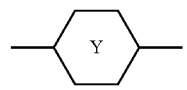

Y is

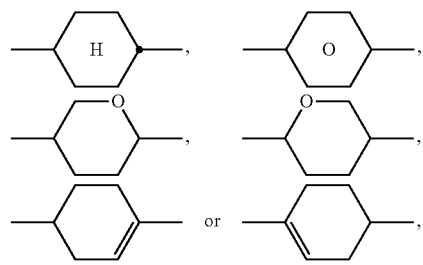

$R^{A1}$ is alkenyl having 2 to 9 C atoms or, if at least one of the rings X, Y and Z denotes cyclohexenyl, also one of the meanings of $R^{A2}$, $R^{A2}$ is alkyl having 1 to 12 C atoms, in which, in addition, one or two non-adjacent $CH_2$ groups may be replaced by —O—, —CH=CH—, —CO—, —OCO— or —COO— in such a way that O atoms are not linked directly to one another, and x is 1 or 2.

19. The LC medium according to claim 18, wherein component B) comprises one or more compounds of formula E selected from the group consisting of compounds of the following subformulae:

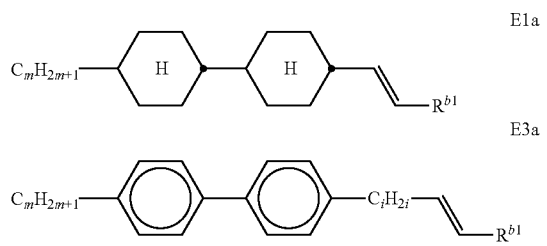

E1a

E3a

-continued

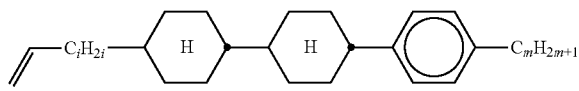
E6a in which m denotes 1, 2, 3, 4, 5 or 6, i denotes 0, 1, 2 or 3, and $R^{b1}$ denotes H, $CH_3$ or $C_2H_5$.

20. The LC medium according to claim 1, wherein component B) comprises, in addition to the compounds of formula A and/or B, one or more compounds of formula F:

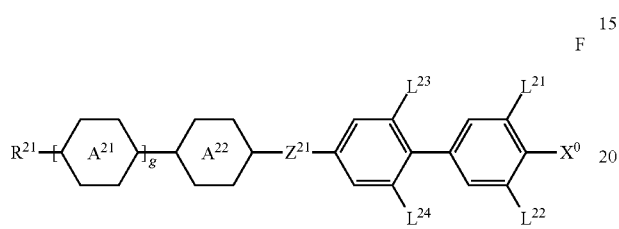
F in which the individual radicals have, independently of each other and on each occurrence identically or differently, the following meanings:

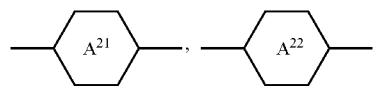

denote

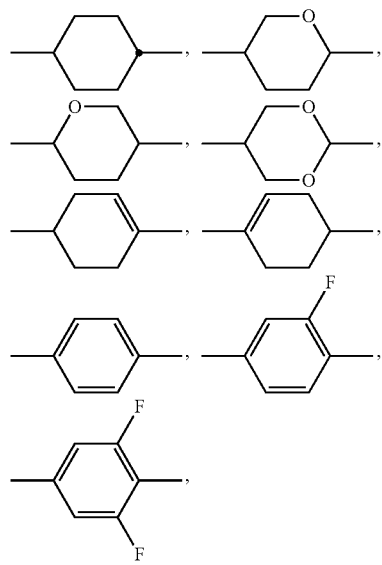

$R^{21}$, $R^{31}$ each, independently of one another, are alkyl, alkoxy, oxaalkyl or alkoxyalkyl having 1 to 9 C atoms or alkenyl or alkenyloxy having 2 to 9 C atoms, all of which are optionally fluorinated, $X^0$ is F, Cl, halogenated alkyl or alkoxy having 1 to 6 C atoms or halogenated alkenyl or alkenyloxy having 2 to 6 C atoms, $Z^{21}$ is $-CH_2CH_2-$, $-CF_2CF_2-$, $-COO-$, trans-$CH=CH-$, trans-$CF=CF-$, $-CH_2O-$ or a single bond, $L^{21}$, $L^{22}$, $L^{23}$, $L^{24}$ each, independently of one another, are H or F, and g is 0, 1, 2 or 3.

21. The LC medium according to claim 20, wherein component B) comprises one or more compounds of formula F selected from the group consisting of compounds of the following subformulae:

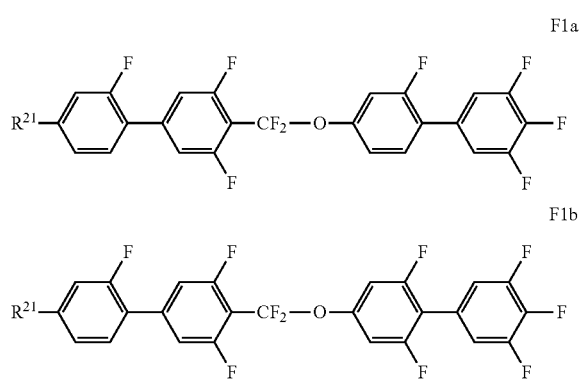

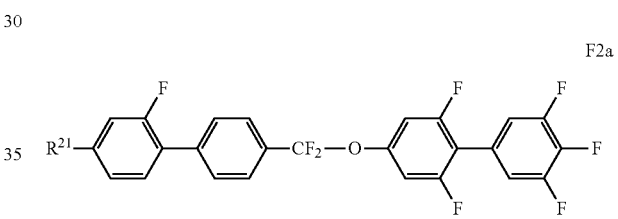

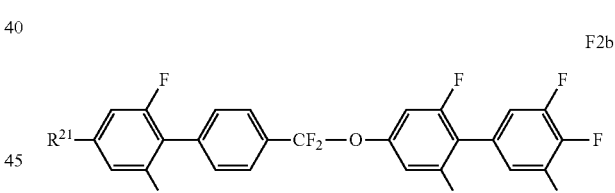

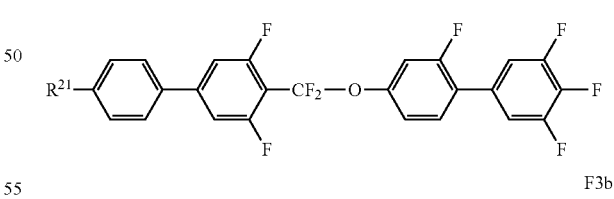

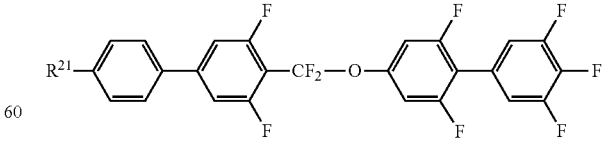

wherein $R^{21}$ is as defined in claim 20.

22. The LC medium according to claim 1, wherein component B) comprises, in addition to the compounds of formula A and/or B, one or more compounds of formula G:

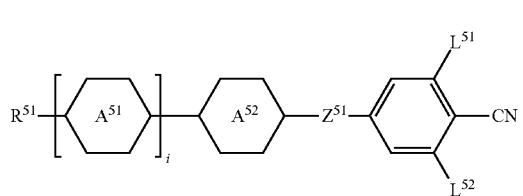
G in which the individual radicals have the following meanings:

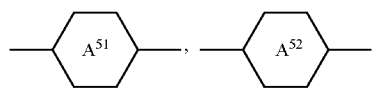

each, independently of one another, and
on each occurrence, identically or differently, are:

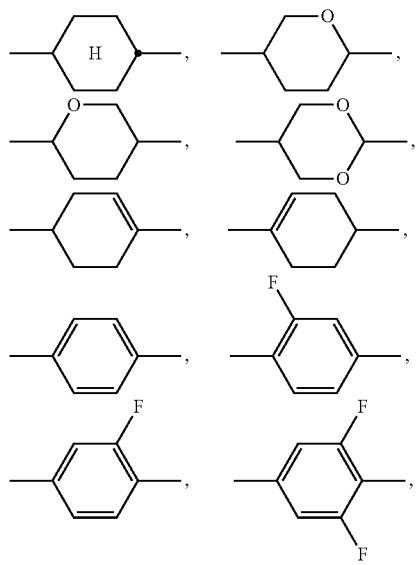

$R^{51}$, $R^{52}$ each, independently of one another, are alkyl, alkoxy, oxaalkyl or alkoxyalkyl having 1 to 9 C atoms or alkenyl or alkenyloxy having 2 to 9 C atoms, all of which are optionally fluorinated, $Z^{51}$, $Z^{52}$ are —$CH_2CH_2$—, —COO—, trans-CH=CH—, trans-CF=CF—, —$CH_2O$—, —$CF_2O$—, —C≡C— or a single bond, $L^{51}$, $L^{52}$ each, independently of one another, are H or F, and i is 0, 1, 2 or 3.

23. The LC medium according to claim 22, wherein component B) comprises one or more compounds of formula G selected from the group consisting of compounds of the following subformulae:

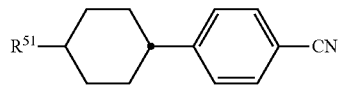
G1a

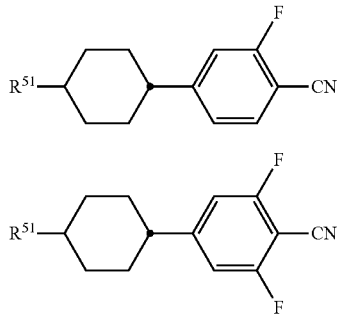
G1b

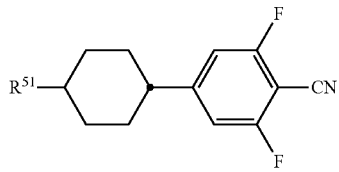
G1c

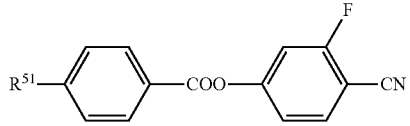
G2a

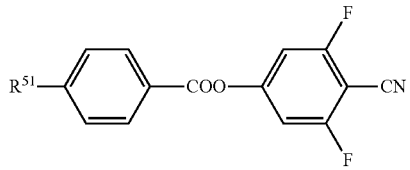
G2b

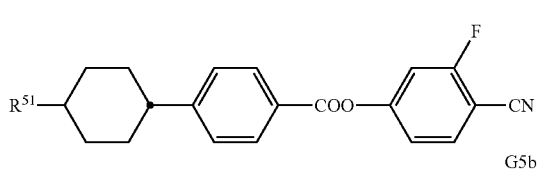
G5a

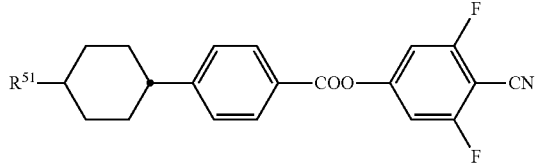
G5b

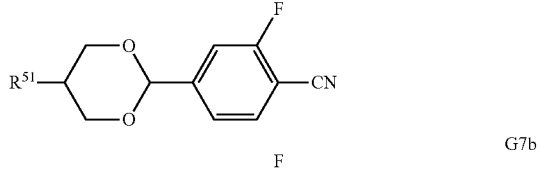
G7a

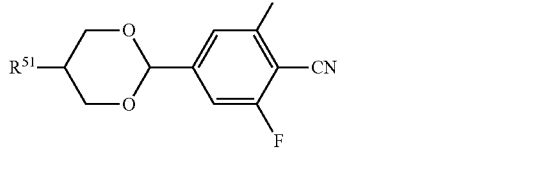
G7b wherein $R^{51}$ is each, independently of one another, are alkyl, alkoxy, oxaalkyl or alkoxyalkyl having 1 to 9 C atoms or alkenyl or alkenyloxy having 2 to 9 C atoms, all of which are optionally fluorinated.

24. The LC medium according to claim 1, wherein the polymerisable compounds are polymerised.

25. An LC display comprising an LC medium according to claim 1.

26. The LC display of claim 25, which is a flexible display.

27. The LC display of claim 25, which is a TN, OCB, IPS or FFS display.

28. A process for the production of an LC display according to claim 25, comprising the steps of providing the LC medium into the display, and polymerising the polymerisable compounds in defined regions of the display.

29. The process of claim 28, wherein the polymerisable compounds are photopolymerised by exposure to UV irradiation.

30. The process of claim 29, wherein the polymerisable compounds are photopolymerised by exposure to UV irradiation through a photomask.

31. A process of preparing an LC medium according to claim 1, comprising the steps of mixing one or more compounds of formula A and/or B, as component B), with the one or more first polymerisable compounds and one or more second polymerizable compounds, as component A), and optionally with further LC compounds and/or additives.

* * * * *